United States Patent
Tsuji et al.

(10) Patent No.: US 11,939,422 B2
(45) Date of Patent: Mar. 26, 2024

(54) COPOLYMER, ELECTROLUMINESCENCE DEVICE MATERIAL INCLUDING COPOLYMER, AND ELECTROLUMINESCENCE DEVICE

(71) Applicant: SAMSUNG ELECTRONICS CO., LTD., Suwon-si (KR)

(72) Inventors: Masashi Tsuji, Hwaseong-si (KR); Fumiaki Kato, Yokohama (JP); Naotoshi Suganuma, Yokohama (JP); Takahiro Fujiyama, Yokohama (JP); Yusaku Konishi, Yokohama (JP); Dae Young Chung, Suwon-si (KR); Ha Il Kwon, Suwon-si (KR); Soonmin Cha, Suwon-si (KR); Tae Ho Kim, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 203 days.

(21) Appl. No.: 17/544,028

(22) Filed: Dec. 7, 2021

(65) Prior Publication Data
US 2022/0177642 A1    Jun. 9, 2022

(30) Foreign Application Priority Data
Dec. 7, 2020    (JP) .................. 2020-202696

(51) Int. Cl.
| | | |
|---|---|---|
| C08G 61/12 | (2006.01) | |
| B82Y 20/00 | (2011.01) | |
| H10K 50/11 | (2023.01) | |
| H10K 50/115 | (2023.01) | |
| H10K 50/15 | (2023.01) | |
| H10K 71/00 | (2023.01) | |
| H10K 71/12 | (2023.01) | |

(Continued)

(52) U.S. Cl.
CPC ........... C08G 61/124 (2013.01); H10K 71/12 (2023.02); H10K 85/111 (2023.02);
(Continued)

(58) Field of Classification Search
CPC ............... H01L 51/0043; H01L 51/502; H01L 51/5056; H01L 51/5072; H01L 51/0072;
(Continued)

(56) References Cited

U.S. PATENT DOCUMENTS

| | | | |
|---|---|---|---|
| 6,887,972 B2 | 5/2005 | Huang et al. | |
| 8,034,882 B2 | 10/2011 | Yu et al. | |

(Continued)

FOREIGN PATENT DOCUMENTS

| | | |
|---|---|---|
| CN | 103396533 A | 11/2013 |
| CN | 110577488 A | 12/2019 |

(Continued)

OTHER PUBLICATIONS

English Abstract of CN 103396533.
(Continued)

*Primary Examiner* — Shane Fang
(74) *Attorney, Agent, or Firm* — CANTOR COLBURN LLP

(57) ABSTRACT

A copolymer including a structural unit represented by Chemical Formula 1

Chemical Formula 1

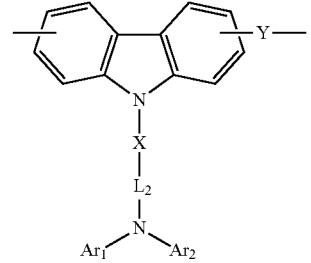

(1)

wherein the copolymer is capable of improving luminous efficiency and durability, particularly, an improvement in luminescence life-span, of an electroluminescence device, particularly a quantum dot electroluminescence device.

20 Claims, 2 Drawing Sheets

US 11,939,422 B2
Page 2

(51) Int. Cl.
*H10K 85/10* (2023.01)
*H10K 101/30* (2023.01)
*H10K 101/40* (2023.01)
*H10K 102/00* (2023.01)

(52) U.S. Cl.
CPC ............ *H10K 85/151* (2023.02); *B82Y 20/00* (2013.01); *C08G 2261/12* (2013.01); *C08G 2261/1434* (2013.01); *C08G 2261/148* (2013.01); *C08G 2261/149* (2013.01); *C08G 2261/3241* (2013.01); *C08G 2261/512* (2013.01); *C08G 2261/5222* (2013.01); *H10K 50/11* (2023.02); *H10K 50/115* (2023.02); *H10K 50/15* (2023.02); *H10K 71/00* (2023.02); *H10K 2101/30* (2023.02); *H10K 2101/40* (2023.02); *H10K 2102/00* (2023.02)

(58) Field of Classification Search
CPC .. H01L 51/5012; C07D 403/04; C07D 403/10
See application file for complete search history.

(56) References Cited

U.S. PATENT DOCUMENTS

| | | | |
|---|---|---|---|
| 8,330,142 B2 | 12/2012 | Cho et al. | |
| 8,440,325 B2 | 5/2013 | McKiernan et al. | |
| 9,680,107 B2 | 6/2017 | Jung et al. | |
| 10,636,973 B2 | 4/2020 | Takahiro et al. | |
| 2016/0133842 A1* | 5/2016 | Fujiyama | H05B 33/22 257/40 |
| 2021/0175427 A1 | 6/2021 | Jung et al. | |

FOREIGN PATENT DOCUMENTS

| | | |
|---|---|---|
| JP | 2010-199067 A | 9/2010 |
| JP | 2009-521118 A | 1/2011 |
| JP | 5022239 B2 | 9/2012 |
| JP | 2016-119320 A | 6/2016 |
| JP | 2019-119831 A | 7/2019 |
| KR | 0245841 B1 | 3/2000 |
| KR | 2015-105201 A | 9/2015 |
| KR | 2019-136247 A | 12/2019 |
| WO | 20080693 A1 | 1/2008 |
| WO | 20036459 A1 | 2/2020 |

OTHER PUBLICATIONS

English Abstract of CN 110577488.
Ioannis Kanelidis, et al., Arylamino-Functionalized Fluorene- and Carbazole-Based Copolymers:Color-Tuning Their CdTe Nanocrystal Composites from Red to White, J Polym Sci Poly Chem, 49(2), pp. 392-402, 2011.

* cited by examiner

COPOLYMER, ELECTROLUMINESCENCE DEVICE MATERIAL INCLUDING COPOLYMER, AND ELECTROLUMINESCENCE DEVICE

CROSS-REFERENCE TO RELATED APPLICATION

This application claims priority to Japanese Patent Application No. 2020-202696 filed in the Japan Patent Office on Dec. 7, 2020, and all the benefits accruing therefrom under 35 U.S.C. § 119, the entire content of which is herein incorporated by reference.

BACKGROUND

1. Field

A copolymer, an electroluminescence device material including the copolymer, and an electroluminescence device are disclosed.

2. Description of the Related Art

Research and development of electroluminescence devices (EL devices) are actively progressing. In particular, EL devices are expected to be used as solid-light emitting type inexpensive and large area full color display devices or recording light source arrays. An EL device is a light emitting device including a thin film of several nanometers to several hundred nanometers positioned between an anode and a cathode. In addition, the EL devices will usually include a hole transport layer, a light emitting layer, an electron transport layer, or the like.

The light emitting layer may include a fluorescent light emitting material, e.g., a material that emits blue light, and a phosphorescent light emitting material, e.g., a material that emits blue, green, or red light. A phosphorescent light emitting material is a material whose luminous efficiency is expected to be about 4 times that of a fluorescent light emitting material. In addition, to best cover a wide color gamut, Red-Green-Blue (RGB) light emitting materials will also demand an emission spectrum having a relatively narrow full width at half maximum emission peak. Although fluorescent or phosphorescent emission materials that emit deep blue light are of interest, there are no currently available EL devices on the market with relatively long life-span and that satisfy the viewpoint of color purity.

As a way of solving such a technical problem, light emitting devices that use "quantum dot" which is an inorganic light emitting material as a light emitting material (See, Patent Document 1, Japanese Patent Laid-Open Publication No. 2010-199067) have been developed. Quantum dots (QD) are semiconductor materials having crystal structures of several nanometers in size. Because quantum dots are very small in size, a surface area per unit volume is large, and therefore, the nanocrystals exhibit quantum confinement effects.

Due to the quantum confinement effect, a quantum dot is able to adjust the emission wavelength by adjusting its size, and has are known to have characteristics such as improved color purity and high photoluminescence (PL) efficiency. A quantum dot electroluminescence device (QD LED) is a three-layered device including a quantum dot emission layer positioned between a hole transport layer (HTL) and an electron transport layer (ETL).

SUMMARY OF THE INVENTION

An embodiment provides a technology capable of improving the luminous efficiency and durability, e.g., improvement in luminescence life-span, of an electroluminescence device, e.g., a quantum dot electroluminescence device.

An embodiment provides a polymer compound having a specific structure.

An embodiment provides a copolymer having a structural unit represented by Chemical Formula 1.

Chemical Formula 1

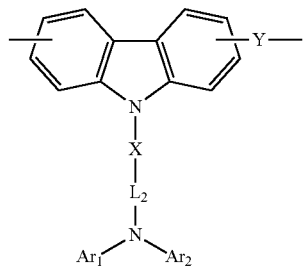

(1)

In Chemical Formula 1,

X is a single bond, $-L_{1a}-$, or $-L_{1b}-L_{1c}-$, wherein $L_{1a}$, $L_{1b}$, and $L_{1c}$ are each independently a substituted or unsubstituted divalent aromatic hydrocarbon group having 6 to 25 carbon atoms, $L_2$ is a substituted or unsubstituted aromatic hydrocarbon group having 6 to 25 carbon atoms, or a substituted or unsubstituted aromatic heterocyclic group having 3 to 25 ring-member atoms, $Ar_1$ and $Ar_2$ are each independently a substituted or unsubstituted aromatic hydrocarbon group having 6 to 25 carbon atoms or a substituted or unsubstituted aromatic heterocyclic group having 3 to 25 ring-member atoms, and Y is a substituted or unsubstituted divalent aromatic hydrocarbon group having 6 to 60 carbon atoms, or a substituted or unsubstituted divalent aromatic heterocyclic group having 3 to 60 ring-member atoms, wherein, $L_2$, $Ar_1$, and $Ar_2$ satisfy at least one of the following Conditions (i) or (ii):

(i) $Ar_1$ and $Ar_2$ are different groups; and (ii) $L_2$ and $Ar_1$ join to form a ring.

In Chemical Formula 1, $L_2$, $Ar_1$, and $Ar_2$ may satisfy "Condition (i): $Ar_1$ and $Ar_2$ are different groups", and $Ar_1$ and $Ar_2$ may each independently be a group represented by Chemical Formula 2A, Chemical Formula 2B, Chemical Formula 2C, or Chemical Formula 2D:

Chemical Formula 2A

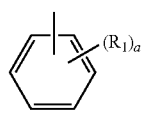

Chemical Formula 2B

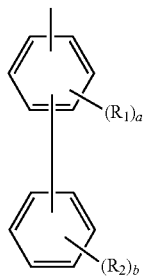

wherein, in Chemical Formula 2A and Chemical Formula 2B

R$_1$ and R$_2$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b may each independently be an integer of 1 to 4, and a link without * indicates a bond to the nitrogen of the arylamine side chain of Chemical Formula 1, Chemical Formula 2C

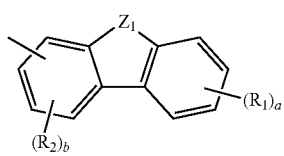

Chemical Formula 2D

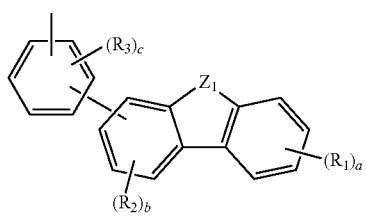

wherein, in Chemical Formula 2C and Chemical Formula 2D,

Z$_1$ may be CR$_a$R$_b$, NR$_c$, O, S, Se, or Te, wherein R$_a$, R$_b$, and R$_c$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, or R$_a$ and R$_b$ may be joined to provide a spiro structure, R$_1$, R$_2$, and R$_3$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b may each independently be an integer of 1 to 4, and a link without * indicates a bond to the nitrogen of the arylamine side chain of Chemical Formula 1.

In Chemical Formula 1, L$_2$, Ar$_1$, and Ar$_2$ may satisfy "Condition (i): Ar$_1$ and Ar$_2$ are different groups", and Ar$_1$ and Ar$_2$ may each independently be a group represented by Group 2:

[Group 2]

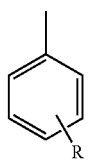

(2-1)

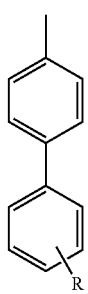

(2-2)

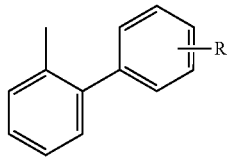

(2-3)

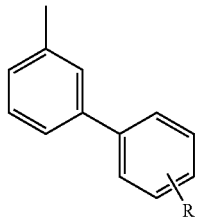

(2-4)

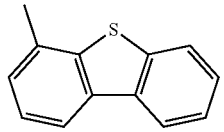

(2-5)

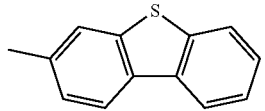

(2-6)

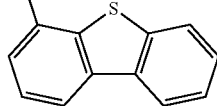

(2-6)

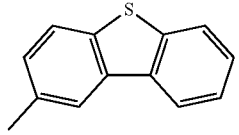

(2-7)

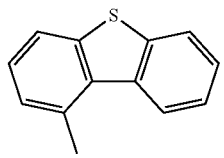

(2-8)

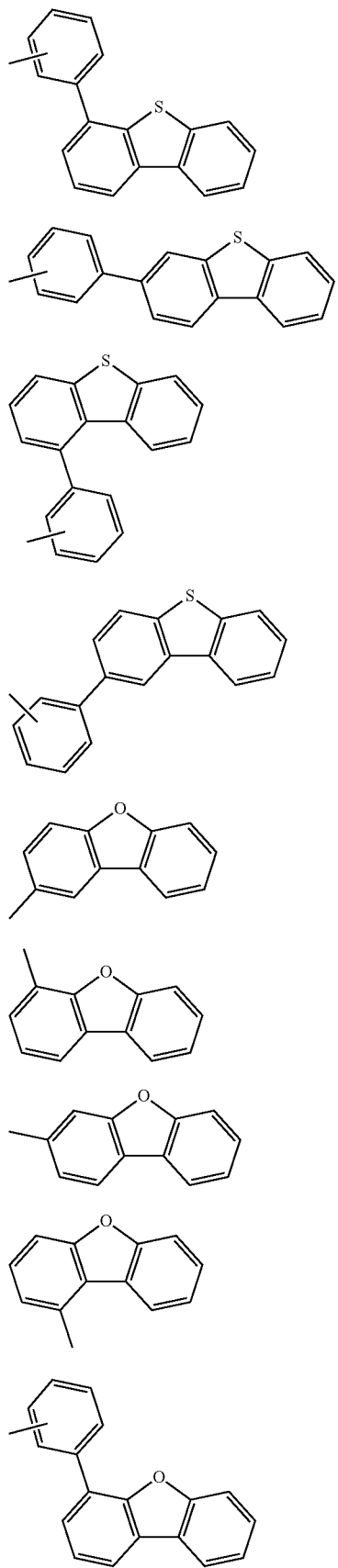
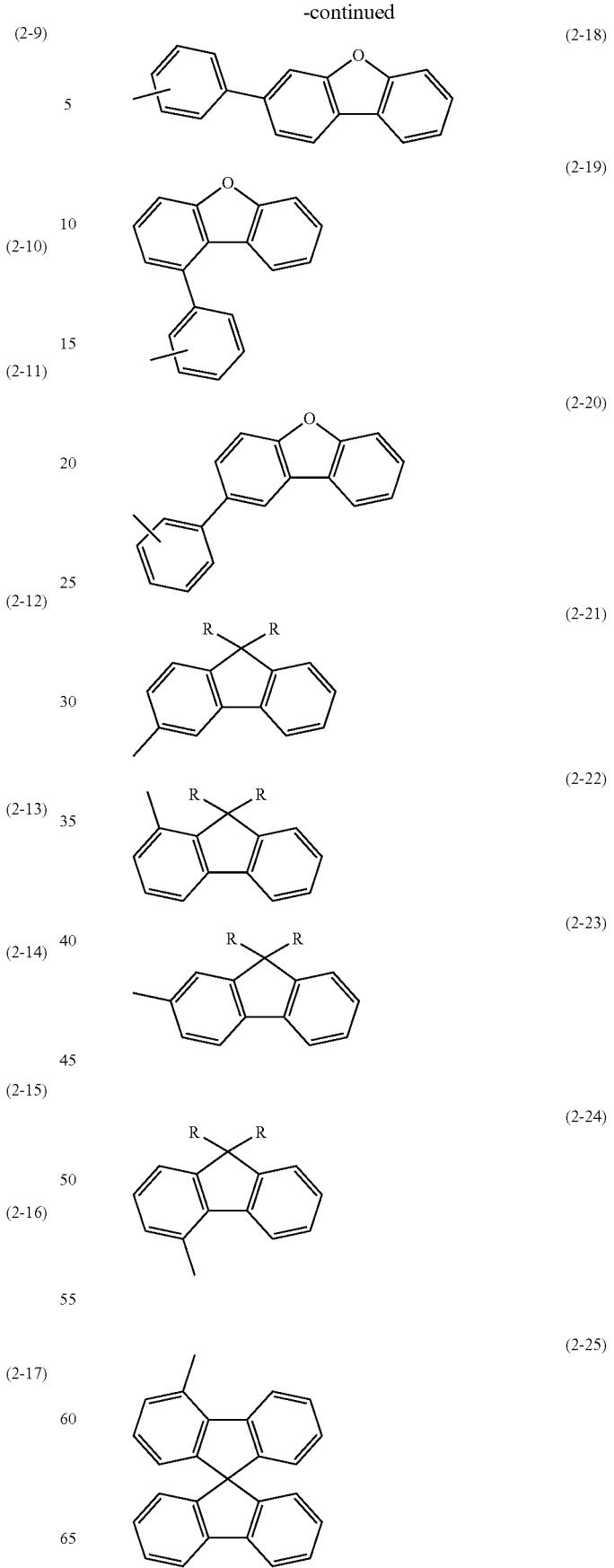

(2-26)
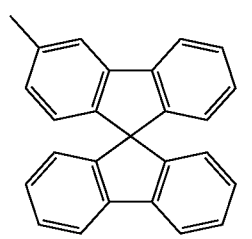

(2-27)
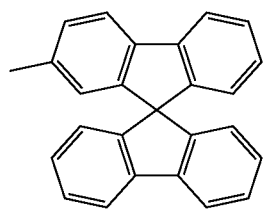

(2-28)
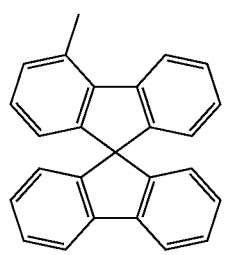

(2-29)
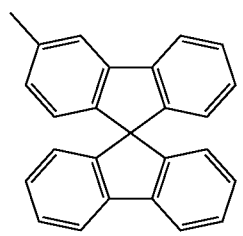

(2-30)
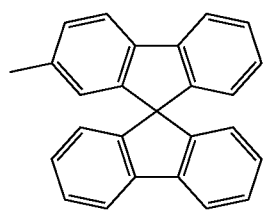

(2-31)
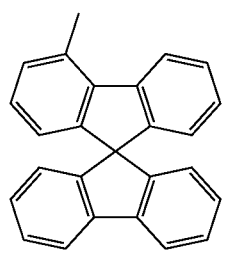

(2-32)
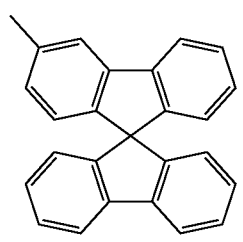

(2-33)
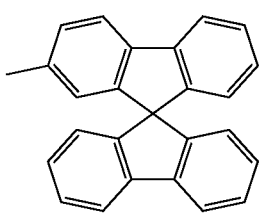

wherein, in Group 2,

R may each independently be a hydrogen atom or a linear or branched hydrocarbon group having 1 to 14 carbon atoms, a link without * is a bond to the nitrogen of an arylamine side chain of Chemical Formula 1, and a hydrogen atom of an aromatic ring of a Group 2 structure may be optionally substituted by a linear or branched hydrocarbon group having 1 to 14 carbon atoms.

In Chemical Formula 1, $L_2$ may be a group represented by Chemical Formula 3A or Chemical Formula 3B:

Chemical Formula 3A

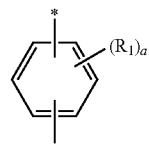

Chemical Formula 3B]

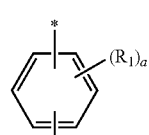

wherein, in Chemical Formula 3A and Chemical Formula 3B, $R_1$ and $R_2$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b may each independently be an integer of 1 to 4,

* may indicate a linking portion with the bridge nitrogen of the main chain carbazole ring of Chemical Formula 1, and a link without * may indicate a bond to the nitrogen of the arylamine side chain of Chemical Formula 1.

In Chemical Formula 1, $L_2$ may be represented by Chemical Formula 3A-1 or Chemical Formula 3B-1:

Chemical Formula 3A-1

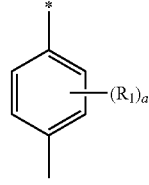

Chemical Formula 3B-1

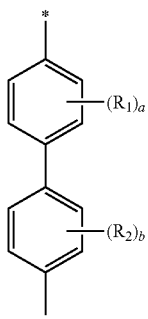

wherein, in Chemical Formula 3A-1 and Chemical Formula 3B-1, $R_1$ and $R_2$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b may each independently be an integer of 1 to 4,

* may indicate a linking portion with the bridge nitrogen of the main chain carbazole ring of Chemical Formula 1, and a link without * may indicate a bond to the nitrogen of an arylamine side chain of Chemical Formula 1.

In Chemical Formula 1, $L_2$ may be a group represented by Group 3:

[Group 3]

(3-1)

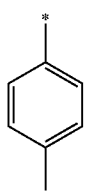

(3-2)

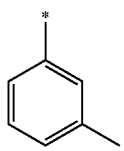

(3-3)

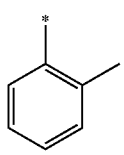

(3-4)

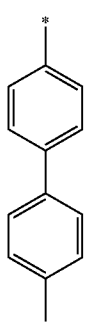

(3-5)

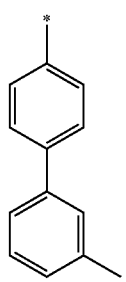

(3-6)

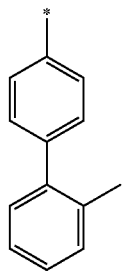

(3-7)

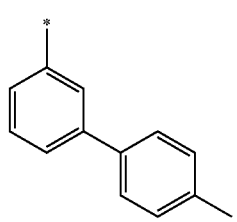

(3-8)

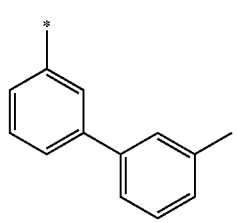

(3-9)

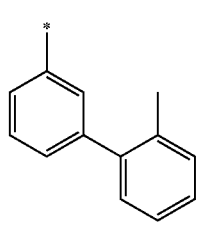

(3-10)

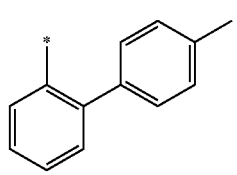

(3-11)

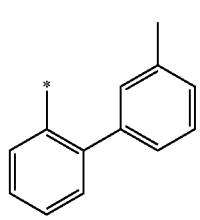

-continued
(3-12)
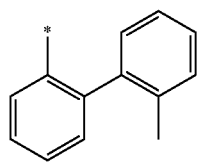
(3-13)
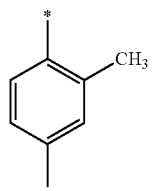
(3-14)
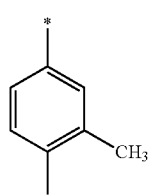
(3-15)
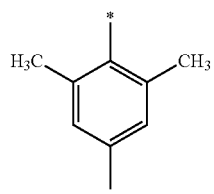
(3-16)
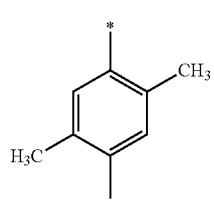
(3-17)
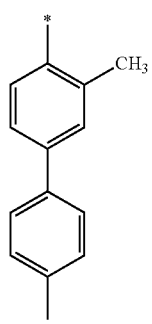
(3-18)
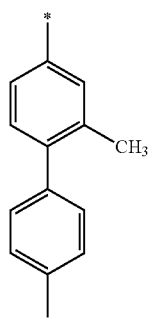
-continued
(3-19)
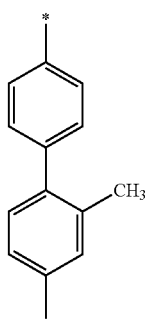
(3-20)
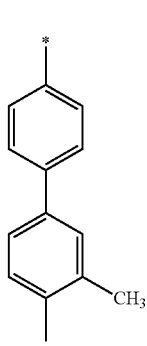
(3-21)
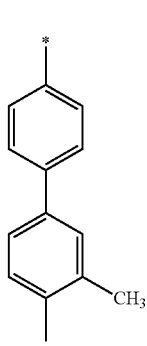
(3-22)
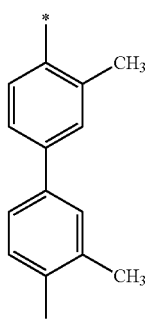
(3-23)
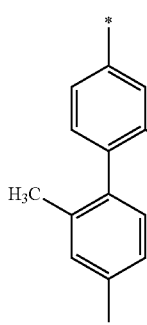

-continued (3-24)

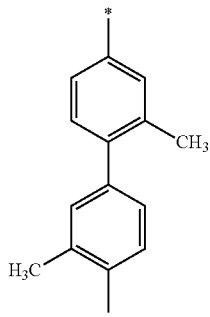

wherein, in Group 3,

* may indicate a linking portion with the bridge nitrogen of the main chain carbazole ring of Chemical Formula 1, a link without * indicates a bond to the nitrogen of the arylamine side chain of Chemical Formula 1, and a hydrogen atom of an aromatic ring of a Group 3 structure may be optionally substituted by a linear or branched hydrocarbon group having 1 to 14 carbon atoms.

In Chemical Formula 1, $L_2$, $Ar_1$, and $Ar_2$ may satisfy "Condition (ii), and -$L_2$-N($Ar_1$)($Ar_2$) may be a group represented by Chemical Formula 4A or Chemical Formula 4B:

Chemical Formula 4A

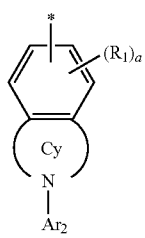

Chemical Formula 4B

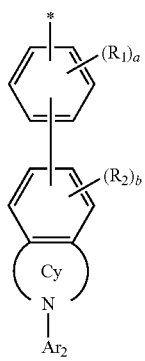

wherein, in Chemical Formula 4A and Chemical Formula 4B, $R_1$ and $R_2$ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b are each independently an integer of 1 to 4,

* indicates a linking portion with the bridge nitrogen of the main chain carbazole ring of Chemical Formula 1, Cy is a substituted or unsubstituted N-containing heterocyclic ring group having 5 to 25 ring-member atoms, and $Ar_2$ is defined as in Chemical Formula 1.

In Chemical Formula 1, $L_2$, $Ar_1$, and $Ar_2$ may satisfy Condition (ii), and -$L_2$-N($Ar_1$)($Ar_2$) may be a group represented by Group 4:

[Group 4]

(4-1)

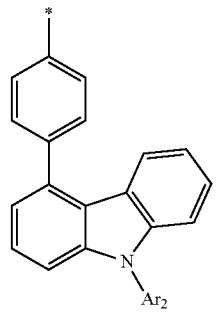

(4-2)

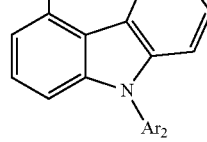

(4-3)

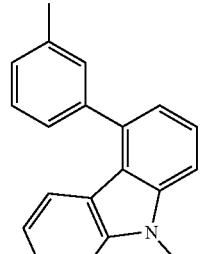

(4-4)

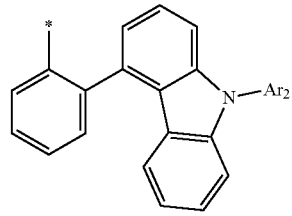

(4-5)

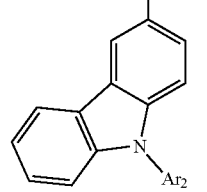

(4-6) 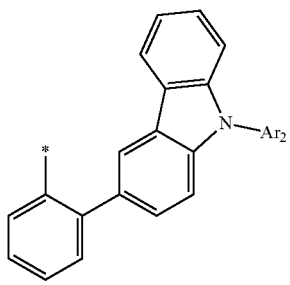

(4-7) 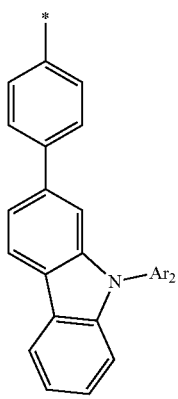

(4-8) 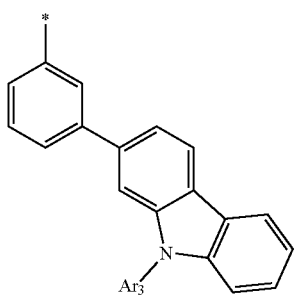

(4-9) 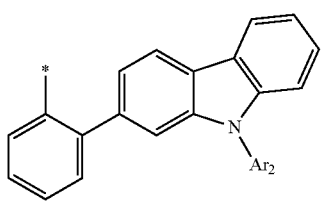

(4-10) 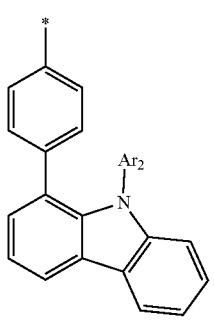

(4-11) 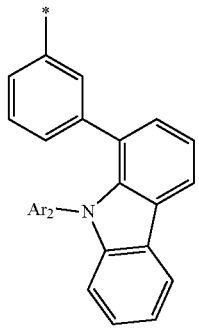

(4-12) 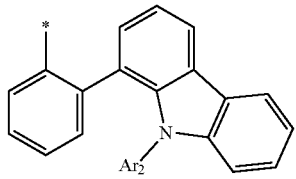

wherein, in Group 4, $Ar_2$ may be the same as in Chemical Formula 1,

* indicates a linking portion with the bridge nitrogen of the main chain carbazole ring of Chemical Formula 1, and a hydrogen atom of the aromatic ring of a Group 4 structure may be optionally substituted by a linear or branched hydrocarbon group having 1 to 14 carbon atoms.

In Chemical Formula 1, $Ar_2$ may be represented by one of Chemical Formula 2A to Chemical Formula 2B:

Chemical Formula 2A

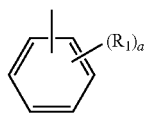

Chemical Formula 2B

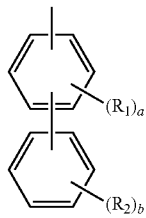

wherein, in Chemical Formula 2A and Chemical Formula 2B $R_1$ and $R_2$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b may each independently be an integer of 1 to 4, and a link without * may indicate a bond to the nitrogen of an arylamine side chain of Chemical Formula 1, Chemical Formula 2C

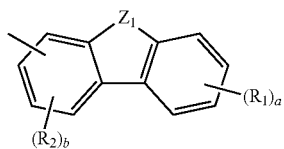

Chemical Formula 2D

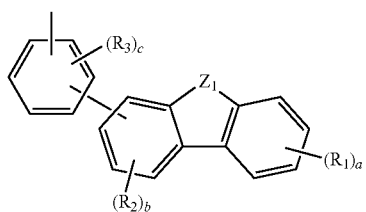

wherein, in Chemical Formula 2C and Chemical Formula 2D, $Z_1$ may be $CR_aR_b$, $NR_c$, O, S, Se, or Te, wherein $R_a$, $R_b$, and $R_c$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, or $R_a$ and $R_b$ may be linked to each other to provide a spiro structure, $R_1$, $R_2$, and $R_3$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b may each independently be an integer of 1 to 4, and a link without * may indicate a link to the nitrogen of the arylamine side chain of Chemical Formula 1.

In Chemical Formula 1, $Ar_2$ may be a group represented in Group 2:

(2-1)

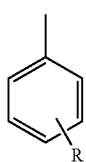

(2-2)

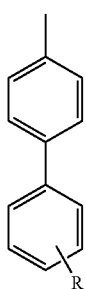

(2-3)

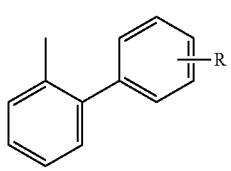

(2-4)

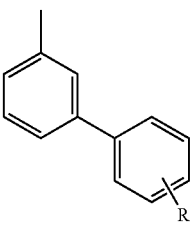

(2-5)

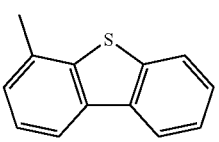

(2-6)

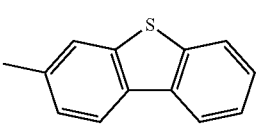

(2-7)

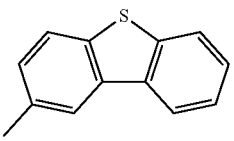

(2-8)

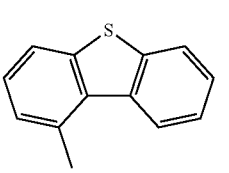

(2-9)

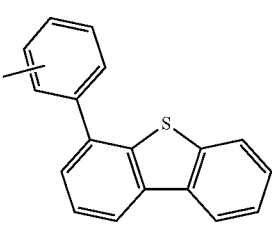

(2-10)

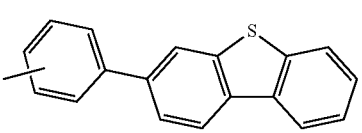

(2-11)

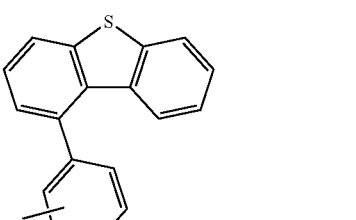

(2-12)

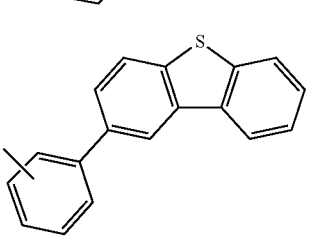

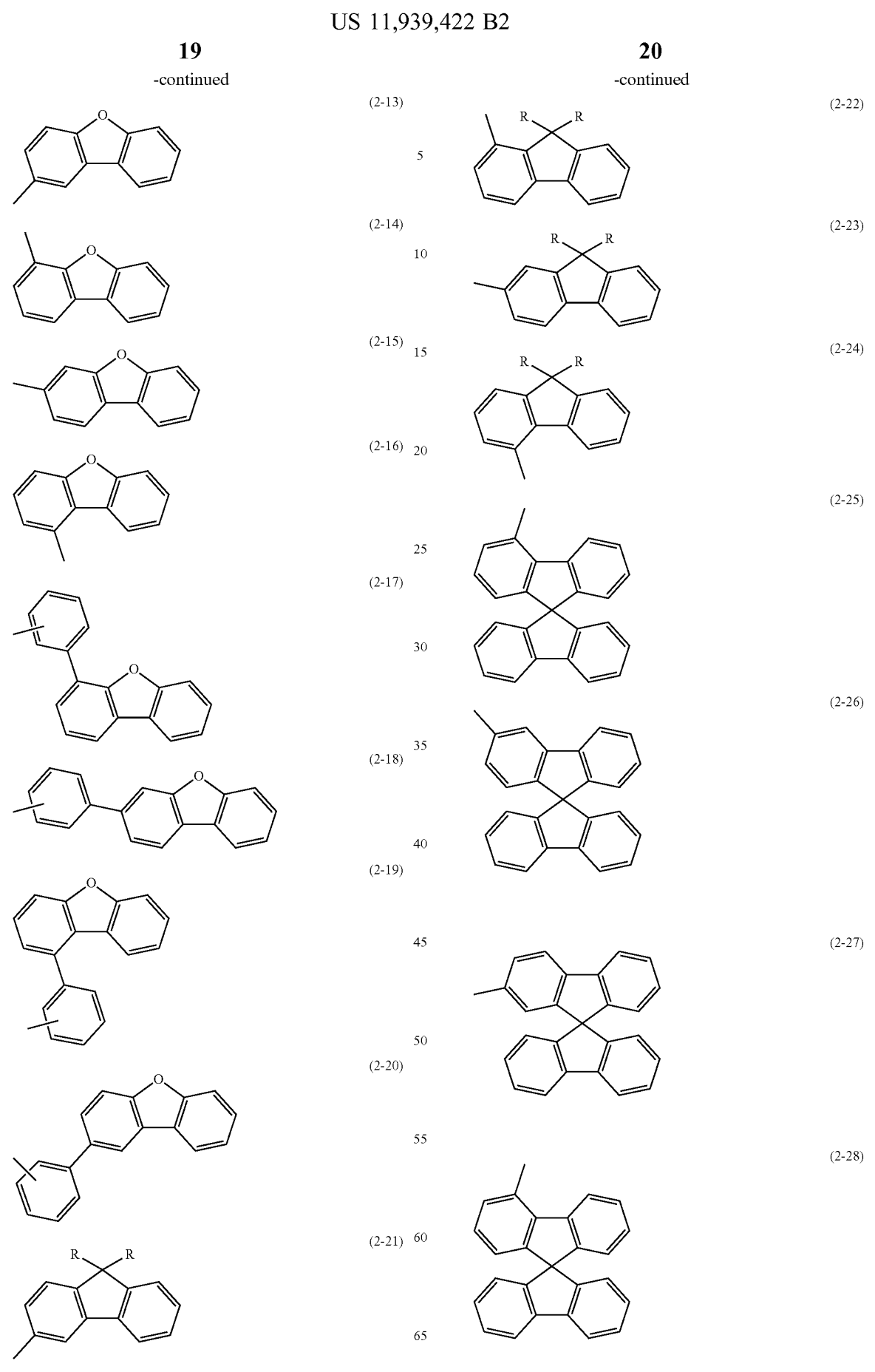

(2-13) (2-14) (2-15) (2-16) (2-17) (2-18) (2-19) (2-20) (2-21) (2-22) (2-23) (2-24) (2-25) (2-26) (2-27) (2-28)

-continued (2-29)

(2-30)

(2-31)

(2-32)

(2-33)

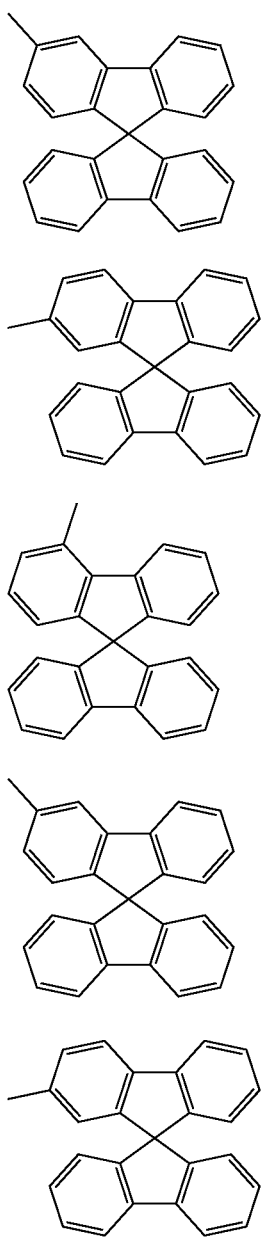

wherein, in Group 2,

R may each independently be a hydrogen atom or a linear or branched hydrocarbon group having 1 to 14 carbon atoms, a link without * may indicate a bond to the nitrogen of the arylamine side chain of Chemical Formula 1, and a hydrogen atom of an aromatic ring of a Group 2 structure may be optionally substituted by a linear or branched hydrocarbon group having 1 to 14 carbon atoms.

In Chemical Formula 1, Y may be represented by one of Chemical Formula 5A to Chemical Formula 5E:

Chemical Formula 5A

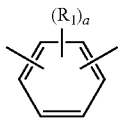

wherein, in Chemical Formula 5A $R_1$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a may be an integer of 1 to 4

Chemical Formula 5B

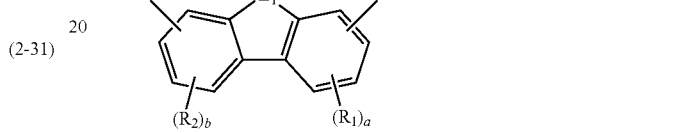

Chemical Formula 5C

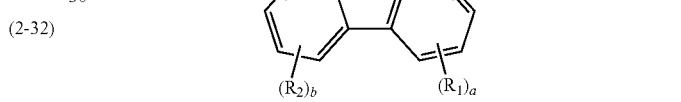

wherein, in Chemical Formula 5B and Chemical Formula 5C, $Z_1$ may be $CR_aR_b$, $NR_c$, O, S, Se, or Te, wherein $R_a$, $R_b$, and $R_c$ may each independently be hydrogen, linear or branched hydrocarbon group having 1 to 14 carbon atoms, an aromatic hydrocarbon group having 6 to 14 carbon atoms, or an aromatic heterocyclic group having 3 to 25 ring-member atoms, or $R_a$ and $R_b$ may be linked to each other to provide a spiro structure, $R_1$, $R_2$, $R_3$, and $R_4$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b may each independently be an integer of 1 to 3, and c and d may each independently be an integer of 1 to 3, Chemical Formula 5D

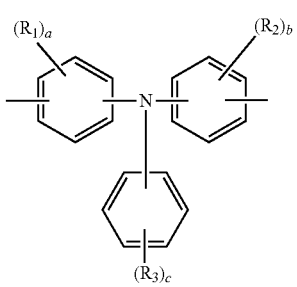

Chemical Formula 5E

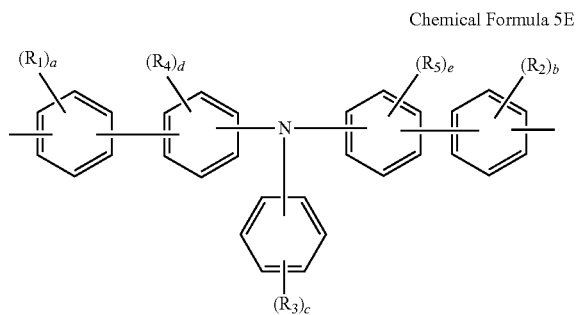

wherein, in Chemical Formula 5D and Chemical Formula 5E $R_1$, $R_2$, $R_3$, $R_4$, and $R_5$ may each independently be hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, and a, b, c, d, and e may each independently be an integer of 1 to 4.

In Chemical Formula 1, Y may be a group represented in Group 5:

[Group 5]

(5-1)
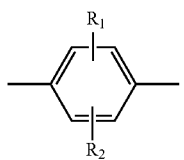

(5-2)
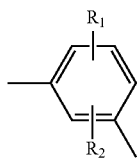

(5-3)
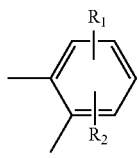

(5-4)
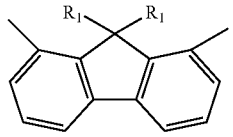

(5-5)
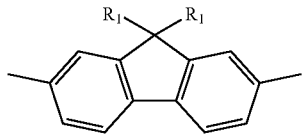

(5-6)
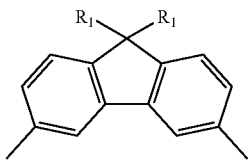

(5-7)
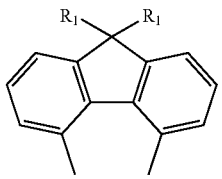

(5-8)
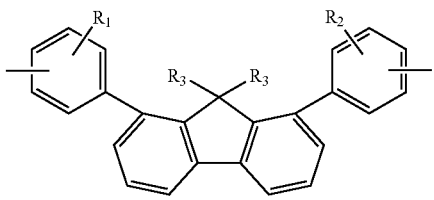

(5-9)
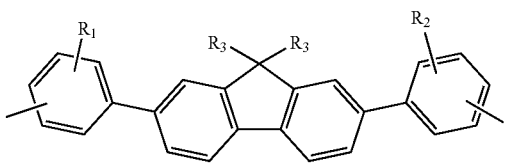

(5-10)
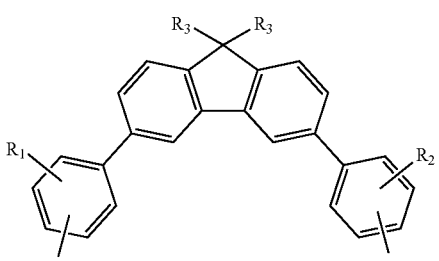

(5-11)
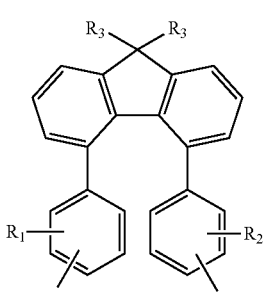

(5-12)
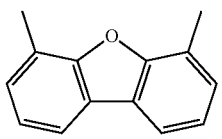

(5-13)
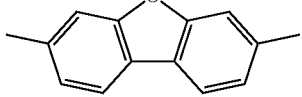

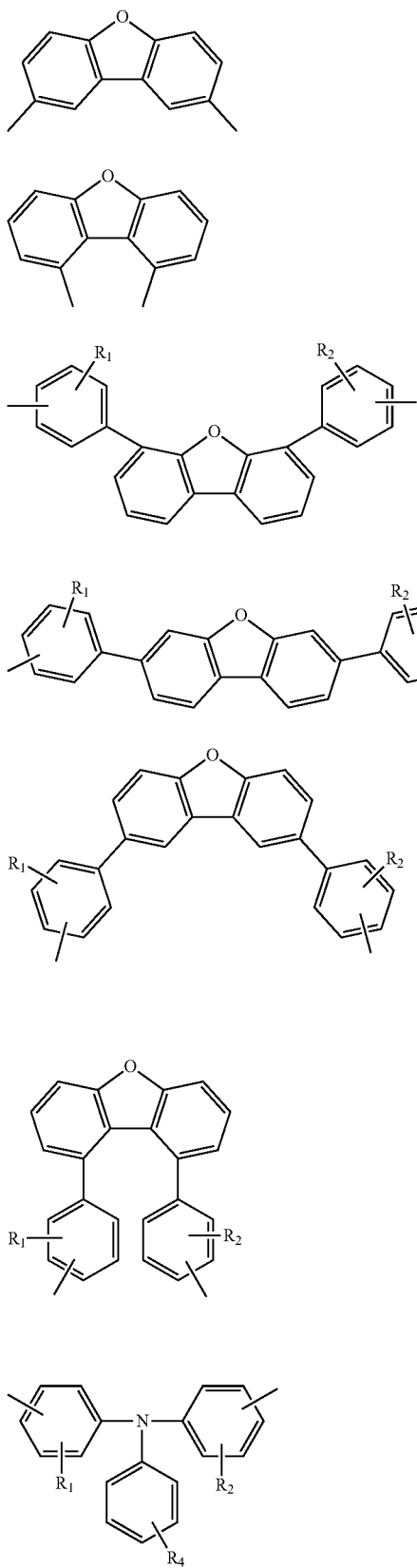

wherein, in Group 5, $R_1$, $R_2$, and $R_4$ may each independently be hydrogen, a linear or branched hydrocarbon group having 1 to 14 carbon atoms, a C6 to C28 aromatic hydrocarbon group, or an aromatic heterocyclic group having 3 to 25 ring-member atoms, $R_3$ may each independently be hydrogen or a linear or branched hydrocarbon group having 1 to 14 carbon atoms, and a hydrogen atom of an aromatic ring of a Group 5 structure may be optionally substituted by a linear or branched hydrocarbon group having 1 to 14 carbon atoms.

In Chemical Formula 1, Y may be a group represented by at least one of Groups (5-1) to (5-7).

According to another embodiment, a liquid composition includes the aforementioned copolymer and a solvent or a dispersive medium.

According to another embodiment, a thin film includes the aforementioned copolymer.

According to another embodiment, an electroluminescence device material includes the aforementioned copolymer.

According to another embodiment, an electroluminescence device includes a first electrode and a second electrode, and at least one organic layer between the first electrode and the second electrode, wherein at least one layer of the organic layer includes the aforementioned copolymer.

The organic layer including the copolymer may be a hole transport layer or a hole injection layer.

The organic layer may include a light emitting layer comprising semiconductor nanoparticles or an organometallic complex.

At least one layer of the organic layer may be formed by a coating method.

An electroluminescence device, and in particular, a quantum dot electroluminescence device having excellent luminous efficiency and durability (particularly luminescence life-span), may be provided.

DETAILED DESCRIPTION

Figure 1:
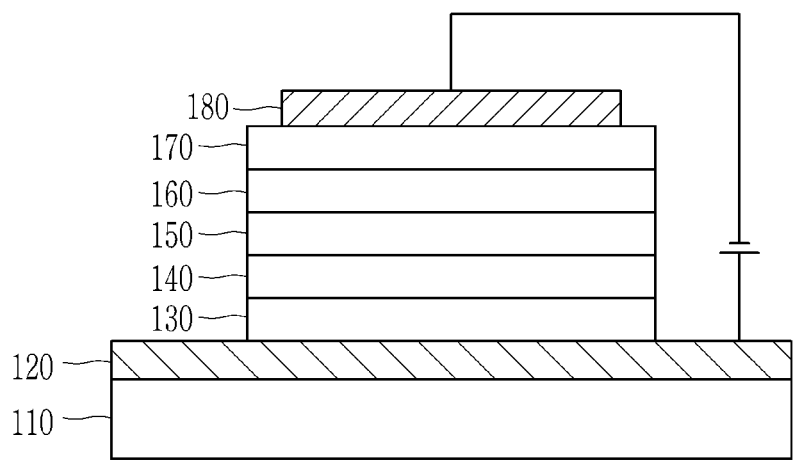
FIG. 1 is a schematic view illustrating an electroluminescence device according to an embodiment.

In the electroluminescence device (especially a quantum dot electroluminescence device) the hole transport material described in Patent Document 1, lacks the necessary luminous efficiency and durability, i.e., a tested device lacks the necessary luminescence life-span) for general applicability. To address such technical deficiencies in such a device we describe the following.

According to an embodiment, a copolymer having a structural unit represented by Chemical Formula 1 is provided:

Chemical Formula 1

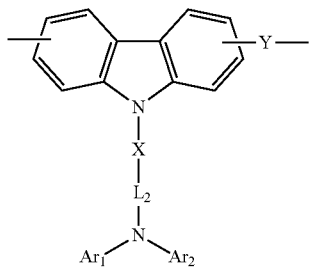

(1)

In Chemical Formula 1,

X is a single bond, $-L_{1a}-$, or $-L_{1b}-L_{1c}-$, wherein, $L_{1a}$, $L_{1b}$, and $L_{1c}$ are each independently a substituted or unsubstituted divalent aromatic hydrocarbon group having 6 to 25 carbon atoms, $L_2$ is a substituted or unsubstituted aromatic hydrocarbon group having 6 to 25 carbon atoms, or a substituted or unsubstituted aromatic heterocyclic group having 3 to 25 ring-member atoms, $Ar_1$ and $Ar_2$ are each independently a substituted or unsubstituted aromatic hydrocarbon group having 6 to 25 carbon atoms or a substituted or unsubstituted aromatic heterocyclic group having 3 to 25 ring-member atoms, Y is a substituted or unsubstituted divalent aromatic hydrocarbon group having 6 to 60 carbon atoms, or a substituted or unsubstituted divalent aromatic heterocyclic group having 3 to 60 ring-member atoms, wherein, $L_2$, $Ar_1$, and $Ar_2$ satisfy at least one of Conditions (i) or (ii):

(i) $Ar_1$ and $Ar_2$ are different groups; and (ii) $L_2$ and $Ar_1$ join to form a ring.

As used herein, "structural unit represented by Chemical Formula 1" is also referred to as "Structural Unit (1)."

A structural unit having a structure represented by Chemical Formula 1-1 among "structural units represented by Chemical Formula 1" is also referred to as "Structural Unit (1-1)."

Chemical Formula 1-1

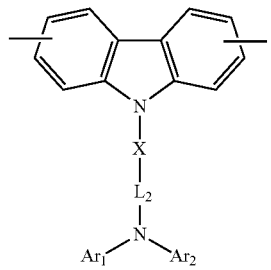

A structural unit having a structure represented by Chemical Formula 1-2 among "structural units represented by Chemical Formula 1" is also referred to as "Structural Unit (1-2)."

—Y—    Chemical Formula 1-2

A copolymer having a structural unit represented by Chemical Formula 1 is also referred to as a "copolymer."

According to another embodiment, an electroluminescence device material includes the copolymer.

According to another embodiment, an electroluminescence device includes a first electrode and a second electrode facing each other, and an organic layer including one or more layers disposed between the first electrode and the second electrode, wherein at least one of the organic layers includes the aforementioned copolymer of Chemical Formula 1.

As used herein, the electroluminescence device is simply referred to as "LED."

Quantum dot electroluminescence devices are also referred to simply as "QLEDs."

An organic electroluminescence device is also simply referred to as "OLED."

The light emitting layer or the carrier transport layer of the electroluminescence device may be formed by using various low molecular materials or polymer materials. Among them, the low molecular materials are excellent in terms of an efficiency life-span of the device. However, when such low molecular materials are used the device is typically manufactured using a high vacuum process, which will increase the costs of production (manufacture).

For example, polymer materials, poly[(9,9-dioctyl fluorenyl-2,7-diyl)-co-(4,4'-(N-(4-sec-butyl phenyl)diphenyl amine)] (TFB) and the like are known and widely accepted as a hole transport material (for example, see, paragraph 0037 of Patent Document 1). However, these polymer materials may not have the desired long luminous efficiency and durability (luminescence life-span, see, Comparative Example 1 described later). Accordingly, development of a polymer material capable of improving the luminous efficiency and/or durability (luminescence life-span) of a light emitting device is of great interest to those in the manufacture of displays.

The present inventors found that durability (luminescence life-span) may be improved by applying the copolymer that includes Structural Unit (1-1) of Chemical Formula 1 in an electroluminescence device compared with known materials, e.g., hole transport materials. In addition, high luminous efficiency may be exhibited by applying the copolymer including Structural Unit (1-1) of Chemical Formula 1 to an electroluminescence device.

A mechanism of exhibition of the efficacy by the aforementioned structure is estimated as follows.

In the Structural Unit (1-1) of Chemical Formula 1, carbazole is present in the main chain. Thereby, the HOMO level of the copolymer deepens, and luminous efficiency improves.

In the Structural Unit (1-1) of Chemical Formula 1, $L_2$, $Ar_1$, and $Ar_2$ satisfy at least one of "Condition (i): $Ar_1$ and $Ar_2$ are different groups" or "Condition (ii): $L_2$ and $Ar_1$ join to form a ring".

In other words, the side chain is identified as being an asymmetric amine. Accordingly, in the copolymer, molecular orbitals are delocalized not only in the main chain but also in the side chain. As a result, it is believed that the rate of hole transport is increased, and durability (luminescence life-span) is improved.

More specifically, because a conventional polymer material typically has insufficient rates of hole transport, hole movement or transport in the material is slower than an electron transport in the material. As a result, holes and electrons will likely combine primarily in a region of a light emitting layer proximate to the hole transport layer side. Accordingly, the region of the light emitting layer proximate to the hole transport layer side may be more easily deteriorate or degrade, which results in poor durability (luminescence life-span) of the light emitting device.

In contrast, the copolymer materials described herein will tend to have a rate of hole movement or transport and a rate of electron movement or transport that is relatively more similar or equal to one another. As a result, the emission region in a light emitting layer is expanded over a larger area. This in turn leads to the light emitting layer having less local deterioration or local "high energetic" hot spots, and therefore, durability (luminescence life-span) may be improved.

Accordingly, an electroluminescence device (particularly, a quantum dot electroluminescence device) including the copolymer having the Structural Unit (1-1) of Chemical Formula 1 may exhibit high luminous efficiency and simultaneously, improved durability (particularly, a luminescence life-span).

Moreover, since the copolymer has excellent a film-forming property and solvent solubility, a film may be formed by a wet (coating) method. Therefore, by using the copolymer, the manufacture of light emitting panels of a significantly larger area and high production efficiency is made possible. The above effect may be effectively exhibited when the copolymer is applied to an EL device, particularly a hole transport layer or a hole injection layer of a QLED.

It is of course to be understood that the electronic mechanisms proposed by Applicant and described above is in practice in theory only, and the present disclosure and claims is not to be limited by the discussed proposed mechanisms.

Hereinafter, embodiments are described. The present disclosure is not limited to the following embodiments. In addition, each drawing is exaggerated for better understanding and ease of description, and the dimensional ratio of each constituent element in each drawing may differ from reality. In addition, when the embodiment of the present disclosure has been described with reference to the drawings, the same reference numerals are given to the same elements in the description of the drawings, and redundant descriptions are omitted.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. In the present specification, unless otherwise specified, operation and physical properties are measured under the conditions of room temperature (20° C. or more and 25° C. or less)/relative humidity 40% RH or more and 50% RH or less.

As used herein, unless otherwise specified, "substituted" refers to substitution with an alkyl group, a cycloalkyl group, a hydroxyalkyl group, an alkoxyalkyl group, an alkoxyl group, a cycloalkoxyl group, an alkenyl group, an alkynyl group, an amino group, an aryl group, an aryloxy group, an alkylthio group, a cycloalkylthio group, an arylthio group, an alkoxycarbonyl group, an aryloxycarbonyl group, a hydroxyl group (—OH), a carboxyl group (—COOH), a thiol group (—SH), or a cyano group (—CN). Also, optionally the substituents are not same as the groups being substituted. For example, an alkyl group is not substituted with an alkyl group.

Herein, the alkyl group as the substituent may be either a linear or branched, and may be, for example a linear alkyl group having 1 to 20 carbon atoms or a branched alkyl group having 3 to 20 carbon atoms. Specifically, the alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-icosyl group, and the like.

As the substituent, the cycloalkyl group may include for example, a cyclopropyl group, a cyclobutyl group, a cyclopentyl group, and a cyclohexyl group.

As the hydroxyalkyl group, for example, the alkyl group may be substituted with 1 to 3 (desirably, 1 or 2, and more particularly, desirably 1) hydroxy groups (for example, a hydroxymethyl group or a hydroxyethyl group).

As the alkoxyalkyl group, for example, the alkyl group may be substituted with 1 to 3 (desirably 1 or 2 and more desirably 1) alkoxy groups.

As the substituent, the alkoxy group may be either linear or a branched, but desirably a linear alkoxy group having 1 to 20 carbon atoms or a branched chain alkoxy group having 3 to 20 carbon atoms. For example, the alkoxy group may be, for example, a methoxy group, an ethoxy group, a propoxy group, an isopropoxy group, a butoxy group, a pentyloxy group, a hexyloxy group, a heptyloxy group, a 3-ethylpentyloxy group an octyloxy group, a 2-ethylhexyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, and the like.

The cycloalkoxy group as a substituent may be, for example, a cyclopropyloxy group, a cyclobutyloxy group, a cyclopentyloxy group, a cyclohexyloxy group, and the like.

The alkenyl group may include, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, and the like.

The alkynyl group as a substituent may include, for example, an acetylenyl group, a 1-propynyl group, a 2-propynyl group, a 1-butynyl group, a 2-butynyl group, a 3-butynyl group, a 1-pentynyl group, a 2-pentynyl group, a 3-pentynyl group, 1-hexynyl group, a 2-hexynyl group, a 3-hexynyl group, a 1-heptynyl group, a 2-heptynyl group, a 5-heptynyl group, a 1-octynyl group, a 3-octynyl group, a 5-octynyl group, and the like.

Examples of the aryl group as the substituent may include an aryl group having 6 to 30 carbon atoms. The aryl group may include, for example, a phenyl group, a naphthyl group, a biphenyl group, a fluorenyl group, an anthryl group, a pyrenyl group, an azulenyl group, an acenaphthylenyl group, a terphenyl group, and a phenanthryl group.

The aryloxy group as the substituent may include, for example, a phenoxy group, and a naphthyloxy group.

The alkylthio group as the substituent may include, for example, a methylthio group, an ethylthio group, a propylthio group, a pentylthio group, a hexylthio group, an octylthio group, a dodecylthio group, and the like.

The cycloalkylthio group as the substituent may include, for example, a cyclopentylthio group and a cyclohexylthio group.

The arylthio group as the substituent may include, for example, a phenylthio group, a naphthylthio group, and the like.

The alkoxycarbonyl group as the substituent may include, for example, a methyloxy carbonyl group, an ethyloxy carbonyl group, a butyloxy carbonyl group, an octyloxy carbonyl group, a dodecyloxycarbonyl group, and the like.

The aryloxycarbonyl group as the substituent may include, for example, a phenyloxycarbonyl group, a naphthyloxycarbonyl group, and the like.

Copolymer

The copolymer according to an embodiment includes a structural unit represented by Chemical Formula 1 (Structural Unit (1)). The copolymer having the following structure includes Structural Unit (1-1). For this reason, an electroluminescence device (particularly quantum dot electroluminescence device) including the copolymer (especially in the hole transport layer) has excellent luminous efficiency and durability (long luminescence life-span). In addition, high current efficiency and/or low driving voltage may also be achieved with the devices described herein.

The copolymer may include one type of structural unit (Structural Unit (1)) represented by Chemical Formula 1, or may include two or more types of Structural Unit (1). The plurality of Structural Units (1) may exist in a block type or in a random type.

In addition, when two or more types of Structural Units (1) are present, "Structural Unit (1-1)" of each Structural Unit (1) may be the same or different. Similarly, when two or more types of Structural Units (1) are present, "Structural Units (1-2)" of each Structural Unit (1) may be the same or different.

Chemical Formula 1

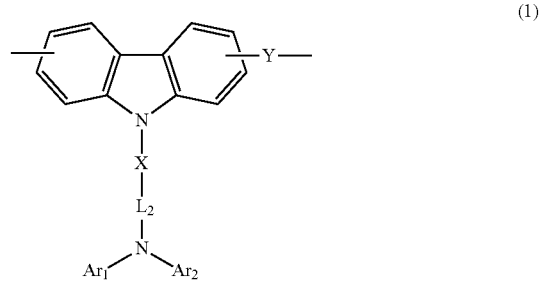

(1)

In Chemical Formula 1,

In Chemical Formula 1, $L_2$, $Ar_1$, and $Ar_2$ satisfy at least one of "Condition (i): $Ar_1$ and $Ar_2$ are different groups" and "Condition (ii): $L_2$ and $Ar_1$ form a ring with each other."

X is a single bond, $-L_{1a}-$, or $-L_{1b}-L_{1c}-$, wherein $L_{1a}$, $L_{1b}$, and $L_{1c}$ are each independently a substituted or unsubstituted divalent aromatic hydrocarbon group having 6 to 25 carbon atoms. $L_{1b}$ and $L_{1c}$ may be the same or different. When a plurality of $L_{1a}$'s, a plurality of $L_{1b}$'s, and a plurality of $L_{1c}$'s are present, they may be the same or different from each other. The substituted or unsubstituted divalent aromatic hydrocarbon group having 6 to 25 carbon atoms may be a substituted or unsubstituted C6 to C25 arylene group. The substituted or unsubstituted divalent aromatic hydrocarbon group having 6 to 25 carbon atoms is not particularly limited, but may be a divalent group derived from an aromatic hydrocarbon compound such as benzene (phenylene group), pentalene, indene, naphthalene, anthracene, azulene, heptalene, acenaphthene, phenalene, fluorene, phenanthrene, biphenyl, terphenyl, quaterphenyl, quinquephenyl, pyrene, 9,9-diphenyl fluorene, 9,9'-spirobi[fluorene], 9,9-dialkyl fluorene, and the like. Further, the divalent aromatic hydrocarbon group having 6 to 25 carbon atoms may be a divalent group derived from a structure in which two or more types of the aforementioned aromatic hydrocarbon compounds are combined, for example by a single bond, a C1 to C6 alkylene group, or a heteroatom such as oxygen or sulfur.

For example, X may be a single bond or a divalent group ($-L_{1a}-$ or $-L_{1b}-L_{1c}-$) derived from a compound such as benzene, fluorene, dibenzofuran, dibenzothiophene, or biphenyl. Specifically, X may be a single bond and a divalent group ($-L_{1a}-$ or $-L_{1b}-L_{1c}-$) derived from a compound such as benzene (an o-, m-, or p-phenylene group), dibenzofuran, or fluorene. More specifically, X may be a single bond or a phenylene group (especially a p-phenylene group). In an embodiment, X may be a single bond. When X is as described above, the HOMO level of the copolymer may be appropriately controlled. In addition, a higher hole injection property, a higher triplet energy level, a lower drive voltage, a film-forming property, or the balance of any two or more of these (particularly a hole injection property and a film-forming property) may also be achieved.

In an embodiment, $L_{1a}$, $L_{1b}$, and $L_{1c}$ may be unsubstituted or any one hydrogen atom may be replaced by a substituent. The number of substituents introduced when any one of the hydrogen atoms in $L_{1a}$, $L_{1b}$, and $L_{1c}$ is replaced is not particularly limited, but may be 1 or more and 3 or less, for example 1 or more and 2 or less, or particularly 1. When $L_{1a}$, $L_{1b}$, and $L_{1c}$ have a substituent, the bonding position of the substituent is not particularly limited.

The substituent may be located as far from the nitrogen of the arylamine side chain to which X is linked via $L_2$ as possible. By the presence of a substituent at this position, the HOMO level of the copolymer may be appropriately controlled. In addition, a higher hole injection property, a higher triplet energy level, a lower drive voltage, a film-forming property, or the balance of any two or more of these (particularly a hole injection property and a film-forming property) may be achieved.

$L_2$ is a substituted or unsubstituted aromatic hydrocarbon group having 6 to 25 carbon atoms, or a substituted or unsubstituted aromatic heterocyclic group having 3 to 25 ring-member atoms. When a plurality of $L_2$'s are present, they may be the same or different from each other. Examples of the aromatic hydrocarbon group having 6 to 25 carbon atoms may be groups derived from the aromatic hydrocarbon compound in X (-$L_{1a}$- or -$L_{1b}$-$L_{1c}$-). The substituted or unsubstituted aromatic heterocyclic group having 3 to 25 ring-member atoms may be a substituted or unsubstituted C2 to C25 heteroarylene group and may include at least one, for example, 1 to 3 heteroatoms of N, O, S, Se, Te, Si, or P in the ring. Examples of the aromatic heterocyclic group having 3 to 25 ring-member atoms are not particularly limited, but may be specifically a group derived from heterocyclic aromatic compounds such as acridine, phenazine, benzoquinoline, benzoisoquinoline, phenanthridine, phenanthroline, anthraquinone, fluorenone, dibenzofuran, phenyl dibenzofuran, dibenzothiophene, dibenzothiophene, carbazole, imidazo phenanthridine, benzimidazophenanthridine, azadibenzofuran, 9-phenyl carbazole, azacarbazole, diazabenzothiophene, diazadibenzofuran, diazacarbazole, diazadibenzothiophene, xanthone, thioxanthone, pyridine, quinoline, anthraquinoline, and the like.

In addition, the aromatic hydrocarbon group having 6 to 25 carbon atoms and the aromatic heterocyclic group having 3 to 25 ring-member atoms may be a group derived from a structure in which two or more types of the aromatic hydrocarbon compounds are combined as in X (-$L_{1a}$- or -$L_{1b}$-$L_{1c}$-), or a group derived from a structure in which two or more types of the heterocyclic aromatic compounds are combined, or a group derived from a structure in which one or more type of the aromatic hydrocarbon compound as in X (-$L_{1a}$- or -$L_{1b}$-$L_{1c}$-) and one or more heterocyclic aromatic compounds are combined. Among them, the group derived from the aromatic hydrocarbon compound or the aromatic heterocyclic ring group having 3 to 25 ring atoms may be a group derived from a compound such as benzene (a phenylene group), biphenyl, terphenyl, quaterphenyl, fluorene, dibenzofuran or dibenzothiophene, desirably a group derived from benzene (phenylene group), biphenyl, fluorene or dibenzofuran, or more desirably a group derived from benzene (phenylene group) or biphenyl.

According to an embodiment, $L_2$ may be a group represented by Chemical Formula 3A or Chemical Formula 3B.

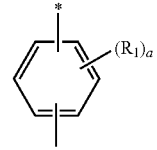

Chemical Formula 3A

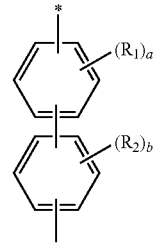

Chemical Formula 3B

In Chemical Formula 3A and Chemical Formula 3B, $R_1$ and $R_2$ may each independently be hydrogen, a linear or branched hydrocarbon group having 1 to 14 carbon atoms (a C1 to C14 alkyl group, for example a C1 to C12 alkyl group, for example an n-octyl group, a 2-ethylhexyl group, or an n-dodecyl group), an aromatic hydrocarbon group having 6 to 14 carbon atoms (a C6 to C14 aryl group, for example a C6 to C10 aryl group), or an aromatic heterocyclic group having 3 to 25 ring-member atoms (a C1 to C25 heteroaryl group, for example a C1 to C20 heteroaryl group), a and b may each independently be an integer of 1 to 4, and

* indicates a linking portion with the bridge nitrogen of the main chain carbazole ring of Chemical Formula 1, and a link without * indicates a bond to the nitrogen of the arylamine side chain of Chemical formula 1.

The group represented by Chemical Formula 3A and Chemical Formula 3B may each independently be a group represented by Chemical Formula 3A-1 and Chemical Formula 3B-1, respectively.

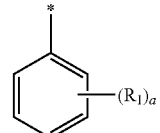

Chemical Formula 3A-1

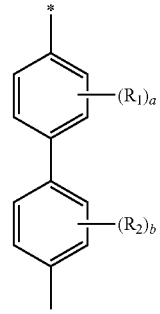

Chemical Formula 3B-1

In Chemical Formula 3A-1 and Chemical Formula 3B-1, $R_1$ and $R_2$ may each independently be hydrogen, a linear or branched hydrocarbon group having 1 to 14 carbon atoms (a C1 to C14 alkyl group, for example, a C1 to C12 alkyl group, for example, an n-octyl group, a 2-ethylhexyl group, or an n-dodecyl group), an aromatic hydrocarbon group having 6 to 14 carbon atoms (a C6 to C14 aryl group, for example a C6 to C10 aryl group), or an aromatic heterocyclic group having 3 to 25 ring-member atoms (a C1 to C25 heteroaryl group, for example a C1 to C20 heteroaryl group or a C1 to C10 heteroaryl group), a and b may each independently be an integer of 1 to 4, and

* indicates a linking portion with the bridge nitrogen of the main chain carbazole ring of Chemical Formula 1, and a link without * indicates a bond to the nitrogen of the arylamine side chain of Chemical formula 1. For example, $L_2$ may be a group represented by Group 3.

[Group 3]

(3-1)

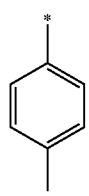

(3-2)

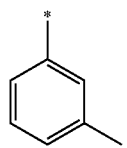

(3-3)

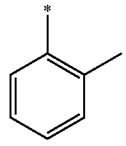

(3-4)

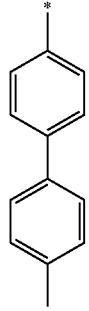

(3-5)

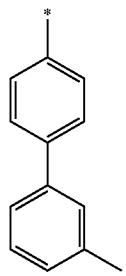

-continued (3-6)

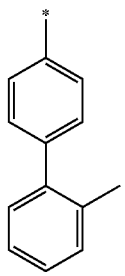

(3-7)

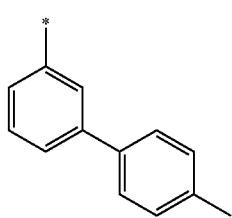

(3-8)

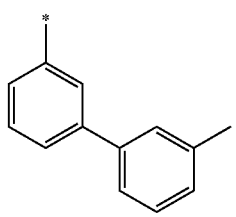

(3-9)

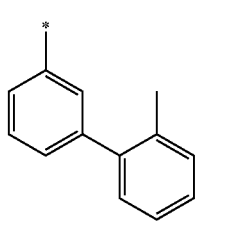

(3-10)

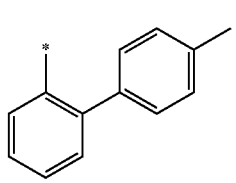

(3-11)

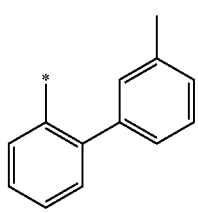

(3-12)

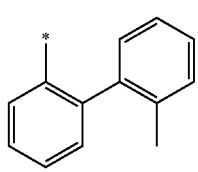

(3-13) 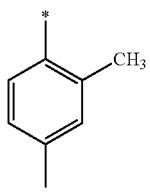
(3-14) 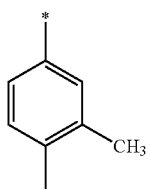
(3-15) 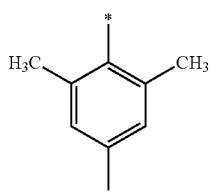
(3-16) 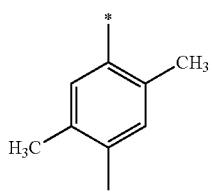
(3-17) 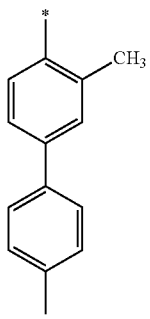
(3-18) 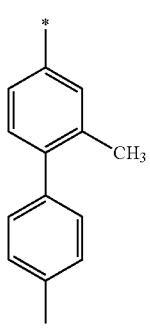
(3-19) 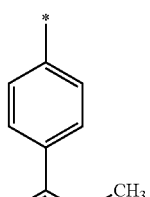
(3-20) 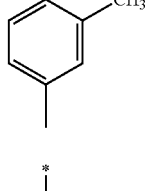
(3-21) 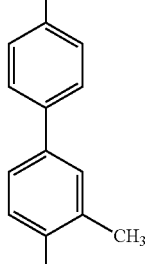
(3-22) 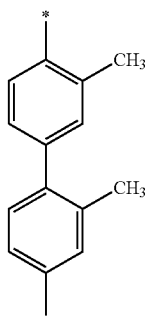
(3-23) 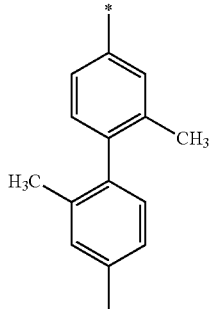

-continued (3-24)

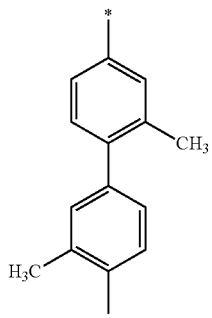

In Group 3,

* indicates a linking portion with the bridge nitrogen of the main chain carbazole ring of Chemical Formula 1, a link without * indicates a bond to the nitrogen of the arylamine side chain of Chemical formula 1, and a hydrogen atom of an aromatic ring of a Group 3 structure may be optionally substituted by a linear or branched hydrocarbon group having 1 to 14 carbon atoms.

In an embodiment, in Group 3, $L_2$ may be a moiety represented by (3-1), (3-4), or (3-13) to (3-24), or desirably a moiety represented by (3-4). Such group structures of $L_2$ may appropriately control the HOMO level of the copolymer. In addition, a higher hole injection property, a higher triplet energy level, a lower drive voltage, a film-forming property, or the balance of any two or more of these (particularly a hole injection property and a film-forming property) may be achieved. Moreover, when $L_2$, $Ar_1$, and $Ar_2$ satisfy "Condition (ii): $L_2$ and $Ar_1$ join to form a ring", $L_2$ may be a trivalent group, and when Condition (ii) is not satisfied, $L_2$ may be a divalent group.

$Ar_1$ and $Ar_2$ may each independently be a substituted or unsubstituted aromatic hydrocarbon group having 6 to 25 carbon atoms, or a substituted or unsubstituted aromatic heterocyclic group having 3 to 25 ring-member atoms. When a plurality of $Ar_1$'s and $Ar_2$'s are present, they may be the same or different from each other.

The aromatic hydrocarbon group having 6 to 25 carbon atoms and aromatic heterocyclic group having 3 to 25 ring-member atoms may be a group derived from the aromatic hydrocarbon compound as in X (-$L_{1a}$- or -$L_{1b}$-$L_{1c}$-); a group derived from the heterocyclic aromatic compound as in $L_2$; a group derived from a structure in which two or more types of the aromatic hydrocarbon compounds are combined as in X (-$L_{1a}$- or -$L_{1b}$-$L_{1c}$-); a group derived from a structure in which two or more types of heterocyclic aromatic compounds are combined as in $L_2$; or a group derived from a structure in which one or more types of the aromatic hydrocarbon compound as in X (-$L_{1a}$- or -$L_{1b}$-$L_{1c}$-) and the heterocyclic aromatic compound as in $L_2$.

Among them, the aromatic hydrocarbon group having 6 to 25 carbon atoms or the aromatic heterocyclic group having 3 to 25 ring-member atoms may be a group derived from a compound such as benzene, biphenyl, fluorene, 9,9-diphenyl fluorene, 9,9'-spirobi[fluorene], 9,9-dialkyl fluorene, dibenzofuran, phenyl dibenzofuran, dibenzothiophene, or phenyl dibenzothiophene, desirably a group derived from a compound such as benzene, biphenyl, fluorene, 9,9-diphenyl fluorene, 9,9'-spirobi[fluorene], 9,9-dialkyl fluorene, dibenzofuran, or phenyl dibenzofuran, or more desirably a group derived from a compound such as benzene, biphenyl, 9,9-diphenyl fluorene, 9,9-dialkyl fluorene, or dibenzofuran.

The above structural groups of $Ar_1$ and $Ar_2$ may increase the rate of hole movement or transport within the copolymer, and thus may improve durability (luminescence life-span) of a device. In addition, a higher hole injection property, a higher triplet energy level, a lower drive voltage, a film-forming property, or the balance of any two or more of these (particularly a hole injection property and a film-forming property) may be achieved.

In an embodiment, $Ar_2$ may be a monovalent group. When $L_2$, $Ar_1$, and $Ar_2$ satisfy "Condition (ii): $L_2$ and $Ar_1$ join to form a ring", $Ar_1$ may be a divalent group, and when Condition (ii) is not satisfied, $Ar_1$ may be a monovalent group.

In an embodiment, $L_2$, $Ar_1$, and $Ar_2$ satisfy "Condition (i): $Ar_1$ and $Ar_2$ are different groups," and $Ar_1$ and $Ar_2$ may each independently be a group represented by one of Chemical Formula 2A to Chemical Formula 2D.

Chemical Formula 2A

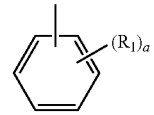

Chemical Formula 2B

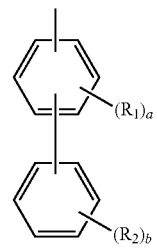

In Chemical Formula 2A and Chemical Formula 2B, $R_1$ and $R_2$ may each independently be hydrogen, a linear or branched hydrocarbon group having 1 to 14 carbon atoms (a C1 to C14 alkyl group, for example, a C1 to C12 alkyl group, for example, an n-octyl group, a 2-ethylhexyl group, or an n-dodecyl group), an aromatic hydrocarbon group having 6 to 14 carbon atoms (a C6 to C14 aryl group, for example a C6 to C10 aryl group), or an aromatic heterocyclic group having 3 to 25 ring-member atoms (a C1 to C25 heteroaryl group, for example a C1 to C20 heteroaryl group or a C1 to C10 heteroaryl group), a and b may each independently be an integer of 1 to 4, and a link without * indicates a bond to the nitrogen of the arylamine side chain of Chemical Formula 1.

Chemical Formula 2C

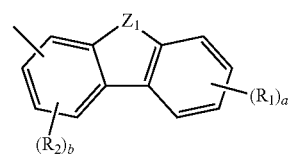

Chemical Formula 2D

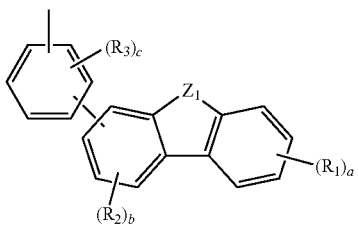

In Chemical Formula 2C and Chemical Formula 2D, $Z_1$ may be $CR_aR_b$, $NR_c$, O, S, Se, or Te, wherein $R_a$, $R_b$, and $R_c$ may each independently be hydrogen, a linear or branched hydrocarbon group having 1 to 14 carbon atoms (a C1 to C14 alkyl group, for example, a C1 to C12 alkyl group, for example, an n-octyl group, a 2-ethylhexyl group, or an n-dodecyl group), an aromatic hydrocarbon group having 6 to 14 carbon atoms (a C6 to C14 aryl group, for example a C6 to C10 aryl group), or an aromatic heterocyclic group having 3 to 25 ring-member atoms (a C1 to C25 heteroaryl group, for example a C1 to C20 heteroaryl group or a C1 to C10 heteroaryl group), or $R_a$ and $R_b$ may be linked to each other to provide a spiro structure (e.g., fluorenyl group), $R_1$, $R_2$, and $R_3$ may each independently be hydrogen, a linear or branched hydrocarbon group having 1 to 14 carbon atoms (a C1 to C14 alkyl group, for example, a C1 to C12 alkyl group, for example, an n-octyl group, a 2-ethylhexyl group, or an n-dodecyl group), an aromatic hydrocarbon group having 6 to 14 carbon atoms (a C6 to C14 aryl group, for example a C6 to C10 aryl group), or an aromatic heterocyclic group having 3 to 25 ring-member atoms (a C1 to C25 heteroaryl group, for example a C1 to C20 heteroaryl group or a C1 to C10 heteroaryl group), a and b may each independently be an integer of 1 to 4, and a link without * indicates a bond to the nitrogen of the arylamine side chain of Chemical Formula 1.

For example, $Ar_1$ and $Ar_2$ may each independently be a group represented by Group 2.

[Group 2]

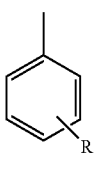
(2-1)

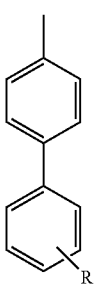
(2-2)

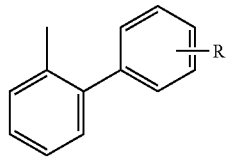
(2-3)

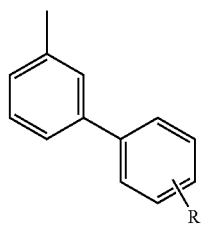
(2-4)

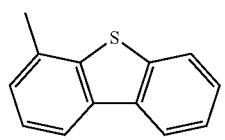
(2-5)

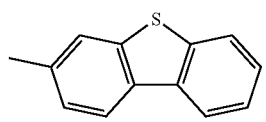
(2-6)

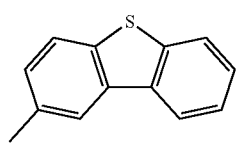
(2-7)

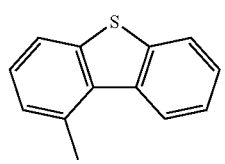
(2-8)

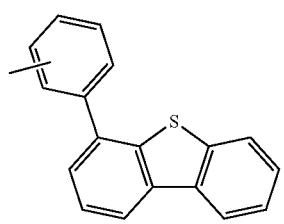
(2-9)

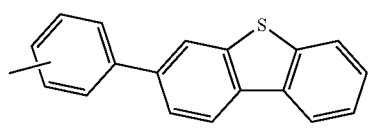
(2-10)

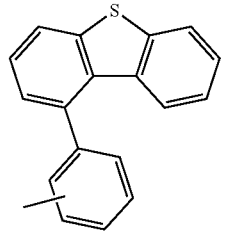
(2-11)

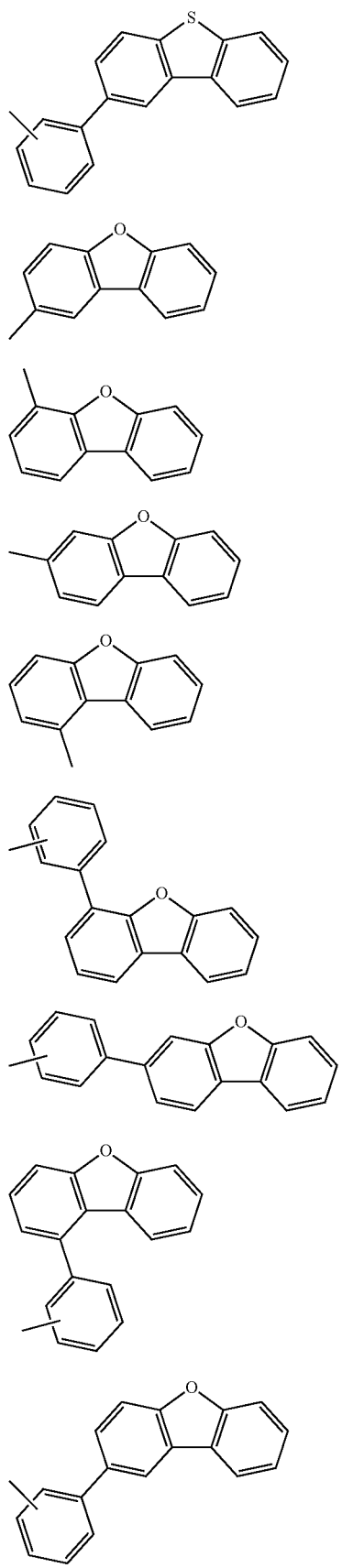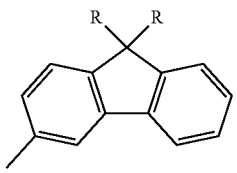

-continued

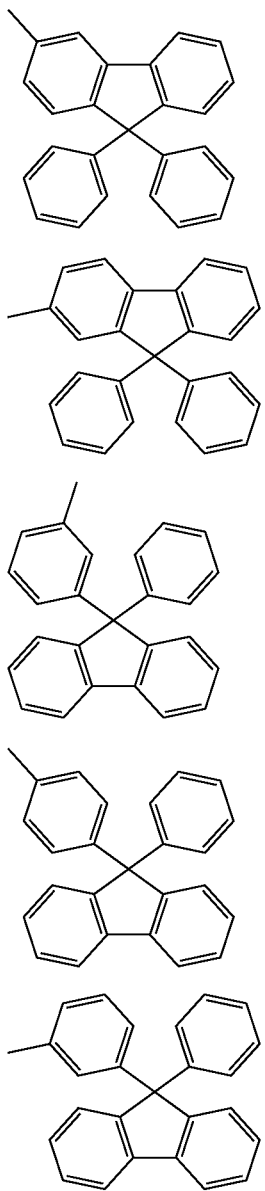

(2-29)

(2-30)

(2-31)

(2-32)

(2-33)

In Group 2,

R may each independently be a hydrogen atom or a linear or branched hydrocarbon group having 1 to 14 carbon atoms, and a hydrogen atom of an aromatic ring of a Group 2 structure may be optionally substituted by a linear or branched hydrocarbon group having 1 to 14 carbon atoms.

The linear or branched hydrocarbon group having 1 to 14 carbon atoms may be a C1 to C14 linear or branched alkyl group or C1 to C12 linear or branched alkyl group; a C2 to C14 linear or branched alkenyl group or a C2 to C12 linear or branched alkenyl group; or a C2 to C14 linear or branched alkynyl group or a C2 to C12 linear or branched alkynyl group, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, an n-tridecyl group, an n-tetradecyl group, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, an acetylenyl group, a 1-propynyl group, a 2-propynyl group, a 1-butynyl group, a 2-butynyl group, a 3-butynyl group, a 1-pentynyl group, a 2-pentynyl group, a 3-pentynyl group, 1-hexynyl group, a 2-hexynyl group, a 3-hexynyl group, a 1-heptynyl group, a 2-heptynyl group, a 5-heptynyl group, a 1-octynyl group, a 3-octynyl group, a 5-octynyl group, and the like.

In an embodiment, $Ar_1$ and $Ar_2$ may be desirably a moiety represented by one of (2-1) to (2-24), or more desirably a moiety represented by one of (2-1) to (2-4), (2-16), (2-23), and (2-27). For example, the combination of $Ar_1$ and $Ar_2$ may be a combination of (2-2) and (2-23), a combination of (2-3) and (2-23), a combination of (2-4) and (2-23), a combination of (2-16) and (2-27), or a combination of (2-23) and (2-27).

In Group 2, R may be each independently a linear or branched (saturated) hydrocarbon group having 1 to 14 carbon atoms, desirably a linear or branched (saturated) hydrocarbon group having 1 to 8 carbon atoms, or more desirably a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, or a 1,2-dimethylbutyl group.

These $Ar_1$ and $Ar_2$ groups may increase the rate of hole movement or transport within the copolymer, and thus may improve durability (luminescence life-span) of a device. In addition, a higher hole injection property, a higher triplet energy level, a lower drive voltage, a film-forming property, or the balance of any two or more of these (particularly a hole injection property and a film-forming property) may be achieved.

In an embodiment, when $L_2$, $Ar_1$, and $Ar_2$ satisfy "Condition (ii): $L_2$ and $Ar_1$ join to form a ring", $-L_2-N(Ar_1)(Ar_2)$ may be a group represented by Chemical Formula 4A or Chemical Formula 4B.

Chemical Formula 4A

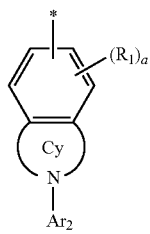

Chemical Formula 4B

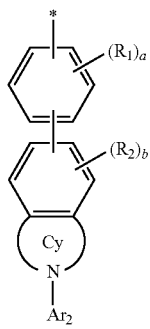

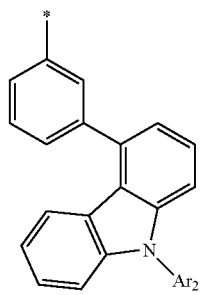
(4-2)

In Chemical Formula 4A and Chemical Formula 4B, $R_1$ and $R_2$ may each independently be hydrogen, a linear or branched hydrocarbon group having 1 to 14 carbon atoms (a C1 to C14 alkyl group, for example, a C1 to C12 alkyl group, for example, an n-octyl group, a 2-ethylhexyl group, or an n-dodecyl group), an aromatic hydrocarbon group having 6 to 14 carbon atoms (a C6 to C14 aryl group, for example a C6 to C10 aryl group), or an aromatic heterocyclic group having 3 to 25 ring-member atoms (a C1 to C25 heteroaryl group, for example a C1 to C20 heteroaryl group or a C1 to C10 heteroaryl group), a and b may each independently be an integer of 1 to 4,

* indicates a linking portion with the bridge nitrogen of the main chain carbazole ring, Cy may be a substituted or unsubstituted N-containing heterocyclic ring group having 5 to 25 ring-member atoms, and $Ar_2$ is as defined in Chemical Formula 1.

The N-containing heterocyclic ring group having 5 to 25 ring-member atoms may be a group derived from a heterocyclic compound that can be a substituted or unsubstituted pyrrolidine, a substituted or unsubstituted pyrazolidine, a substituted or unsubstituted piperidine, a substituted or unsubstituted indoline, a substituted or unsubstituted piperazine, a substituted or unsubstituted morpholine, a substituted or unsubstituted thiazine, or a substituted or unsubstituted naphthyridine, or the like.

In an embodiment, when $L_2$, $Ar_1$, and $Ar_2$ satisfy "Condition (ii): $L_2$ and $Ar_1$ join to form a ring", $-L_2-N(Ar_1)(Ar_2)$ may be a group represented by Group 4.

[Group 4]

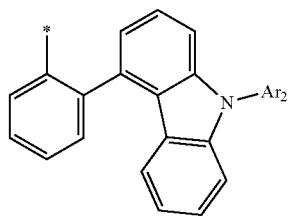
(4-3)

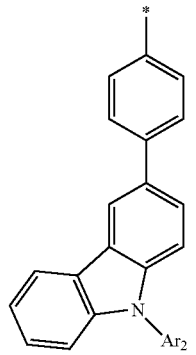
(4-4)

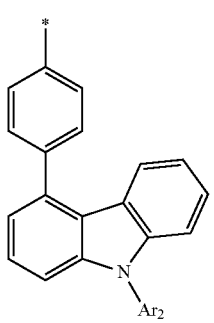
(4-1)

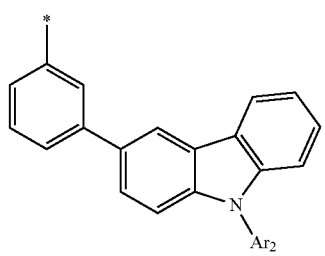
(4-5)

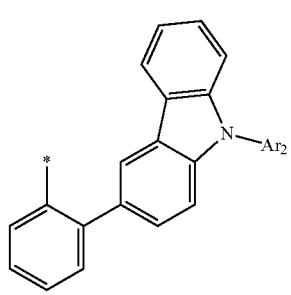
(4-6)

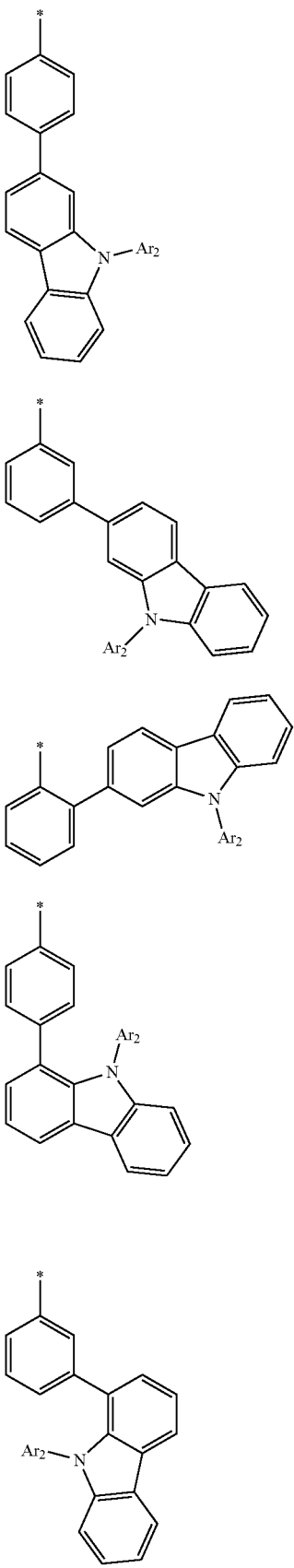
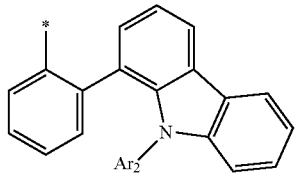

In Group 4,

Ar$_2$ is as defined in Chemical Formula 1, and a hydrogen atom of an aromatic ring of a Group 4 structure may be optionally substituted by a linear or branched hydrocarbon group having 1 to 14 carbon atoms.

In Group 4, the linear or branched hydrocarbon group having 1 to 14 carbon atoms may be a C1 to C14 linear or branched alkyl group or C1 to C12 linear or branched alkyl group; a C2 to C14 linear or branched alkenyl group or a C2 to C12 linear or branched alkenyl group; or a C2 to C14 linear or branched alkynyl group or a C2 to C12 linear or branched alkynyl group, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethyl propyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, an n-tridecyl group, an n-tetradecyl group, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, an acetylenyl group, a 1-propynyl group, a 2-propynyl group, a 1-butynyl group, a 2-butynyl group, a 3-butynyl group, a 1-pentynyl group, a 2-pentynyl group, a 3-pentynyl group, 1-hexynyl group, a 2-hexynyl group, a 3-hexynyl group, a 1-heptynyl group, a 2-heptynyl group, a 5-heptynyl group, a 1-octynyl group, a 3-octynyl group, a 5-octynyl group, and the like.

In an embodiment, -L$_2$-N(Ar$_1$)(Ar$_2$) may be a moiety represented by (4-1), (4-4), or (4-7), or desirably a moiety represented by (4-4).

Ar$_2$ in -L$_2$-N(Ar$_1$)(Ar$_2$) may be a group represented by one of Chemical Formula 2A to Chemical Formula 2D, and specifically, Ar$_2$ may be a group as represented in Group 2.

The -L$_2$-N(Ar$_1$)(Ar$_2$) may increase the rate of hole movement or transport within the copolymer, and thus may improve durability (luminescence life-span) of a device. In addition, a higher hole injection property, a higher triplet energy level, a lower drive voltage, a film-forming property, or the balance of any two or more of these (particularly a hole injection property and a film-forming property) may be achieved.

In Chemical Formula 1, Y is a substituted or unsubstituted divalent aromatic hydrocarbon group having 6 to 60 carbon atoms, or a substituted or unsubstituted divalent aromatic heterocyclic group having 3 to 60 ring-member atoms.

The divalent aromatic hydrocarbon group having 6 to 60 carbon atoms may be a C6 to C60 (e.g., C6 to C50, C6 to C40, C6 to C30, or C6 to C25) aryl group and the divalent aromatic heterocyclic group having 3 to 60 ring-member atoms may be a C2 to C60 (e.g., C2 to C50, C2 to C40, C2 to C30, or C2 to C25) heteroaryl group and may include at least one, for example, 1 to 3 heteroatoms such as N, O, S, Se, Te, Si, and P in the ring. The divalent aromatic hydrocarbon group having 6 to 60 carbon atoms and the divalent aromatic heterocyclic group having 3 to 60 ring-member atoms may be may be a divalent group derived from the aromatic hydrocarbon compound as in X (-$L_{1a}$- or -$L_{1b}$-$L_{1c}$-), a divalent group derived from the heterocyclic aromatic compound as in $L_2$, a divalent group derived from a structure in which two or more types of the aromatic hydrocarbon compounds are combined as in X (-$L_{1a}$- or -$L_{1b}$-$L_{1c}$-), a divalent group derived from a structure in which two or more types of heterocyclic aromatic compounds are combined as in $L_2$, or a divalent group derived from a structure in which one or more types of the aromatic hydrocarbon compound as in X (-$L_{1a}$- or -$L_{1b}$-$L_{1c}$-) and the heterocyclic aromatic compound as in $L_2$.

Among them, the divalent aromatic hydrocarbon group having 6 to 25 carbon atoms or the divalent aromatic heterocyclic group having 3 to 25 ring-member atoms may be desirable; a divalent group derived from a compound such as benzene (a phenylene group), biphenyl, terphenyl, quaterphenyl, fluorene, dibenzofuran, or dibenzothiophene or a structure in which these compounds are combined may be more desirable; and a divalent group derived from benzene (a phenylene group), fluorene, or dibenzofuran, or a structure in which these compounds are combined may be even more desirable.

A selection of Y may appropriately control the HOMO level of the copolymer. In addition, a higher hole injection property, a higher triplet energy level, a lower drive voltage, a film-forming property, or the balance of any two or more of these (particularly a hole injection property and a film-forming property) may be achieved.

In an embodiment, Y may be a group represented by Chemical Formula 5A to Chemical Formula 5E.

Chemical Formula 5A

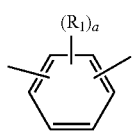

In Chemical Formula 5A $R_1$ may each independently be hydrogen, a linear or branched hydrocarbon group having 1 to 14 carbon atoms (a C1 to C14 alkyl group, for example, a C1 to C12 alkyl group, for example, an n-octyl group, a 2-ethylhexyl group, or an n-dodecyl group), an aromatic hydrocarbon group having 6 to 28 carbon atoms (a C6 to C28 aryl group, for example a C6 to C14 aryl group or a C6 to C10 aryl group), or an aromatic heterocyclic group having 3 to 25 ring-member atoms (a C1 to C25 heteroaryl group, for example a C1 to C20 heteroaryl group or a C1 to C10 heteroaryl group), a may be an integer of 1 or 4.

Chemical Formula 5B

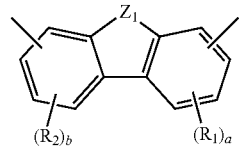

Chemical Formula 5C

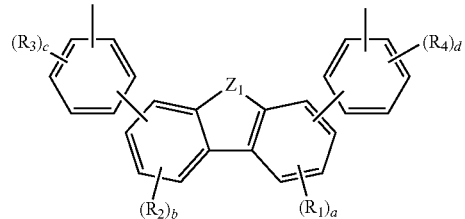

In Chemical Formula 5B and Chemical Formula 5C, $Z_1$ may be $CR_aR_b$, $NR_c$, O, S, Se, or Te, wherein $R_a$, $R_b$, and $R_c$ may each independently be hydrogen, a linear or branched hydrocarbon group having 1 to 14 carbon atoms (a C1 to C14 alkyl group, for example, a C1 to C12 alkyl group, for example, an n-octyl group, a 2-ethylhexyl group, or an n-dodecyl group), an aromatic hydrocarbon group having 6 to 14 carbon atoms (a C6 to C14 aryl group, for example a C6 to C10 aryl group), or an aromatic heterocyclic group having 3 to 25 ring-member atoms (a C1 to C25 heteroaryl group, for example a C1 to C20 heteroaryl group or a C1 to C10 heteroaryl group), or $R_a$ and $R_b$ may be linked to each other to provide a spiro structure (e.g., fluorenyl group), $R_1$, $R_2$, $R_3$, and $R_4$ may each independently be hydrogen, a linear or branched hydrocarbon group having 1 to 14 carbon atoms (a C1 to C14 alkyl group, for example, a C1 to C12 alkyl group, for example, an n-octyl group, a 2-ethylhexyl group, or an n-dodecyl group), an aromatic hydrocarbon group having 6 to 28 carbon atoms (a C6 to C28 aryl group, for example a C6 to C14 aryl group or a C6 to C10 aryl group), or an aromatic heterocyclic group having 3 to 25 ring-member atoms (a C1 to C25 heteroaryl group, for example a C1 to C20 heteroaryl group or a C1 to C10 heteroaryl group), a and b may each independently be an integer of 1 to 3, and c and d may each independently be an integer of 1 to 3.

Chemical Formula 5D

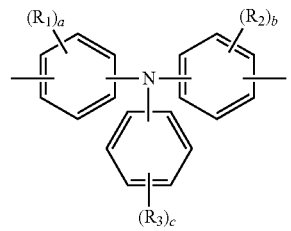

Chemical Formula 5E

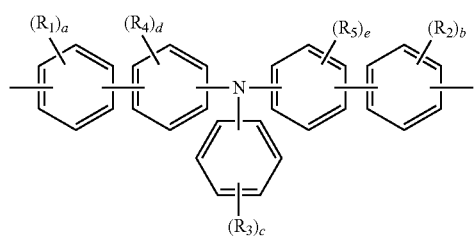

In Chemical Formula 5D and Chemical Formula 5E, $R_1$, $R_2$, $R_3$, $R_4$, and $R_5$ may each independently be hydrogen, a linear or branched hydrocarbon group having 1 to 14 carbon atoms (a C1 to C14 alkyl group, for example, a C1 to C12 alkyl group, for example, an n-octyl group, a 2-ethylhexyl group, or an n-dodecyl group), an aromatic hydrocarbon group having 6 to 28 carbon atoms (a C6 to C28 aryl group, for example a C6 to C14 aryl group or a C6 to C10 aryl group), or an aromatic heterocyclic group having 3 to 25 ring-member atoms (a C1 to C25 heteroaryl group, for example a C1 to C20 heteroaryl group or a C1 to C10 heteroaryl group), a, b, c, d, and e may each independently be an integer of 1 to 4.

For example, Y may be a group represented by Group 5.

[Group 5]

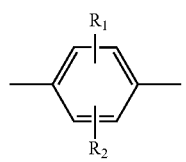 (5-1)

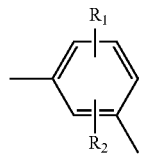 (5-2)

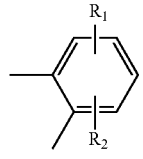 (5-3)

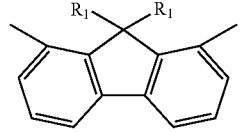 (5-4)

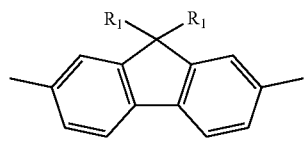 (5-5)

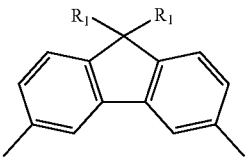 (5-6)

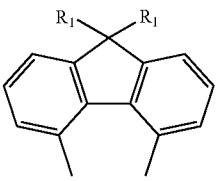 (5-7)

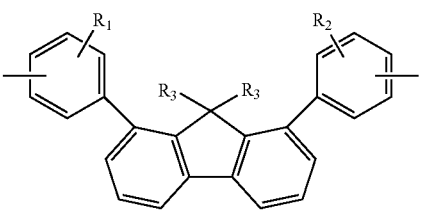 (5-8)

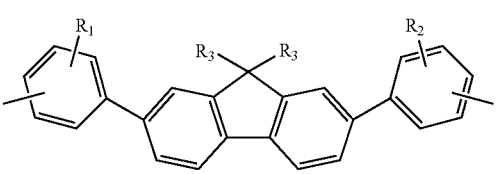 (5-9)

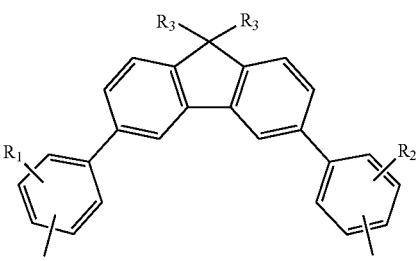 (5-10)

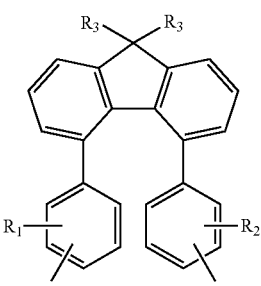 (5-11)

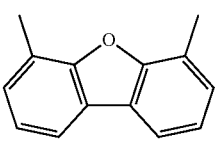 (5-12)

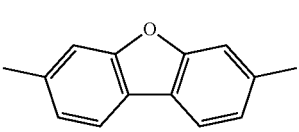 (5-13)

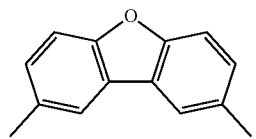
(5-14)

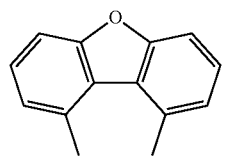
(5-15)

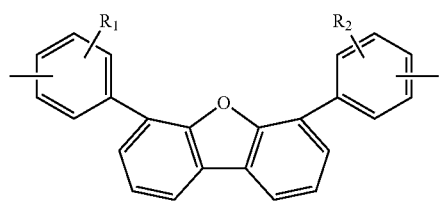
(5-16)

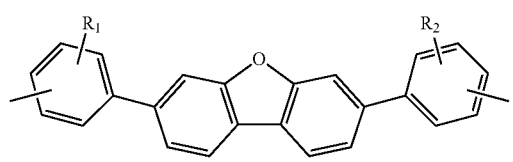
(5-17)

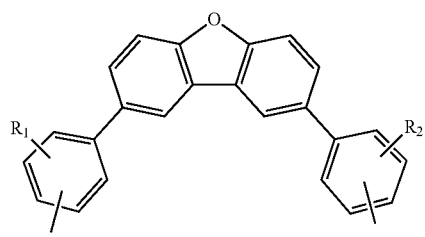
(5-18)

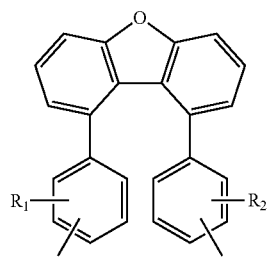
(5-19)

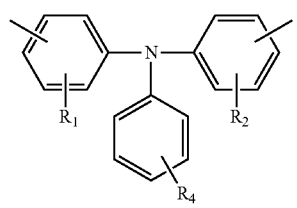
(5-20)

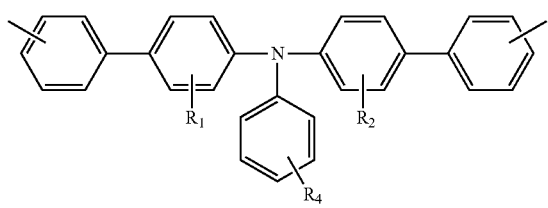
(5-21)

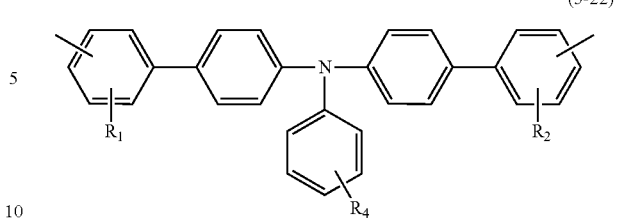
(5-22)

In Group 5, $R_1$, $R_2$, and $R_4$ may each independently be hydrogen, a linear or branched hydrocarbon group having 1 to 14 carbon atoms (a C1 to C14 alkyl group, for example a C1 to C12 alkyl group), an aromatic hydrocarbon group having 6 to 28 carbon atoms (a C6 to C28 aryl group, for example a C6 to C14 aryl group or a C6 to C10 aryl group), or an aromatic heterocyclic group having 3 to 25 ring-member atoms (a C1 to C25 heteroaryl group, for example a C1 to C20 heteroaryl group or a C1 to C10 heteroaryl group), $R_3$ may each independently be hydrogen or a linear or branched hydrocarbon group having 1 to 14 carbon atoms (a C1 to C14 alkyl group or a C1 to C12 alkyl group), and a hydrogen atom of an aromatic ring of a Group 5 structure may be optionally substituted by a linear or branched hydrocarbon group having 1 to 14 carbon atoms.

The linear or branched hydrocarbon group having 1 to 14 carbon atoms may be, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropyl propyl group, a 1,2-dimethylbutyl group, an n-heptyl group, a 1,4-dimethyl pentyl group, a 3-ethyl pentyl group, a 2-methyl-1-isopropyl propyl group, a 1-ethyl-3-methyl butyl group, an n-octyl group, a 2-ethylhexyl group, a 3-methyl-1-isopropyl butyl group, a 2-methyl-1-isopropyl group, a 1-tert-butyl-2-methyl propyl group, an n-nonyl group, a 3,5,5-trimethyl hexyl group, an n-decyl group, an isodecyl group, an n-undecyl group, a 1-methyldecyl group, an n-dodecyl group, an n-tridecyl group, an n-tetradecyl group, and the like.

The aromatic hydrocarbon group having 6 to 28 carbon atoms may be a phenyl group, a naphthyl group, a biphenyl group, a fluorenyl group, an anthryl group, a pyrenyl group, an azulenyl group, an acenaphthylenyl group, a terphenyl group, and a phenanthryl group.

In an embodiment, Y may be desirably a moiety represented by one of (5-1) to (5-7), or more desirably a moiety represented by one of (5-2) and (5-5).

In Group 5, $R_1$, $R_2$, $R_3$, and $R_4$ may each independently be a linear or branched (saturated) hydrocarbon group having 1 to 14 carbon atoms or an aromatic hydrocarbon group having 6 to 14 carbon atoms, and desirably an n-octyl group, a 2-ethylhexyl group, or an n-dodecyl group. Such Y may appropriately control the HOMO level of the copolymer. In addition, a higher hole injection property, a higher triplet energy level, a lower drive voltage, a film-forming property, or the balance of any two or more of these (particularly a hole injection property and a film-forming property) may be achieved.

As described above, the copolymer according to the present embodiment may be composed of Structural Unit (1) alone. Alternatively, the copolymer according to the present embodiment may further include other structural units in addition to Structural Unit (1). Other structural units are not particularly limited as long as they do not impair the effect of the copolymer (especially high triplet energy level and low driving voltage). Specifically, a structural unit as represented in Group 6 may be mentioned. Hereinafter, the structural unit represented in Group 6 is also referred to as "Structural Unit (2)."

[Group 6]

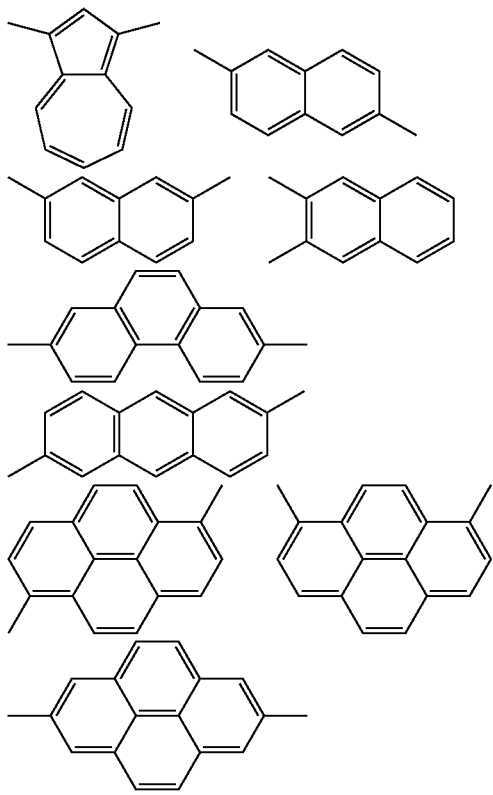

In Group 6, a hydrogen atom of the aromatic ring of a Group 6 structure may be optionally substituted by a linear or branched hydrocarbon group having 1 to 14 carbon atoms (a C1 to C14 alkyl group or a C1 to C12 alkyl group), or an aromatic hydrocarbon group having 6 to 28 carbon atoms (a C6 to C28 aryl group, for example a C6 to C20 aryl group).

The composition of Structural Unit (2) in the copolymer of the present embodiment is not particularly limited. In consideration of the ease of film-forming by the obtained polymer compound and the new improvement effect of film strength, Structural Unit (2) may be included in an amount of greater than or equal to about 1 mole percent (mol %) and less than or equal to about 10 mol % based on the total structural units constituting the copolymer. On the other hand, when the copolymer includes two or more Structural Units (2), the content of Structural Unit (2) means the total amount of Structural Units (2).

The weight average molecular weight (Mw) of the copolymer is not particularly limited as long as the desired effect of the present disclosure is obtained. The weight average molecular weight (Mw) may be, for example, about 8,000 to about 400,000, or for example greater than about 15,000 and less than about 350,000. With such a weight average molecular weight, it is possible to appropriately adjust the viscosity of the coating composition for forming a layer (for example, a hole injection layer, a hole transport layer) formed using the copolymer to form a layer having a uniform film thickness.

The number average molecular weight (Mn) of the copolymer is not particularly limited as long as the desired effect of the present disclosure is obtained. The number average molecular weight (Mn) may be, for example, about 5,000 to about 190,000, or for example about 9,000. With such a number average molecular weight, it is possible to appropriately adjust the viscosity of the coating composition for forming a layer (for example, a hole injection layer, a hole transport layer) formed using the copolymer and to form a layer having a uniform film thickness. In addition, a polydispersity (weight average molecular weight/number average molecular weight) of the copolymer of the present embodiment may be, for example, about 1.4 to about 4.0, or for example greater than about 1.5 and less than about 3.6.

Herein, the measurement of the number average molecular weight (Mn) and the weight average molecular weight (Mw) is not particularly limited and may be applied by using a known method or by appropriately changing the known methods. In the present specification, the number average molecular weight (Mn) and the weight average molecular weight (Mw) use values measured by the following method. The polydispersity (Mw/Mn) of the polymer is calculated by dividing the weight average molecular weight (Mw) by the number average molecular weight (Mn) measured by the following method.

Measurement of Number Average Molecular Weight (Mn) and Weight Average Molecular Weight (Mw)

The number average molecular weight (Mn) and the weight average molecular weight (Mw) of the copolymer are measured under the following conditions by SEC (Size Exclusion Chromatography) using polystyrene as a standard material.

(SEC Measurement Condition)
Analysis equipment (SEC): Shimadzu Corporation, Prominence
Column: Polymer Laboratories, PLgel MIXED-B
Column temperature: 40° C.
Flow rate: 1.0 mL/min
Injection amount of sample solution: 20 μL (concentration: about 0.05 wt %)
Eluent: tetrahydrofuran (THF)
Detector (UV-VIS detector): Shimadzu Corporation, SPD-10AV
Standard sample: polystyrene.

The terminal end of the main chain of the copolymer of the present embodiment is not particularly limited and is appropriately defined depending on the type of raw material used, but is usually a hydrogen atom.

The copolymer of the present embodiment may be synthesized by using a known organic synthesis method. The specific synthesis method of the copolymer may be easily understood by a person of an ordinary skill in the art referring to the examples to be described later. Specifically, the copolymer of the present embodiment may be prepared by a polymerization reaction using at least one monomer (1) represented by Chemical Formula 1', or a copolymerization reaction using one or more types of monomers (1) represented by Chemical Formula 1', and another monomer corresponding to the other structural unit (e.g., Structural Unit (2)).

Chemical Formula 1'

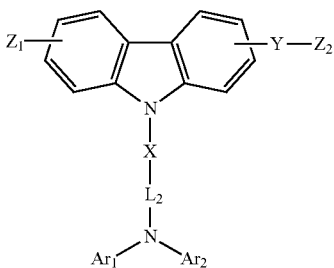

(1')

Alternatively, it may be prepared by a copolymerization reaction using one or more monomers (1-1) represented by Chemical Formula 1-1' and one or more monomers (1-2) represented by Chemical Formula 1-2' or a copolymerization reaction using one or more monomers (1-1) represented by Chemical Formula 1-1', one or more types of monomer (1-2) represented by Chemical Formula 1-2', and another monomer corresponding to the other structural unit (e.g., Structural Unit (2)).

Chemical Formula 1-1'

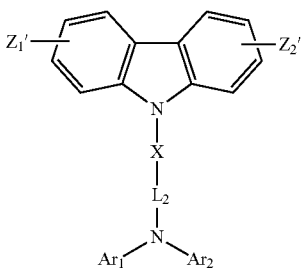

(1-1')

Chemical Formula 1-2'

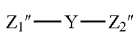

(1-2')

The monomers used for the polymerization of the copolymer according to the present disclosure may be synthesized by appropriately combining a known synthesis reaction, and their structures may be confirmed by known methods (for example, NMR, LC-MS, etc.).

In Chemical Formula 1', Chemical Formula 1-1', and Chemical Formula 1-2', $L_1$, $Ar_1$, $Ar_2$, and Y are the same as in Chemical Formula 1. $Z_1$, $Z_2$, $Z_1'$, $Z_2'$, $Z_1''$, and $Z_2''$ may each independently a halogen atom (a fluorine atom, a chlorine atom, a bromine atom, an iodine atom, particularly a bromine atom) or a functional group represented by Chemical Formula D. On the other hand, in Chemical Formula D, $R_A$ to $R_D$ may each independently be an alkyl group having 1 to 3 carbon atoms. In an embodiment, $R_A$ to $R_D$ may be a methyl group.

Chemical Formula D

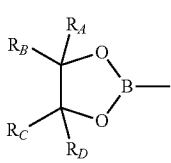

$Z_1$ and $Z_2$ of Chemical Formula 1' may be the same or different. Likewise, $Z_1'$ and $Z_2'$ in Chemical Formula 1-1' may be the same or different from each other. $Z_1''$ and $Z_2''$ of Chemical Formula 1-2' may be the same or different from each other. In an embodiment, $Z_1$ and $Z_2$ of above Chemical Formula 1' may be different. In an embodiment, $Z_1'$ and $Z_2'$ in Chemical Formula 1-1' may be the same; $Z_1''$ and $Z_2''$ in Chemical Formula 1-2' may be the same; and $Z_1'$ and $Z_2'$ of Chemical Formula 1-1' are different from $Z_1''$ and $Z_2''$ of Chemical Formula 1-2'.

Electroluminescence Device Material

As described above, the copolymer according to the present embodiment may be used as an electroluminescence device material. In other words, an electroluminescence device includes a pair of electrodes and one or more organic layers between the electrodes and including the copolymer or the electroluminescence device material of the present embodiment. Due to the copolymer, an electroluminescence device material having a high triplet energy level (current efficiency) and a low driving voltage is also provided.

In addition, the copolymer according to the present embodiment exhibits high solubility in a solvent and high heat resistance. Therefore, the copolymer may be easily made into a film (thin film) by the wet (coating) method. Accordingly, in another embodiment, an electroluminescence device material including the aforementioned copolymer is provided.

In addition, the use of the copolymer as electroluminescence device material is provided.

Electroluminescence Device

As described above, the copolymer according to the present embodiment may be used for an electroluminescence device. In other words, an electroluminescence device includes a pair of electrodes and one or more organic layers between the electrodes and including the copolymer or the electroluminescence device material of the present embodiment. Such an electroluminescence device may exhibit improved luminous efficiency (especially excellent luminous efficiency with a low driving voltage). Moreover, such an electroluminescence device may exhibit high luminous efficiency (especially excellent luminous efficiency with a low drive voltage).

Accordingly, according to an embodiment, an electroluminescence device includes a first electrode and a second electrode, and one or more organic layers between the first electrode and the second electrode, wherein at least one layer of the organic layer includes the aforementioned copolymer. The purpose (or effect) of the present disclosure may also be achieved by the electroluminescence device according to the present embodiment. In an embodiment, the electroluminescence device further includes a light emitting layer between the electrodes and including a light emitting material capable of emitting light from triplet excitons. On the other hand, the electroluminescence device of the present embodiment may be an example of the electroluminescence device according to the present disclosure.

In addition, the present embodiment provides a method of manufacturing an electroluminescence device that includes a pair of electrodes and at least one organic layer disposed between the electrodes and including the copolymer according to the present embodiment. At least one of the layers is formed by a coating method. In addition, by this method, the present embodiment provides an electroluminescence device in which at least one layer of the organic layer is formed by a coating method.

The aforementioned copolymer, and electroluminescence device material (EL device material) according to the present embodiment (hereinafter collectively, also referred to as "copolymer/EL device material") have improved solubility in an organic solvent. For this reason, the copolymer/EL device material according to the present embodiment may be used for manufacturing devices (especially thin films) by a coating method (wet process). For this reason, the present embodiment provides a liquid composition including the copolymer and a solvent or a dispersive medium. Such a liquid composition is an example of the liquid composition according to the present disclosure.

In addition, as described above, the electroluminescence device material according to the embodiment may be used for the manufacture of devices (particularly thin films) by a coating method (wet process). In view of the above, the present embodiment provides a thin film including the aforementioned copolymer. Such a thin film is an example of the thin film according to the present disclosure.

Further, the copolymer/EL device material according to the present embodiment has improved hole injection properties and hole mobility. For this reason, it may be also desirably used in the formation of any one organic layer of a hole injection material, a hole transport material, or a light emitting material (host). Among them, from the viewpoint of hole transportability, it may be used as a hole injection material or a hole transport material, and particularly a hole transport material.

Hereinafter, referring to FIG. 1, an electroluminescence device according to the present embodiment is described in detail. FIG. 1 is a schematic representation showing an electroluminescence device according to the present embodiment. In addition, in this specification, an "electroluminescence device" may be abbreviated as "EL device."

As shown in FIG. 1, the EL device 100 according to the present embodiment includes a substrate 110, a first electrode 120 on the substrate 110, a hole injection layer 130 on the first electrode 120, a hole transport layer 140 on the hole injection layer 130, a light emitting layer 150 on hole transport layer 140, an electron transport layer 160 on the light emitting layer 150, an electron injection layer 170 on the electron transport layer 160, and a second electrode 180 on the electron injection layer 170.

Herein, the copolymer/EL device material according to the present embodiment is included in, for example, any one organic layer (organic film) disposed between the first electrode 120 and the second electrode 180. Specifically, the copolymer/EL device material may be included in the hole injection layer 130 as a hole injection material, in the hole transport layer 140 as a hole transport material, or in the light emitting layer 150 as a light emitting material (host). The copolymer/EL device material may be included in the hole injection layer 130 as a hole injection material or in the hole transport layer 140 as a hole transport material. The copolymer/EL device material may be included in the hole transport layer 140 as a hole transport material. That is, in an embodiment, the organic layer including the copolymer/EL device material may be a hole transport layer, a hole injection layer, or a light emitting layer. In an embodiment, the organic layer including the copolymer/EL device material may be a hole transport layer or a hole injection layer. In an embodiment, the organic layer including the copolymer/EL device material may be a hole transport layer.

In addition, the organic layer including the copolymer according to the present embodiment/EL device material may be formed by a coating method (solution coating method). Specifically, the organic layer may be formed by a solution coating method such as a spin coating method, a casting method, a micro gravure coating method, a gravure coating method, a bar coating method, a roll coating method, a wire bar coating method, a dip coating method, a spray coating method, a screen-printing method, a flexographic printing method, an offset printing method, an inkjet printing method, and the like.

As the solvent used in the solution coating method, any solvent may be used as long as it is capable of dissolving the copolymer/EL device material, and the solvent may be appropriately selected according to types of the copolymer. For example, the solvent may be toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, phenyl acetate, phenyl propionate, methyl benzoate, ethyl benzoate, cyclohexane, and the like. An amount of the solvent used is not particularly limited, but considering the ease of coating, a concentration of the copolymer may desirably be greater than or equal to about 0.1 wt % and less than or equal to about 10 wt %, or greater than or equal to about 0.5 wt % and less than or equal to about 5 wt %.

In addition, the film-formation method of layers other than the organic layer including the copolymer/EL device material/is not specifically limited. The layers other than the organic layer including the copolymer/EL device material according to the present embodiment may be formed by, for example, a vacuum deposition method or may be formed by a solution coating method.

The substrate 110 may be a substrate used in a general EL device. For example, the substrate 110 may be a semiconductor substrate such as a glass substrate, a silicon substrate, and the like, or a transparent plastic substrate.

On the substrate 110, the first electrode 120 is formed. The first electrode 120 is specifically an anode, and is formed by a material having a large work function among a metal, an alloy, or a conductive compound. For example, the first electrode 120 may be formed as a transmissive electrode by indium tin oxide ($In_2O_3$—$SnO_2$: ITO), indium zinc oxide ($In_2O_3$—ZnO), tin oxide ($SnO_2$), zinc oxide (ZnO) or the like due to improved transparency and conductivity. The first electrode 120 may be formed as a reflective electrode by laminating magnesium (Mg), aluminum (Al), or the like on the transparent conductive layer. After forming the first electrode 120 on the substrate 110, washing and UV-ozone treatment may be performed as necessary.

On the first electrode 120, the hole injection layer 130 is formed. The hole injection layer 130 is a layer that facilitates injection of holes from the first electrode 120, and may be formed to have a thickness (dry film thickness; the same below) of specifically greater than or equal to about 10 nm and less than or equal to about 1000 nm, or greater than or equal to about 20 nm and less than or equal to about 50 nm.

The hole injection layer 130 may be formed of a known hole injection material. The known hole injection material of the hole injection layer 130 may include, for example, triphenylamine-containing poly(ether ketone) (TPAPEK), 4-isopropyl-4'-methyldiphenyl iodonium tetrakis(pentafluorophenyl) borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(diphenylamino)triphenylamine (TDATA), 4,4',4"-tris(N,N-2-naphthylphenylamino)triphenylamine (2-TNATA), polyaniline/dodecylbenzenesulphonic acid, poly(3,4-ethylenedioxythiophene)/poly(4-styrenesulfonate) (PEDOT/PSS), and polyaniline/10-camphorsulfonic acid, and the like.

On the hole injection layer 130, the hole transport layer 140 is formed. The hole transport layer 140 is a layer having a function of transporting holes, and may be formed with a thickness of, for example, greater than or equal to about 10 nm and less than or equal to about 150 nm, and more specifically greater than or equal to about 20 nm and less than or equal to about 50 nm. The hole transport layer 140 may be formed by a solution coating method using the copolymer according to the present embodiment. According to this method, the durability (luminescence life-span) of EL device 100 may be extended. In addition, the performance (luminous efficiency) of the EL device 100 may be improved. In addition, since the hole transport layer may be formed by the solution coating method, a large area may be formed efficiently.

However, when one organic layer of the EL device 100 includes the copolymer according to the present embodiment, the hole transport layer 140 may be formed of a known hole transport material. The known hole transport material may include, for example, 1,1-bis[(di-4-tolylamino) phenyl] cyclohexane (TAPC), a carbazole derivative such as N-phenylcarbazole, polyvinylcarbazole, and the like, N,N'-bis(3-methylphenyl)-N,N'-diphenyl-[1,1-biphenyl]-4,4'-diamine (TPD), 4,4',4"-tris(N-carbazolyl) triphenylamine (TCTA), and N,N'-di(1-naphthyl)-N,N'-diphenylbenzidine (NPB).

On the hole transport layer 140, the light emitting layer 150 is formed. The light emitting layer 150 is a layer that emits light by fluorescence, phosphorescence, and the like, and is formed using a vacuum deposition method, a spin coating method, an inkjet printing method, or the like. The light emitting layer 150 may be formed with a thickness of, for example, about 10 nm to about 60 nm, and more specifically about 20 nm to about 50 nm. As the light emitting material of the light emitting layer 150 may include a known light emitting material. However, the light emitting material included in the light emitting layer 150 is desirably a light emitting material capable of emitting light (i.e., phosphorescence emission) from triplet excitons. In such a case, the driving life-span of the EL device 100 may be further improved.

The light emitting layer 150 is not particularly limited and may have a known configuration. Desirably, the light emitting layer may include a semiconductor nanoparticle or an organometallic complex. That is, in an embodiment of the present disclosure, the organic layer has a light emitting layer including semiconductor nanoparticles or organometallic complexes. When the light emitting layer includes semiconductor nanoparticles, the EL device may be a quantum dot electroluminescence device (QLED) or a quantum dot light emitting diode. In addition, when the light emitting layer includes an organometallic complex, the EL device is an organic electroluminescence device (OLED).

In the form in which the light emitting layer includes semiconductor nanoparticles (QLED), the light emitting layer may include a plurality of semiconductor nanoparticles (quantum dots) arranged in a single layer or a plurality of layers. Herein, the semiconductor nanoparticles (quantum dots) may be particles of predetermined sizes that have a quantum confinement effect. The diameter of the semiconductor nanoparticles (quantum dots) is not particularly limited but is greater than or equal to about 1 nm and less than or equal to about 10 nm.

The semiconductor nanoparticles (quantum dots) arranged in the light emitting layer may be synthesized by a wet chemical process, an organometal chemical deposition process, a molecular beam epitaxy process, or another similar process. Among them, the wet chemical process is a method of growing a particle by putting a precursor material in an organic solvent.

In the wet chemistry process, when crystals grow, the organic solvent naturally coordinates to the surface of the quantum dot crystals and acts as a dispersing agent, thereby controlling the growth of the crystals. For this reason, in the wet chemical process, compared with gas phase deposition methods, such as metal organic chemical vapor deposition (MOCVD) and molecular beam epitaxy (MBE), growth of semiconductor nanoparticles may be easily controlled at a low cost.

The semiconductor nanoparticles (quantum dots) may adjust energy bandgaps by adjusting their sizes, so that light of various wavelengths may be obtained from the light emitting layer (quantum dot light emitting layer). Thus, a plurality of differently sized quantum dots may embody a display that discharges (or emits) light of multiple wavelengths. The sizes of the quantum dots may be selected to emit red, green, and blue light to form a color display. In addition, the sizes of the quantum dots may be combined so that various color lights emit white light.

The semiconductor nanoparticles (quantum dots) may be semiconductor material such as a Group II-VI semiconductor compound; a Group III-V semiconductor compound; a Group IV-VI semiconductor compound; a Group IV element or compound; or a combination thereof.

The Group II-VI semiconductor compound is not particularly limited, but includes, for example, a binary compound such as CdSe, CdTe, ZnS, ZnSe, ZnTe, ZnO, HgS, HgSe, HgTe, or a mixture thereof; a ternary compound such as CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, or a quaternary compound such as CdZnSeS, CdZnSeTe, CdZnSTe, CdHgSeS, CdHgSeTe, CdHgSTe, HgZnSeS, HgZnSeTe, HgZnSTe, or a mixture thereof.

The Group III-V semiconductor compound is not particularly limited, but includes, for example, a binary compound such as GaN, GaP, GaAs, GaSb, AlN, AlP, AlAs, AlSb, InN, InP, InAs, InSb, or a mixture thereof; a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; or a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof.

The Group IV-VI semiconductor compound is not particularly limited, but includes, for example, a binary compound such as SnS, SnSe, SnTe, PbS, PbSe, PbTe, or a mixture thereof; a ternary compound such as SnSeS, SnSeTe, SnSTe, PbSeS, PbSeTe, PbSTe, SnPbS, SnPbSe, SnPbTe, or a mixture thereof; or a quaternary compound such as SnPbSSe, SnPbSeTe, SnPbSTe, or a mixture thereof.

The Group IV element or compound is not particularly limited, but includes, for example, a single element compound such as Si, Ge, or a mixture thereof; and a binary compound such as SiC, SiGe, or a mixture thereof.

The semiconductor nanoparticles (quantum dots) may have a homogeneous single structure or a double structure of a core-shell. The core-shell may include different materials. The material constituting each core and shell may be made of different semiconductor compounds. However, an energy bandgap of the shell material is larger than an energy bandgap of the core material. Specifically, structures such as ZnTeSe/ZnSe/ZnS, CdSe/ZnS, InP/ZnS, and the like are desirable.

For example, a process of producing a quantum dot having a core (CdSe)-shell (ZnS) structure is described. First, crystals are formed by injecting core (CdSe) precursor materials of $(CH_3)_2Cd$ (dimethyl cadmium), TOPSe (trioctylphosphine selenide) and the like into an organic solvent using TOPO (trioctylphosphine oxide) as a surfactant. At this time, after maintaining a certain time at high temperature so that the crystals grow to a certain size, the precursor materials of the shell (ZnS) are injected, to form a shell on the surface of the core already generated. As a result, a quantum dot of CdSe/ZnS capped with TOPO may be produced.

In addition, in the embodiment (OLED) in which the light emitting layer includes an organometallic complex, the light emitting layer 150 may include, for example 6,9-diphenyl-9'-(5'-phenyl-[1,1': 3',1"-terphenyl]-3-yl)3,3'-bi[9H-carbazole], 3,9-diphenyl-5-(3-(4-phenyl-6-(5'-phenyl-[1,1': 3',1"-terphenyl]-3-yl)-1,3,5,-triazin-2-yl)phenyl)-9H-carbazole, 9,9'-diphenyl-3,3'-bi[9H-carbazole], tris(8-quinolinato)aluminum $(Alq_3)$, 4,4'-bis(carbazol-9-yl)biphenyl (CBP), poly (n-vinyl carbazole) (PVK), 9,10-di(naphthalene)anthracene (ADN), 4,4',4"-tris(N-carbazolyl)triphenylamine (TCTA), 1,3,5-tris(N-phenyl-benzimidazol-2-yl)benzene (TPBI), 3-tert-butyl-9,10-di(naphth-2-yl)anthracene (TBADN), distyrylarylene (DSA), 4,4'-bis(9-carbazole)-2,2'-dimethylbipheny (dmCBP), and the like, as a host material.

In addition, the light emitting layer 150 may include, for example, perylene and a derivative thereof, rubrene and a derivative thereof, coumarin and a derivative thereof, 4-dicyanomethylene-2-(pdimethylaminostyryl)-6-methyl-4H-pyran (DCM) and a derivative thereof, an iridium (Ir) complex such as bis[2-(4,6-difluorophenyl)pyridinate]picolinate iridium(III) (Flrpic)), bis(1-phenylisoquinoline) (acetylacetonate)iridium(III) $(Ir(piq)_2(acac))$, tris(2-phenylpyridine)iridium (III) $(Ir(ppy)_3)$, tris(2-(3-p-xylyl)phenyl)pyridine iridium (III), an osmium (Os) complex, a platinum complex, and the like, as a dopant material. Among these, it is desirable that the light emitting material is a light emitting organometallic complex compound.

A method for forming the light emitting layer is not particularly limited. It may be formed by coating (solution coating method) coating composition including a semiconductor nanoparticle or an organometallic complex. At this time, it is desirable to select a solvent which does not dissolve the materials (hole transport material, particularly the copolymer or polymeric composition) in the hole transport layer as the solvent constituting the coating composition.

On the light emitting layer 150, an electron transport layer 160 is formed. The electron transport layer 160 is a layer having a function of transporting electrons, and is formed using a vacuum deposition method, a spin coating method, an inkjet method, or the like. For example, the electron transport layer 160 may be formed to have a thickness of greater than or equal to about 15 nm and less than or equal to about 50 nm.

The electron transport layer 160 may be formed of a known electron transport material. The known electron transport material may include, for example, (8-quinolinato) lithium (lithium quinolate, Liq), tris(8-quinolinato) aluminum (Alq3) and a compound having a nitrogen-containing aromatic ring. Examples of the compound having the nitrogen-containing aromatic ring may include, for example, a compound including a pyridine ring such as 1,3,5-tri[(3-pyridyl)-phen-3-yl]benzene), a compound including a triazine ring such as 2,4,6-tris(3'-(pyridin-3-yl)biphenyl-3-yl)-1,3,5-triazine), a compound including an imidazole ring such as 2-(4-(N-phenylbenzoimidazolyl-1-yl-phenyl)-9,10-di-naphthylanthracene or 1,3,5-tris(N-phenyl-benzimidazol-2-yl)benzene (TPBI). The electron transport material may be used alone or as a mixture of two or more thereof.

On the electron transport layer 160, an electron injection layer 170 is formed. The electron injection layer 170 is a layer having a function of facilitating injection of electrons from the second electrode 180. The electron injection layer 170 is formed using a vacuum deposition method or the like. The electron injection layer 170 may be formed to have a thickness of greater than or equal to about 0.1 nm and less than or equal to about 5 nm, and more specifically, greater than or equal to about 0.3 nm and less than or equal to about 2 nm. As a material for forming the electron injection layer 170, any known material may be used. For example, the electron injection layer 170 may be formed of a lithium compound such as (8-quinolinato) lithium (lithium quinolate, Liq) and lithium fluoride (LiF), sodium chloride (NaCl), cesium fluoride (CsF), lithium oxide ($Li_2O$), or barium oxide (BaO).

On the electron injection layer 170, a second electrode 180 is formed. The second electrode 180 is formed using a vacuum deposition method or the like. Specifically, the second electrode 180 is a cathode, and is formed by a material having a small work function such as metals, alloys, or conductive compounds. For example, the second electrode 180 is may be formed as a reflective electrode with a metal such as lithium (Li), magnesium (Mg), aluminum (Al), calcium (Ca), or aluminum-lithium (Al—Li), magnesium-indium (Mg—In), magnesium-silver (Mg—Ag), or the like. The second electrode 180 may be formed to have a thickness of greater than or equal to about 10 nm and less than or equal to about 200 nm, and more and specifically, greater than or equal to about 50 nm and less than or equal to about 150 nm. Alternatively, the second electrode 180 may be formed as a transmissive electrode by a thin film of less than or equal to about 20 nm of a metal material or a transparent conductive layer such as indium tin oxide ($In_2O_3$—$SnO_2$), and indium zinc oxide ($In_2O_3$—ZnO).

The EL device 100 has been described above as an example of the electroluminescence device. The EL device 100 according to the present embodiment further improves durability (luminescence life-span) by including an organic layer (particularly a hole transport layer or a hole injection layer) including the copolymer. In addition, the luminous efficiency (current efficiency) may be further improved and the driving voltage may be reduced.

The stacked structure of the EL device 100 according to the present embodiment is not limited to the above embodiments. The EL device 100 according to the present embodiment may have another known stacked structure. For example, in the EL device 100, one or more layers of the hole injection layer 130, the hole transport layer 140, the electron transport layer 160 and the electron injection layer 170 may be omitted or another layer may be further included. In addition, each layer of the EL device 100 may be formed in a single layer or in a plurality of layers.

For example, the EL device 100 may further include a hole blocking layer between the hole transport layer 140 and the light emitting layer 150 in order to prevent excitons or holes from diffusing into the electron transport layer 160. The hole blocking layer may be formed by, for example, an oxadiazole derivative, a triazole derivative, or a phenanthroline derivative.

In addition, the copolymer according to the present embodiment may be applied to electroluminescence devices other than the QLED or OLED. Other electroluminescence devices including the copolymer according to the present embodiment may include, but are not particularly limited to, for example, organic inorganic perovskite light emitting devices.

EXAMPLES

The embodiments are described in more detail using the following examples and comparative examples. However, the technical range of the present disclosure is not limited to the following examples. In the following examples, unless specifically described, each operation is performed at room temperature (25° C.). In addition, unless specifically stated, "%" and "a part" mean "wt %" and "a part by weight," respectively.

Synthesis of Monomer M-1

Monomer M-1 is synthesized according to Reaction Scheme M-1.

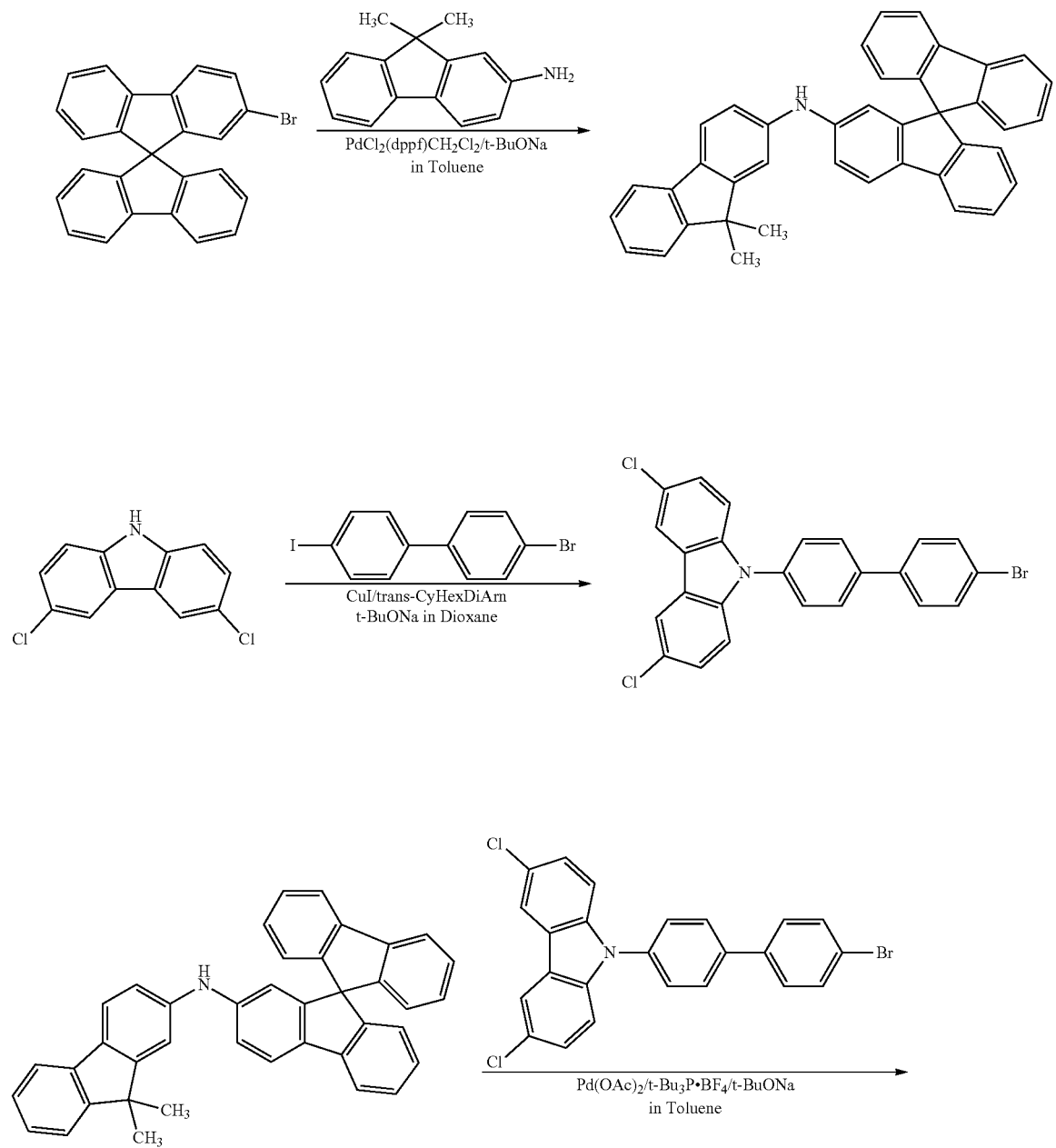

-continued

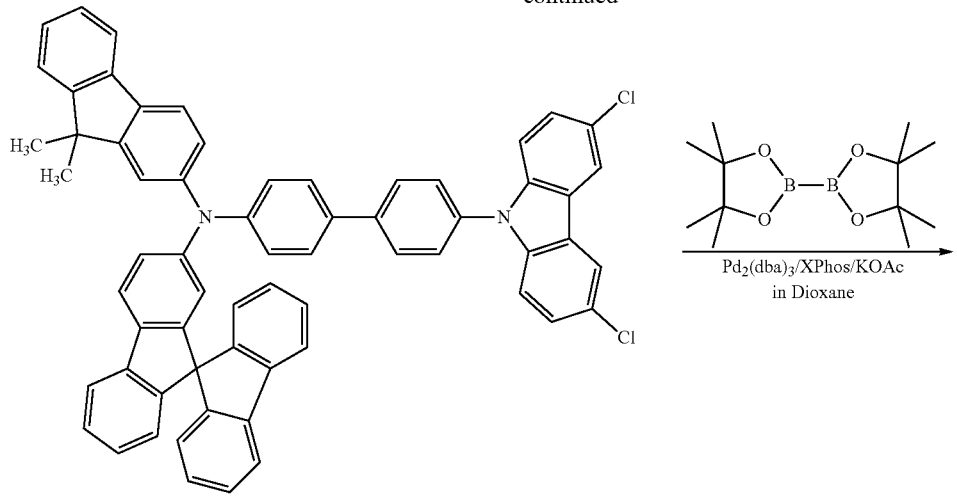

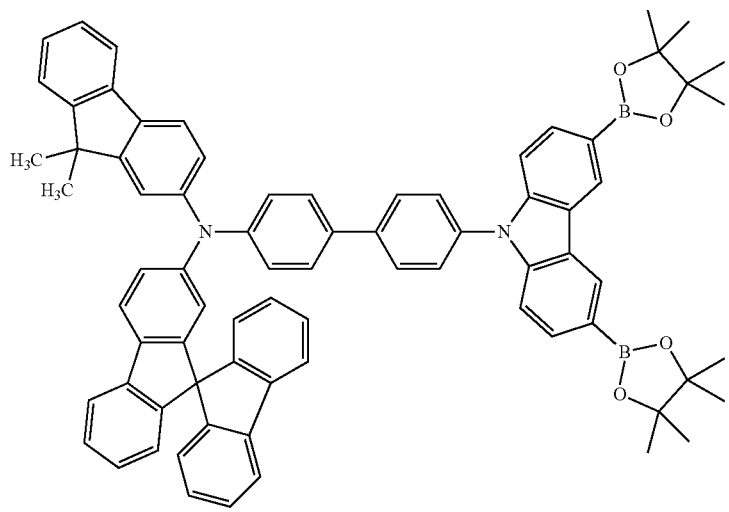

M-1

2-bromo-9,9'-spirobi[9H-fluorene] (15.6 g), 2-amino-9,9-dimethyl fluorene (30.0 g), a 1,1'-bis(diphenylphosphino)ferrocene] palladium (II) dichloride dichloromethane adduct (3.09 g), sodium t-butoxide (14.6 g), and toluene (190 mL) are added to a 500 mL four-necked flask, and stirred under a nitrogen atmosphere at 100° C. for 4 hours. The resulting reaction mixture is allowed to cool to room temperature (about 25° C.), and an insoluble matter is filtered off by using Celite®). The solvent is removed under a reduced pressure, and the residue is purified by column chromatography, obtaining N-(9,9'-dimethyl-9H-fluoren-2-yl)-9,9'-spirobi[fluorene]-2-amine (33.4 g, Yield: 84.0%).

3,6-dichloro carbazole (100.0 g), 4-bromo-4'-iodine biphenyl (167 g), copper iodide (4.03 g), sodium t-butoxide (81.4 g), trans-1,2-cyclohexanediamine (9.67 g), and 1,4-dioxane (1060 mL) are added to a 2 L four-necked flask, and heated and stirred under a nitrogen atmosphere at 100° C. for 4 hours.

The reaction mixture is allowed to cool to room temperature, and an insoluble matter is filtered off by using Celite®. The solvent is removed under a reduced pressure, and the residue is dissolved in toluene (800 mL). The obtained solution is washed with 1 L of water, 2N—HCl (500 mL×2), and water (500 mL×2), and dried with $MgSO_4$. The washed solution is filtered with Celite® silica gel. The toluene is removed under a reduced pressure, and the residue is recrystallized with a mixed solvent of toluene/ethanol and dried, thereby obtaining 9-(4'bromo-[1,1'-biphenyl]-4-yl) 3,6-dichloro-9H-carbazole (81.5 g, Yield: 74.8%).

N-(9,9'-dimethyl-9H-fluoren-2-yl)-9,9'-spirobi[fluorene]-2-amine (8.00 g), 9-(4'bromo-[1,1'-biphenyl]-4-yl) 3,6-dichloro-9H-carbazole (7.13 g), palladium acetate $(Pd(OAc)_2)$ (0.171 g), tri-tert-butylphosphonium tetrafluoroborate $(t-Bu_3P.BF_4,$ 0.332 g), sodium t-butoxide (2.93 g), and toluene (150 mL) are added to a 500 mL four-necked flask, and stirred under a nitrogen atmosphere at 100° C. for 3 hours.

The resulting insoluble matter is filtered off with Celite®, and then activated carbon (3 g). Zeolite (3 g) is added to the filtrate, and stirred at 110° C. for 30 minutes. The resulting solids are filtered off with Celite®, and the filtrate is passed through silica gel.

The solvent is removed under a reduced pressure, and the residue is purified by column chromatography (silica gel, hexane/toluene), recrystallized with a mixed solvent of toluene and acetonitrile, and dried, thereby obtaining N-(4'-(3,6-dichloro-9H-carbazol-9-yl)-[1,1'-biphenyl]-4-yl)-N-(9,9'-dimethyl-9H-fluoren-2-yl)-9,9'-spirobi[fluorene]-2-amine (6.57 g, Yield: 76.0%).

N-(4'-(3,6-dichloro-9H-carbazol-9-yl)-[1,1'-biphenyl]-4-yl)-N-(9,9'-dimethyl-9H-fluoren-2-yl)-9,9'-spirobi[fluorene]-2-amine (6.56 g), bis(pinacolato)diboron (bis(pinacolato)diboron) (6.79 g), potassium acetate (6.25 g), tris(dibenzylideneacetone) dipalladium ($Pd_2(dba)_3$) (0.48 g), 2-dicyclohexylphosphino-2',4',6'-triisopropylbiphenyl (XPhos) (0.754 g), and 1,4-dioxane (160 mL) are added to a 200 mL four-necked flask, and refluxed under a nitrogen atmosphere for 4 hours. The reaction solution is allowed to cool to room temperature, and the resulting solid is filtered off with Celite®. The solvent is removed under a reduced pressure, the residue is dissolved in toluene (100 mL), and activated carbon (2 g) and zeolite (2 g) are added, and then stirred at 130° C. for 30 minutes. The solids are filtered off with Celite®, and the filtrate is passed through silica gel. The solvent is removed under a reduced pressure, the residue is recrystallized with a mixed solvent of toluene and hexane, and dried, thereby obtaining Monomer M-1 (6.84 g, Yield: 59.3%).

Synthesis of Copolymer P-1

Under a nitrogen atmosphere, Monomer M-1 (1.15 g), 2,7-dibromo-9,9-dioctyl fluorene (0.581 g), palladium acetate (2.40 mg), tris(2-methoxy phenyl)phosphine (19.3 mg), toluene (35 mL), and a 20 wt % tetraethylammonium hydroxide aqueous solution (5.46 g) are added to a four-necked flask and stirred at 85° C. for 6 hours. Then, phenyl boronic acid (128 mg), bis(triphenylphosphine) palladium (II) dichloride (44.6 mg), and a 20 wt % tetraethylammonium hydroxide aqueous solution (5.46 g) are added to the reaction mixture and stirred at 85° C. for 6 hours. Subsequently, sodium N,N-diethyldithiocarbamate trihydrate (3.58 g) dissolved in ion exchanged water (35 mL) is added to the mixture, and, stirred at 85° C. for 2 hours.

After separating an organic layer from an aqueous layer, the organic layer is washed with water, a 3 wt % acetic acid aqueous solution, and again water. The organic layer is subject to column chromatography charged with silica gel/alumina. The solvent from the collected fractions is removed under a reduced pressure. The resulting liquid is added dropwise to methanol to form a precipitate. The collected precipitate is dissolved in toluene, and again added dropwise to methanol to precipitate a solid. This precipitated solid is filtered and dried, obtaining Copolymer P-1 (0.89 g). The obtained copolymer is measured with respect to a weight average molecular weight and polydispersity by SEC, Mw=15,700, and Mw/Mn=1.60.

Copolymer P-1 is assumed to have Structural Unit P-1 from an input ratio of the monomers.

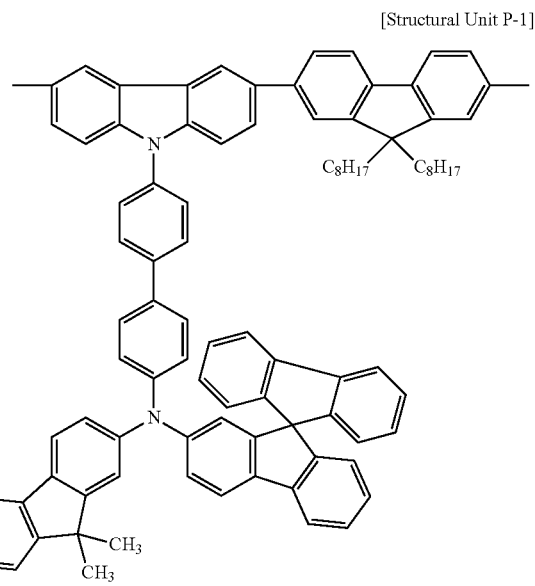

[Structural Unit P-1]

Production of Quantum Dot Electroluminescence Device D-1

As for a first electrode (an anode), a glass substrate adhered with indium tin oxide (ITO) and a film thickness of 150 nanometers (nm) is used. The ITO-adhered glass substrate is sequentially washed with a neutral detergent, deionized water, and isopropyl alcohol and then, treated with UV-ozone. Subsequently, on this ITO-adhered glass substrate, poly(3,4-ethylenedioxyth iophene)/poly(4-styrenesulfonate) (PEDOT/PSS) (Sigma-Aldrich Co., Ltd.) is spin-coated and dried to have a dry film thickness of 30 nm. As a result, a hole injection layer having a thickness (dry film thickness) of 30 nm is formed on the ITO-adhered glass substrate.

On the hole injection layer, a 1.0 weight percent (wt %) toluene solution of Copolymer P-1 (hole transport material) is applied by spin coating and then heat treated at 230° C. for 60 minutes to form a transport layer with a dry film thickness of 30 nm. As a result, a hole transport layer having a thickness (dry film thickness) of 30 nm is formed on the hole injection layer.

Figure 2:
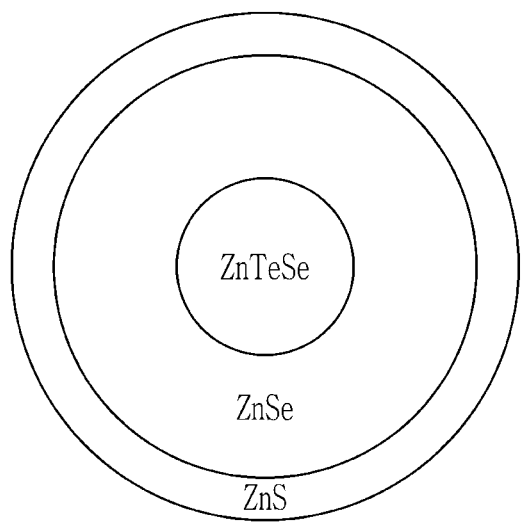
FIG. 2 is a cross-sectional view showing the structure of a quantum dot used in examples.

Subsequently, quantum dot dispersion is prepared by dispersing blue quantum dots of ZnTeSe/ZnSe/ZnS (core/shell/shell; an average diameter=about 10 nm) having a structure shown in FIG. 2 in cyclohexane at 1.0 wt %. This quantum dot dispersion is spin-coated to have a dry film thickness of 30 nm on the hole transport layer (HTL) and dried. As a result, a quantum dot light emitting layer with a thickness (dry film thickness) of 30 nm is formed on the hole transport layer (HTL).

When the quantum dot dispersion is irradiated by ultraviolet (UV), light emitting therefrom has a central wavelength of 462 nm and a full width at half maximum of 30 nm. On this quantum dot light emitting layer, lithium quinolate (Liq) and 1,3,5-tris(N-phenylbenzimidazol-2-yl)benzene (TPBI) (Sigma-Aldrich Co., Ltd.) as an electron transport material are co-deposited by using a vacuum deposition apparatus. As a result, a 36 nm-thick electron transport layer is formed on the quantum dot light emitting layer.

Using a vacuum deposition apparatus, (8-quinolato) lithium (lithium quinolate, Liq) is deposited on the electron transport layer. As a result, a 0.5 nm-thick electron injection layer is formed on the electron transport layer. Using a vacuum deposition apparatus, aluminum (Al) is deposited on the electron injection layer. As a result, a 100 nm-thick second electrode (cathode) is formed on the electron injection layer.

Accordingly, a quantum dot electroluminescence device D-1 is obtained.

Example 2

Synthesis of Monomer M-2

Monomer M-2 is synthesized according to Reaction Scheme M-2.

[Reaction Scheme M-2]

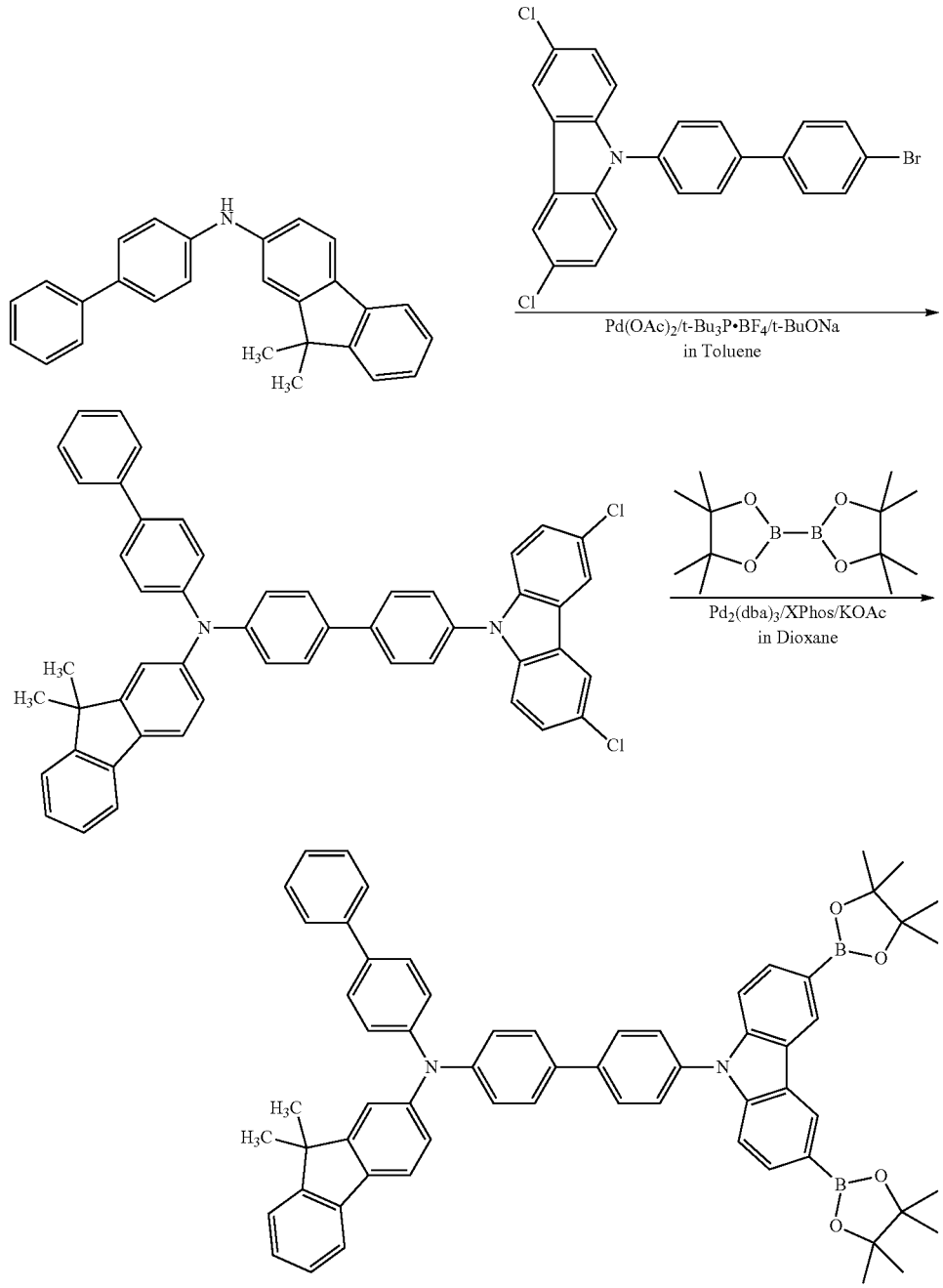

M-2

2-(4-biphenyl)amino-9,9-dimethyl fluorene (10.0 g), 9-(4'bromo-[1,1'-biphenyl]-4-yl) 3,6-dichloro-9H-carbazole (12.9 g), palladium acetate (Pd(OAc)$_2$) (0.311 g), tri-tert-butylphosphonium tetrafluoroborate (t-Bu$_3$P.BF$_4$) (0.602 g), sodium t-butoxide (5.31 g), and toluene (280 mL) are added to a 500 mL four-necked flask, and stirred under a nitrogen atmosphere at 100° C. for 5 hours.

An insoluble matter is filtered off with Celite®, and then activated carbon (3 g) and zeolite (3 g) are added to the filtrate, and stirred at 110° C. for 30 minutes. A resulting solid is filtered off with Celite®, and then passed through silica gel. The solvent is removed under a reduced pressure, and the residue is purified by column chromatography (silica gel, hexane/toluene), obtaining N-([1,1'-biphenyl]-4-yl)-N-(4'-(3,6-dichloro-9H-carbazol-9-yl)-[1,1'-biphenyl]-4-yl)-9,9'-dimethyl-9H-fluorene-2-amine (18.5 g, Yield: 89.4%).

The N-([1,1'-biphenyl]-4-yl)-N-(4'-(3,6-dichloro-9H-carbazol-9-yl)-[1,1'-biphenyl]-4-yl)-9,9'-dimethyl-9H-fluorene-2-amine (10.0 g), bis(pinacolato)diboron (8.52 g), potassium acetate (7.92 g), tris(dibenzylideneacetone) dipalladium (Pd$_2$(dba)$_3$) (0.695 g), 2-dicyclohexylphosphino-2',4',6'-triisopropylbiphenyl (XPhos) (0.950 g), and 1,4-dioxane (110 mL) are added to a 200 mL four-necked flask and refluxed under a nitrogen atmosphere for 4 hours.

The reaction solution is allowed to cool to room temperature, and a formed solid is filtered off with Celite®. The solvent is removed under a reduced pressure, the residue is dissolved in toluene (100 mL), and then activated carbon (3 g) and zeolite (3 g) are added. The mixture is stirred at 130° C. for 30 minutes.

A solid is filtered off with Celite®, and the filtrate is passed through silica gel. The toluene is removed under a reduced pressure, and the residue is recrystallized with a mixed solvent of toluene and hexane and dried, thereby obtaining Monomer M-2 (6.09 g, Yield: 48.9%).

Synthesis of Copolymer P-2

Under a nitrogen atmosphere, Monomer M-2 (1.57 g), 2,7-dibromo-9,9-dioctyl fluorene (0.927 g), palladium acetate (3.8 mg), tris(2-methoxy phenyl)phosphine (30.9 mg), toluene (54 mL), and a 20 wt % tetraethylammonium hydroxide aqueous solution (8.71 g) are added to a four-necked flask, and stirred at 85° C. for 6 hours. Then, phenyl boronic acid (204 mg), bis(triphenylphosphine) palladium (II) dichloride (71.1 mg), and a 20 wt % tetraethylammonium hydroxide aqueous solution (8.71 g) are added to the reaction flask, and the reaction mixture stirred at 85° C. for 6 hours. Subsequently, sodium N,N-diethyldithiocarbamate trihydrate (5.71 g) dissolved in ion exchanged water (54 mL) is added, and the mixture is stirred at 85° C. for 2 hours.

After separating an organic layer from the mixture, the organic layer is washed with water, a 3 wt % acetic acid aqueous solution, and again water. The washed organic layer is subject to column chromatography charged with silica gel/alumina, and the solvent from the collected fractions is removed under a reduced pressure.

The obtained liquid is added dropwise to methanol to precipitate a solid. The solid is dissolved in toluene and again added dropwise to methanol to provide a precipitated solid that is filtered and dried, thereby obtaining Copolymer P-2 (0.63 g). The obtained copolymer is measured with respect to a weight average molecular weight and polydispersity by SEC, Mw=52,300, and Mw/Mn=2.76.

Copolymer P-2 is assumed to have Structural Unit P-2 from an input ratio of the monomers.

[Structural Unit P-2]

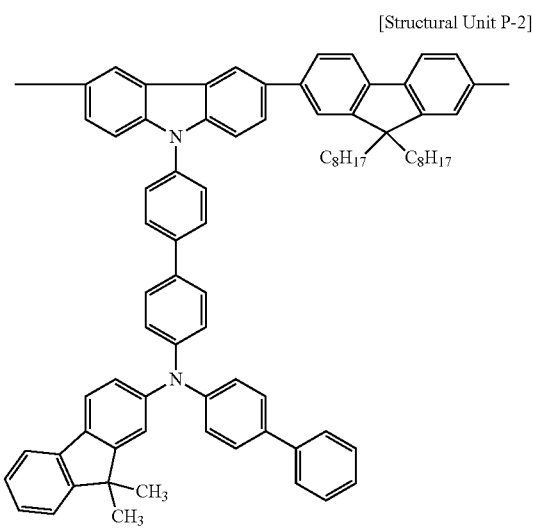

Production of Quantum Dot Electroluminescence Device D-2

Quantum dot electroluminescence device D-2 is manufactured according to the method as Example 1 except that Copolymer P-2 is used instead of Copolymer P-1.

Example 3

Synthesis of Monomer M-3

Monomer M-3 is synthesized according to Reaction Scheme M-3.

[Reaction Scheme M-3]

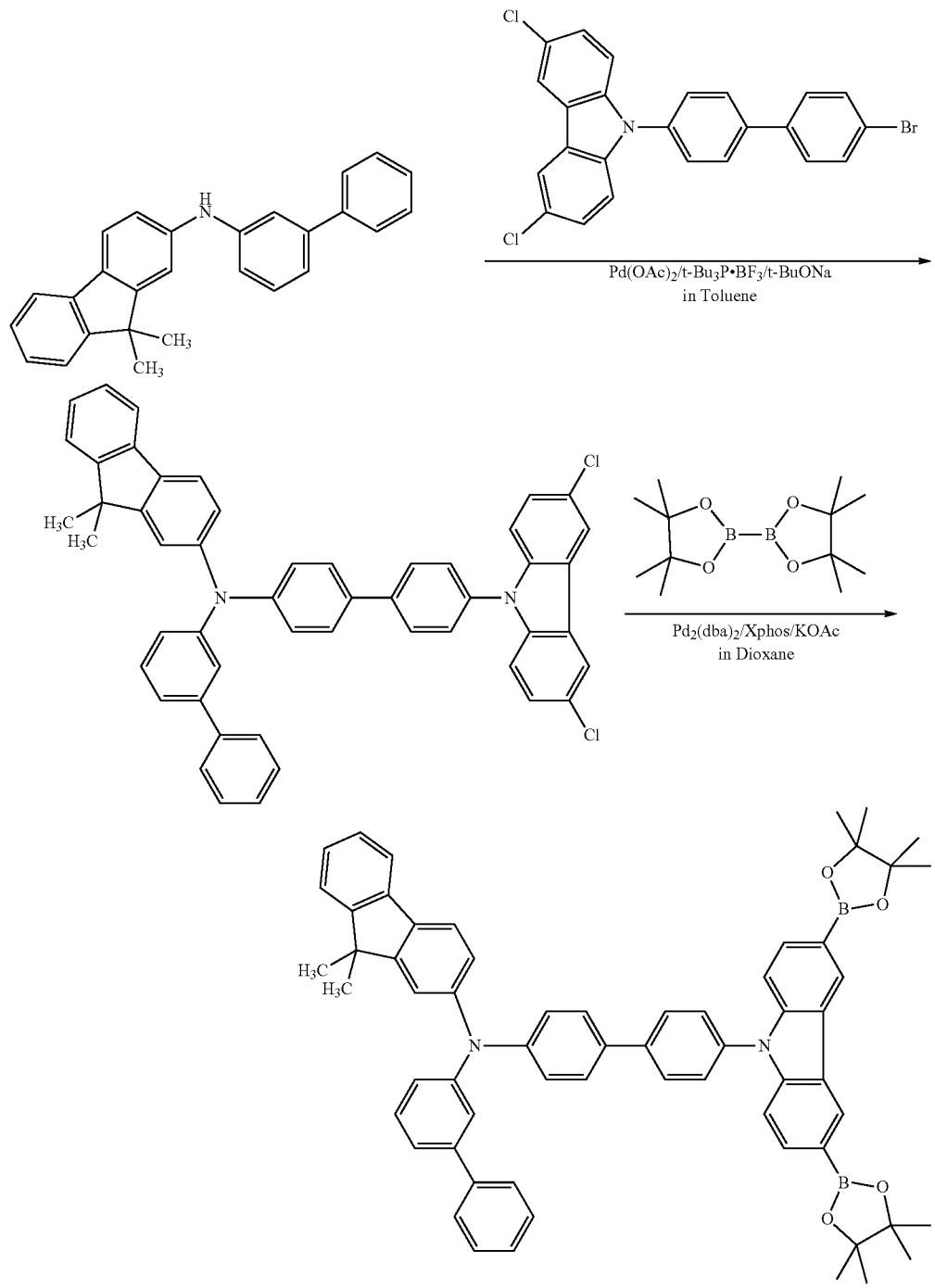

M-3

2-(3-biphenylyl)amino-9,9-dimethyl fluorene (5.00 g), 9-(4'bromo-[1,1'-biphenyl]-4-yl) 3,6-dichloro-9H-carbazole (12.9 g), palladium acetate (Pd(OAc)$_2$) (0.156 g), tri-tert-butylphosphonium tetrafluoroborate (t-Bu$_3$P.BF$_4$) (0.150 g), sodium t-butoxide (2.65 g), and toluene (140 mL) are added a 500 mL four-necked flask, and stirred under a nitrogen atmosphere at 100° C. for 5 hours.

An insoluble matter is filtered off with Celite®, and then activated carbon (5.0 g) and zeolite (5.0 g) are added to the filtrate, and the mixture is stirred at 110° C. for 30 minutes. After filtering off a resulting solid with Celite®, the filtrate is passed through silica gel. The solvent is removed under a reduced pressure, and the residue is purified by column chromatography (silica gel, hexane/toluene), obtaining N-([1,1'-biphenyl]-4-yl)-N-(4'-(3,6-dichloro-9H-carbazol-9-yl)-[1,1'-biphenyl]-4-yl)-9,9'-dimethyl-9H-fluorene-2-amine (9.18 g, Yield: 88.8%).

N-([1,1'-biphenyl]-4-yl)-N-(4'-(3,6-dichloro-9H-carbazol-9-yl)-[1,1'-biphenyl]-4-yl)-9,9'-dimethyl-9H-fluorene-2-amine (9.00 g), bis(pinacolato)diboron (7.64 g), potassium acetate (7.08 g), tris(dibenzylideneacetone) dipalladium (Pd$_2$(dba)$_3$) (0.551 g), 2-dicyclohexylphosphino-2',4',6'-triisopropylbiphenyl (XPhos) (0.860 g), and 1,4-dioxane (100 mL) are added to a 200 mL four-necked flask, and refluxed under a nitrogen atmosphere for 4 hours.

The reaction solution is allowed to cool to room temperature, and a solid is filtered off with Celite®. The solvent is removed under a reduced pressure, the residue is dissolved in toluene (100 mL), and activated carbon (3 g) and zeolite (3 g) are added. The mixture is stirred at 130° C. for 30 minutes.

After filtering off a solid with Celite®, the filtrate is passed through silica gel. The toluene is removed under a reduced pressure, and the residue is recrystallized with a mixed solvent of toluene and hexane and dried, thereby obtaining Monomer M-3 (6.94 g, Yield: 62.0%).

Synthesis of Copolymer P-3

Under a nitrogen atmosphere, Monomer M-3 (1.39 g), 2,7-dibromo-9,9-dioctyl fluorene (0.824 g), palladium acetate (3.4 mg), tris(2-methoxy phenyl)phosphine (31.7 mg), toluene (44 mL), and a 20 wt % tetraethylammonium hydroxide aqueous solution (7.74 g) are added to a four-necked flask, and stirred at 85° C. for 6 hours. Subsequently, phenyl boronic acid (181 mg), bis(triphenylphosphine) palladium (II) dichloride (63.2 mg), and a 20 wt % tetraethylammonium hydroxide aqueous solution (7.74 g) are added to the reaction flask, and the reaction mixture is stirred at 85° C. for 6 hours. Then, sodium N,N-diethyldithiocarbamate trihydrate (5.07 g) dissolved in ion exchanged water (44 mL) is added to the reaction flask, and the mixture is stirred at 85° C. for 2 hours.

After separating an organic layer from an aqueous layer, the organic layer is washed with water, a 3 wt % acetic acid aqueous solution, and again water. The organic layer is subject to column chromatography charged with silica gel/alumina, and the solvent is removed from the collected fractions under a reduced pressure. The obtained liquid is added dropwise to methanol to form a precipitate. The precipitate is dissolved in toluene added dropwise to methanol to again form a precipitate. The precipitated solid is filtered and dried, obtaining Copolymer P-3 (0.83 g). The copolymer is measured with respect to a weight average molecular weight and polydispersity by SEC, Mw=33,300, and Mw/Mn=2.19.

Copolymer P-3 is assumed to have Structural Unit P-3 from an input ratio of the monomers.

[Structural Unit P-3]

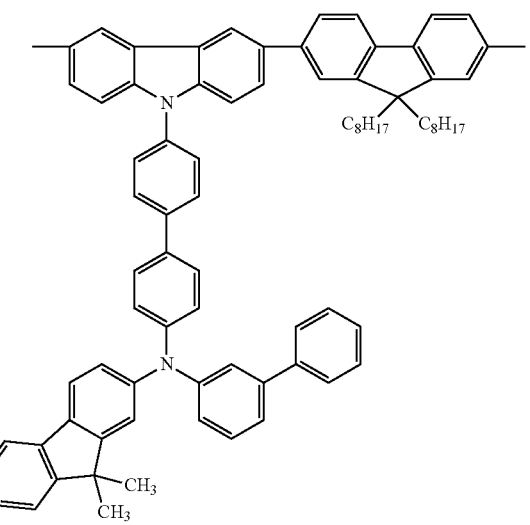

Production of Quantum Dot Electroluminescence Device D-3

Quantum dot electroluminescence device D-3 is manufactured according to the same method as Example 1 except that Copolymer P-3 is used instead of Copolymer P-1.

Example 4

Synthesis of Monomer M-4

Monomer M-4 is synthesized according to Reaction Scheme M-4.

[Reaction Scheme M-4]

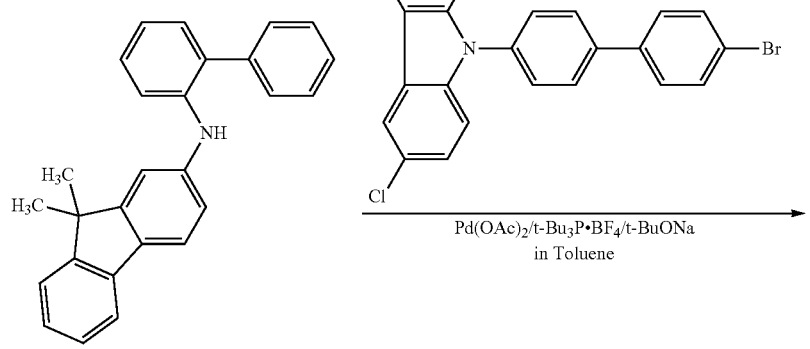

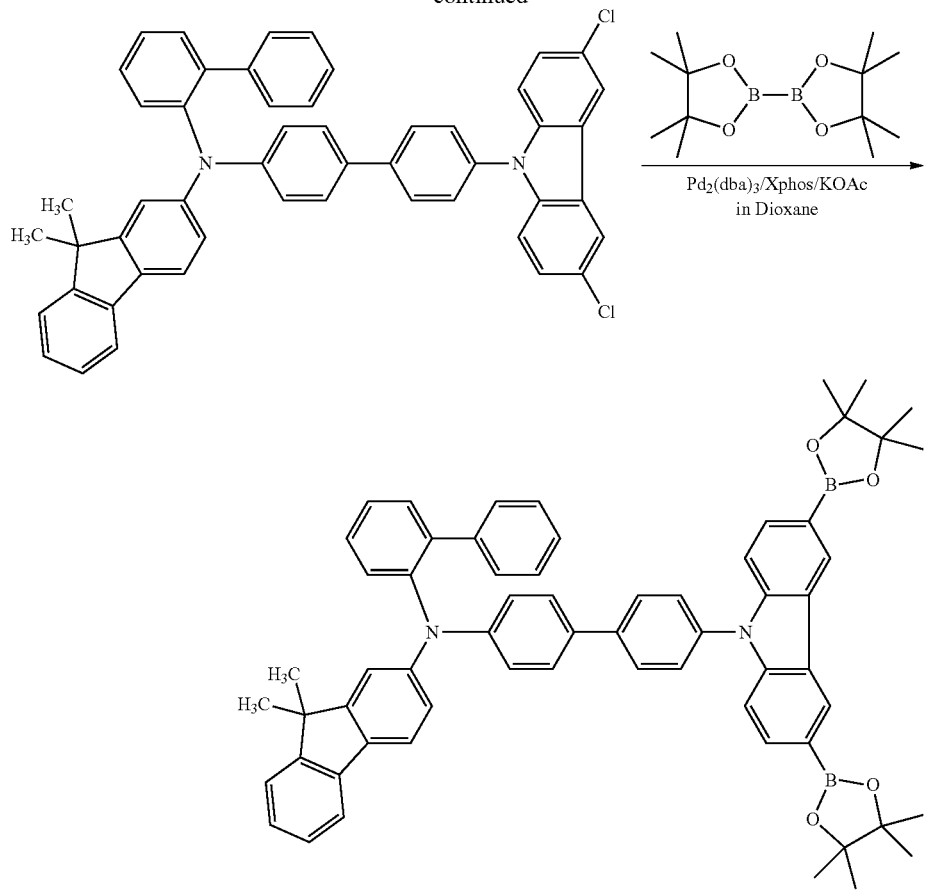

M-4

2-(2-biphenylyl)amino-9,9-dimethyl fluorene (12.0 g), 9-(4'bromo-[1,1'-biphenyl]-4-yl) 3,6-dichloro-9H-carbazole (15.5 g), palladium acetate (Pd(OAc)$_2$, 0.372 g), tri-tert-butylphosphonium tetrafluoroborate (t-Bu$_3$P.BF$_4$, 0.722 g), sodium t-butoxide (6.38 g), and toluene (330 mL) are added to a 500 mL four-necked flask, and stirred under a nitrogen atmosphere at 100° C. for 1 hour. An insoluble matter is filtered off with Celite®, and activated carbon (6.0 g) and zeolite (6.0 g) are added to the filtrate, and mixture is stirred at 110° C. for 30 minutes. After filtering a solid off with Celite®, the filtrate is passed through silica gel. The toluene is removed under a reduced pressure, and the residue is purified by column chromatography (silica gel, hexane/toluene), obtaining N-([1,1'-biphenyl]-2-yl)-N-(4'-(3,6-dichloro-9H-carbazol-9-yl)-[1,1'-biphenyl]-4-yl)-9,9'-dimethyl-9H-fluorene-2-amine (18.2 g, Yield: 73.4%).

N-([1,1'-biphenyl]-2-yl)-N-(4'-(3,6-dichloro-9H-carbazol-9-yl)-[1,1'-biphenyl]-4-yl)-9,9'-dimethyl-9H-fluorene-2-amine (9.00 g), bis(pinacolato)diboron (7.64 g), potassium acetate (7.08 g), tris(dibenzylideneacetone) dipalladium (Pd$_2$(dba)$_3$) (0.551 g), 2-dicyclohexylphosphino-2',4',6'-triisopropylbiphenyl (XPhos) (0.860 g), and 1,4-dioxane (100 mL) are added to 200 mL four-necked flask, and refluxed under a nitrogen atmosphere for 4 hours. The reaction solution is allowed to cool to room temperature, and \ a solid is filtered off with Celite®. The solvent is removed under a reduced pressure, and the residue is dissolved in toluene (100 mL). Activated carbon (3 g) and zeolite (3 g) are added to the toluene solution and the mixture is stirred at 130° C. for 30 minutes. A solid is filtered off with Celite®, and the filtrate is passed through silica gel. The toluene is removed under a reduced pressure, and the residue is recrystallized with a mixed solvent of toluene and hexane and dried, thereby obtaining Monomer M-4 (7.88 g, Yield: 63.5%).

Synthesis of Copolymer P-4

Under an argon atmosphere, Monomer M-4 (1.57 g), 2,7-dibromo-9,9-di-n-octyl fluorene (0.927 g), palladium acetate (3.8 mg), tris(2-methoxy phenyl)phosphine (30.9 mg), toluene (50 mL), and a 20 wt % tetraethylammonium hydroxide aqueous solution (8.71 g) are added to a four-necked flask, and stirred at 85° C. for 6 hours.

Subsequently, phenyl boronic acid (204 mg), dichlorobis(triphenylphosphine) palladium (71.1 mg), and a 20 wt % tetraethylammonium hydroxide aqueous solution (8.71 g) are added to the reaction flask, and the reaction mixture is stirred for 6 hours. Then, sodium N,N-diethyldithiocarbamate trihydrate (5.71 g) dissolved in ion exchanged water (50 mL) is added to the mixture, and stirred at 85° C. for 2 hours.

After separating an organic layer from an aqueous layer, the organic layer is washed with water, a 3 wt % acetic acid aqueous solution, and again water. The organic layer is subject to column chromatography charged with silica gel/alumina, and the solvent is removed under a reduced pressure. The obtained liquid is added dropwise to methanol to form a precipitate. The precipitate is dissolved in toluene and added dropwise to methanol for precipitation. The precipitated solid is filtered and dried, obtaining Copolymer P-4 (0.76 g). The copolymer is measured with respect to a weight average molecular weight and polydispersity by SEC, Mw=72,700, and Mw/Mn=3.45.

Copolymer P-4 is assumed to have Structural Unit P-4 from an input ratio of the monomers.

[Structural Unit P-4]

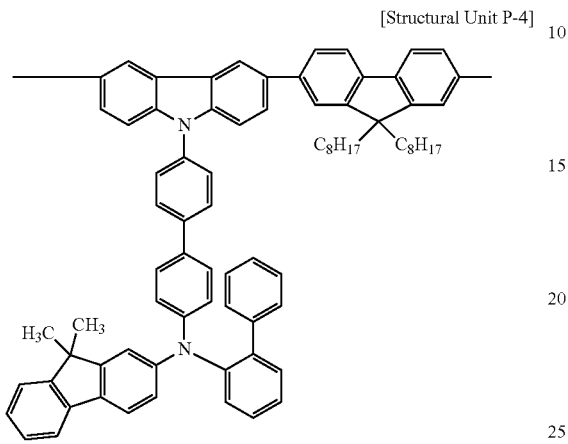

Production of Quantum Dot Electroluminescence Device D-4

Quantum dot electroluminescence device D-4 is manufactured according to the same method as Example 1 except that Copolymer P-4 is used instead of Copolymer P-1.

Example 5

Synthesis of Copolymer P-5

Under an argon atmosphere, Monomer M-4 (1.42 g), 2,7-dibromo-9,9-didodecylfluorene (1.01 g), palladium acetate (3.4 mg), tris(2-methoxy phenyl)phosphine (27.9 mg), toluene (50 mL), and a 20 wt % tetraethylammonium hydroxide aqueous solution (7.88 g) are added to a four-necked flask, and stirred at 85° C. for 6 hours. Subsequently, phenyl boronic acid (185 mg), dichlorobis(triphenylphosphine)palladium (64.4 mg), and a 20 wt % tetraethylammonium hydroxide aqueous solution (7.88 g) are added to the reaction flask, and the mixture is stirred at 85° C. for another 6 hours. Then, sodium N,N-diethyldithiocarbamate trihydrate (5.17 g) dissolved in ion exchanged water (50 mL) is added to the reaction flask and the mixture is stirred at 85° C. for 2 hours.

After separating an organic layer from an aqueous layer, the organic layer is washed with water, a 3 wt % acetic acid aqueous solution, and again water. The organic layer is subjected to column chromatography charged with silica gel/alumina, and the solvent is removed under a reduced pressure. The obtained liquid is added dropwise to methanol to form a precipitate. The precipitate is dissolved in toluene, and again added dropwise to methanol for precipitation. The precipitated solid is filtered and dried, obtaining Copolymer P-5 (0.44 g). The copolymer is measured with respect to a weight average molecular weight and polydispersity by SEC, Mw=30,000 and Mw/Mn=2.29.

Copolymer P-5 is assumed to have Structural Unit P-5 from an input ration of the monomers.

[Structural Unit P-5]

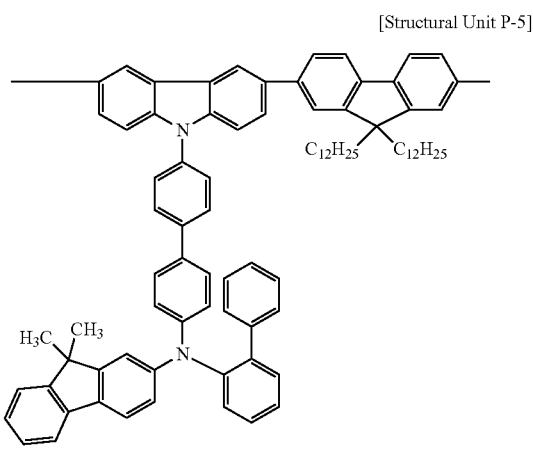

Production of Quantum Dot Electroluminescence Device D-5

Quantum dot electroluminescence device D-5 is manufactured according to the same method as Example 1 except that Copolymer P-5 is used instead of Copolymer P-1.

Example 6

Synthesis of Monomer M-5

Monomer M-5 is synthesized according to Reaction Scheme M-5.

[Reaction Scheme M-5]

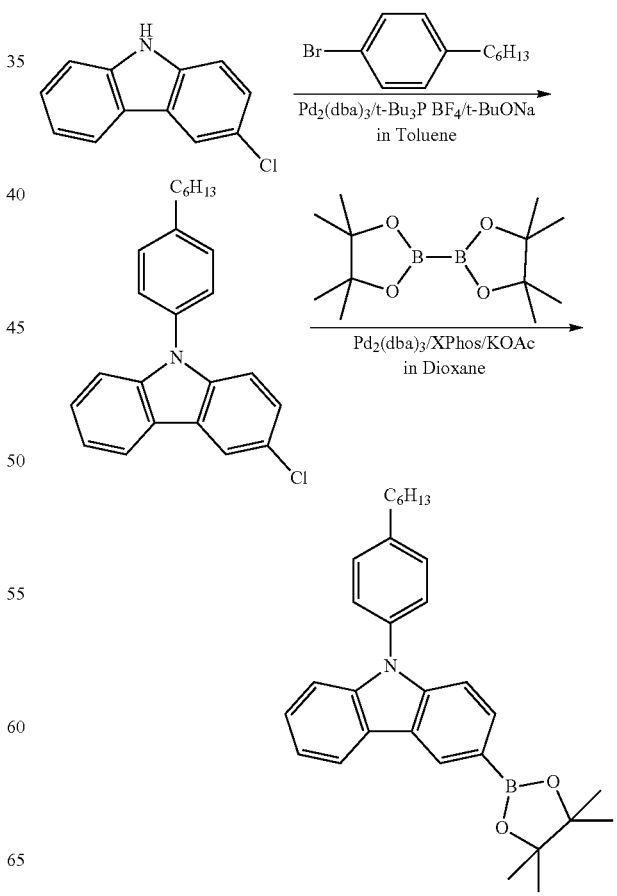

-continued

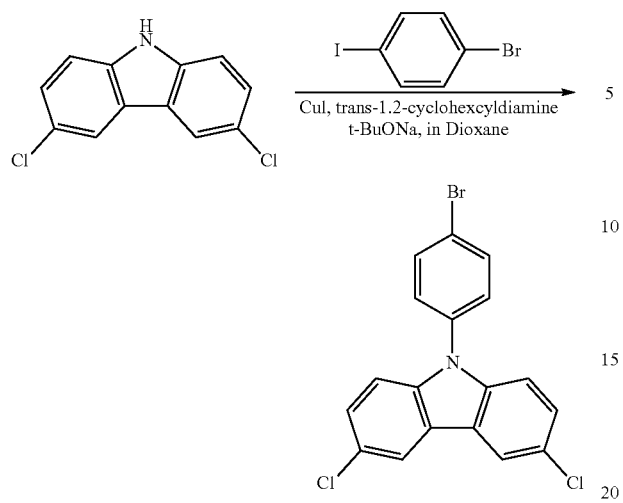

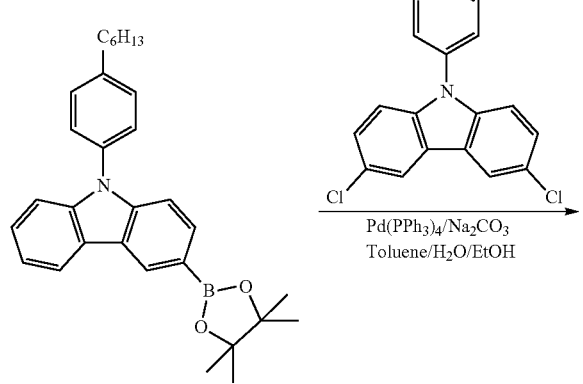

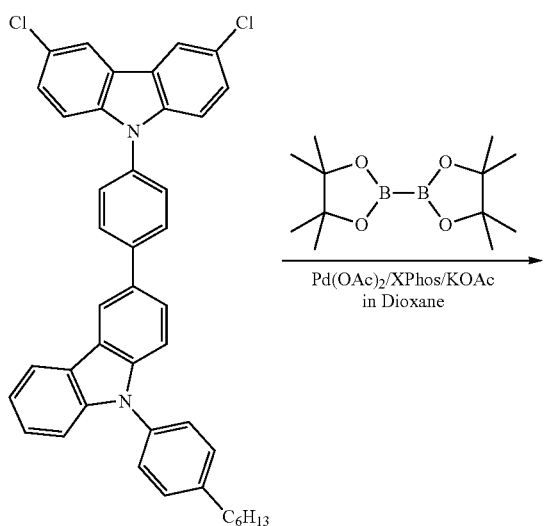

-continued

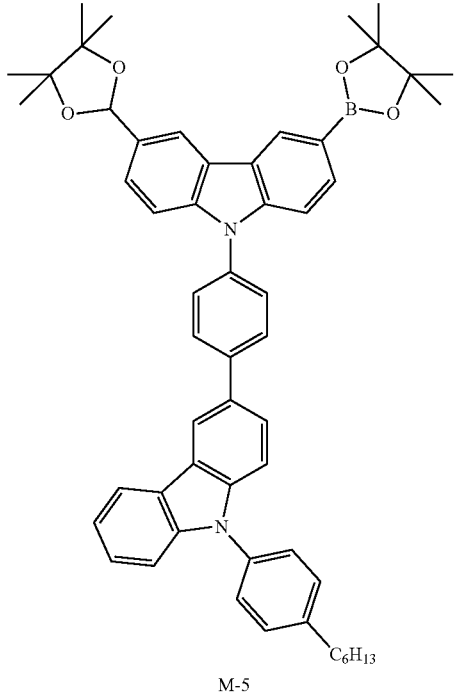

M-5

3-chloro-9H-carbazole (10.0 g), 4-hexylbromobenzene (13.2 g), sodium t-butoxide (t-BuONa) (7.15 g), tris(dibenzylideneacetone) dipalladium ($Pd_2(dba)_3$) (0.91 g), tri-tert-butylphosphonium tetrafluoroborate ($t-Bu_3P·BF_4$, 0.58 g), and toluene (169 mL) are added to a 500 mL four-necked flask, and refluxed under a nitrogen atmosphere at 100° C. for 10 hours. The reaction solution is allowed to cool to room temperature, and the toluene is removed under a reduced pressure. The residue is purified by column chromatography (silica gel, hexane/toluene), obtaining 3-chloro-9-(4-hexylphenyl)-9H-carbazole (15.2 g, Yield: 83%).

3-chloro-9-(4-hexylphenyl)-carbazole (15.0 g), bis(pinacolato)diboron (15.8 g), potassium acetate (5.97 g), tris (dibenzylideneacetone) dipalladium ($Pd_2(dba)_3$) (0.76 g), 2-dicyclohexylphosphino-2',4',6'-triisopropylbiphenyl (XPhos) (0.79 g), and 1,4-dioxane (145 mL) are added to a 500 mL four-necked flask, and refluxed under a nitrogen atmosphere for 8 hours. The reaction solution is allowed to cool to room temperature, and a solid is filtered off with Celite®. The solvent is removed under a reduced pressure, and the residue is dissolved in toluene (50 mL). Activated carbon (1.5 g) and zeolite (1.5 g) are added to the toluene solution, and the mixture stirred at 130° C. for 30 minutes.

A solid is filtered off with Celite®, and the filtrate is passed through silica gel. The toluene is removed under a reduced pressure, and the residue is recrystallized with a mixed solvent of toluene and acetonitrile and dried, thereby obtaining 9-(4-hexylphenyl)-3-(4,4,5,5-tetramethyl-1,3,2-dioxaborolan-2-yl)-9H-carbazole (13.1 g, Yield: 70%). 3,6-dichloro-9H-carbazole (50.0 g), p-bromoiodobenzene (72.4 g), copper iodide (2.02 g), sodium t-butoxide (30.5 g), trans-1,2-cyclohexanediamine (2.42 g), and 1,4-dioxane (423 mL) are added to a 1 L four-necked flask, and heated and stirred under a nitrogen atmosphere at 100° C. for 12 hours.

The resulting mixture is allowed to cool to room temperature, and an insoluble matter is filtered off with Celite®. The solvent is removed under a reduced pressure, and the residue is dissolved in toluene (400 mL). The solution is washed with water (500 mL), 2N—HCl (300 mL×2), and water (300 mL×2) and dried with $MgSO_4$. The toluene is removed under a reduced pressure, and the residue is recrystallized with a mixed solvent of tetrahydrofuran/ethanol and dried, thereby obtaining 9-(4-bromophenyl)-3,6-dichloro-9H-carbazole (56.6 g, Yield: 68.4%).

9-(4-hexylphenyl)-3-(4,4,5,5-tetramethyl-1,3,2-dioxaborolan-2-yl)-9H-carbazole) (10.0 g), 9-(4-bromophenyl)-3,6-dichloro-9H-carbazole (8.63 g), sodium carbonate (3.51 g), tetrakis(triphenylphosphine)palladium ($Pd(PPh)_3$) (1.27 g), toluene (45 mL), ethanol (55 mL), and distilled water (55 mL) are added to a 500 mL four-necked flask, and refluxed under a nitrogen atmosphere for 4 hours. The reaction solution is allowed to cool to room temperature, and a solid is filtered off with Celite®.

The filtrate is passed through silica gel, and the solvent is removed under a reduced pressure. The residue is recrystallized with a mixed solvent of toluene and methanol and dried, obtaining 3,6-dichloro-9-(4-(9-(4-hexylphenyl)-9H-carbazol-3-yl)phenyl)-9H-carbazole (11.9 g, Yield: 84.4%).

3,6-dichloro-9-(4-(9-(4-hexylphenyl)-9H-carbazol-3-yl) phenyl)-9H-carbazole (10.0 g), bis(pinacolato)diboron (15.9 g), potassium acetate (9.04 g), palladium acetate (0.352 g), 2-dicyclohexylphosphino-2',4',6'-triisopropylbiphenyl (XPhos) (0.748 g), and 1,4-dioxane (157 mL) are added to a 500 mL four-necked flask, and refluxed under a nitrogen atmosphere for 4 hours. The reaction solution is allowed to cool to room temperature, and a solid is filtered off with Celite®. The solvent is removed under a reduced pressure, and the residue is dissolved in toluene (200 mL). Activated carbon (3 g) and zeolite (3 g) are added to the toluene solution, and the mixture is stirred at 130° C. for 30 minutes.

A solid is filtered off with Celite®, and the filtrate is passed through silica gel. The toluene is removed under a reduced pressure, and the residue is recrystallized with a mixed solvent of toluene and acetonitrile and dried, obtaining Monomer M-5 (7.68 g, Yield: 59.5%).

Synthesis of Copolymer P-6

Under an argon atmosphere, monomer M-5 (1.72 g), 2,7-dibromo-9,9-dioctyl fluorene (1.152 g), palladium acetate (4.7 mg), tris(o-tolyl)phosphine (38.1 mg), toluene (57 mL), and a 20 wt % tetraethylammonium hydroxide aqueous solution (10.8 g) are added to a four-necked flask and then, stirred at 85° C. for 6 hours.

Subsequently, phenyl boronic acid (253 mg), dichlorobis(triphenylphosphine) palladium (88.0 mg), and a 20 wt % tetraethylammonium hydroxide aqueous solution (10.8 g) are added to the reaction flask, and stirred at 85° C. for 6 hours. Then, sodium N,N-diethyldithiocarbamate trihydrate (7.06 g) dissolved in ion exchanged water (60 mL) is added to the reaction mixture, and the mixture is stirred at 85° C. for 2 hours.

After separating an organic layer from an aqueous layer, the organic layer is washed with water, a 3 wt % hydrochloric acid aqueous solution, and again water. The organic layer is subject to column chromatography charged with silica gel/alumina, and the solvent is removed under a reduced pressure. The obtained liquid is added dropwise to methanol to form a precipitate. The precipitated solid is dissolved in toluene and added dropwise to methanol for precipitation. The precipitated solid is filtered and dried, obtaining Copolymer P-6 (1.01 g). The copolymer is measured with respect to a weight average molecular weight and polydispersity in SEC, Mw=16,500, and Mw/Mn=1.53.

Copolymer P-6 is assumed to have Structural Unit P-6 from an input ratio of the monomers.

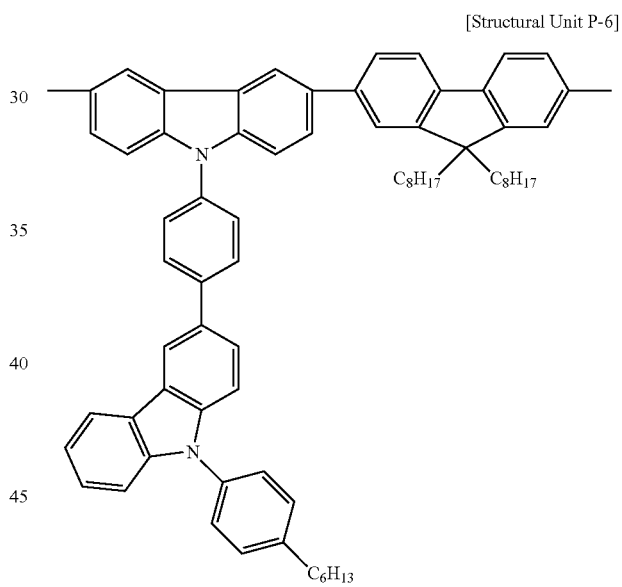

[Structural Unit P-6]

Production of Quantum Dot Electroluminescence Device D-6

Quantum dot electroluminescence device D-6 is manufactured according to the same method as Example 1 except that Copolymer P-6 is used instead of Copolymer P-1.

Example 7

Synthesis of Monomer M-6

Monomer M-6 is synthesized according to Reaction Scheme M-6.

[Reaction Scheme M-6]
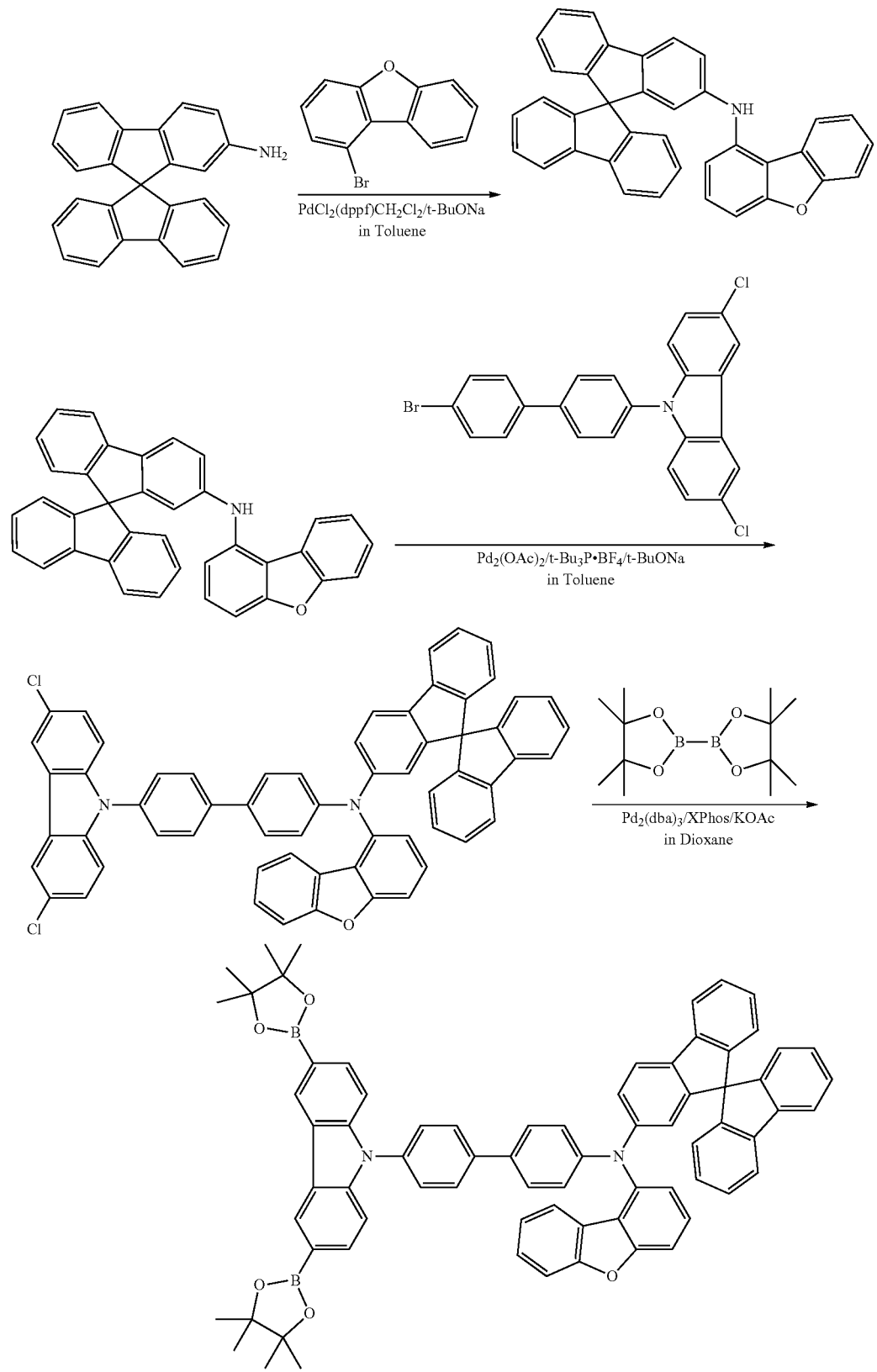
M-6

9,9'-spirobi[9H-fluorene]-2-amine (14.0 g), 1-bromobenzofuran (10.4 g), sodium t-butoxide (t-BuONa) (11.4 g), a [1,1'-bis(diphenyl phosphino)ferrocene] palladium (II) dichloride dichloromethane adduct (PdCl$_2$(dppf) CH$_2$Cl$_2$) (1.71 g), and toluene (105 mL) are added to a 300 mL four-necked flask and refluxed under a nitrogen atmosphere at 100° C. for 2 hours. The reaction solution is allowed to cool to room temperature, and toluene is removed under a reduced pressure. The obtained solid is dispersed in methanol (400 mL), stirred for 1 hour, and then, filtered. The obtained solid is washed with water (300 mL) and methanol (300 mL), recrystallized with a mixed solvent toluene and hexane, and dried, obtaining N-(9,9'-spirobi[fluorene]-2-yl) dibenzo[d,b]furan-1-amine (6.69 g, Yield: 31.8%).

N-(9,9'-spirobi[fluorene]-2-yl) dibenzo[d,b]furan-1-amine (6.00 g), 9-(4'bromo-[1,1'-biphenyl]-4-yl)3,6-dichloro-9H-carbazole (5.63 g), palladium acetate (Pd(OAc)$_2$) (0.135 g), tri-tert-butylphosphonium tetrafluoroborate (t-Bu$_3$P.BF$_4$, 0.262 g), sodium t-butoxide (2.31 g), and toluene (120 mL) are added to a 300 mL four-necked flask, and stirred under a nitrogen atmosphere at 100° C. for 3 hours.

An insoluble matter is filtered off with Celite®, and activated carbon (3.0 g) and zeolite (3.0 g) are added to the filtrate, and stirred at 110° C. for 30 minutes. A solid is filtered off with Celite®, and the filtrate is passed through silica gel. The solvent is removed under a reduced pressure, and the residue is purified by column chromatography (silica gel, hexane/toluene), thereby obtaining N-(9,9'-spirobi[fluorene]-2-yl)-N-(4'-(3,6-dichloro-9H-yl)-[1,1'-biphenyl]-4-yl) dibenzo[d, b]furan-1-amine) (7.40 g, Yield: 69.4%).

The N-(9,9'-spirobi[fluorene]-2-yl)-N-(4'-(3,6-dichloro-9H-yl)-[1,1'-biphenyl]-4-yl)dibenzo[d,b]furan-1-amine) (5.00 g), bis(pinacolato)diboron (4.31 g), potassium acetate (3.33 g), tris(dibenzylideneacetone) dipalladium (Pd$_2$(dba)$_3$) (0.259 g), 2-dicyclohexylphosphino-2',4',6'-triisopropylbiphenyl (XPhos) (0.404 g), and 1,4-dioxane (45 mL) are added to a 200 mL four-necked flask, and refluxed under a nitrogen atmosphere for 4 hours.

The reaction solution is allowed to cool to room temperature, and a solid is filtered off with Celite®. The solvent is removed under a reduced pressure, and the residue is dissolved in toluene (100 mL). Activated carbon (3 g) and zeolite (3 g) are added to the toluene solution, and the mixture is stirred at 130° C. for 30 minutes. A solid is filtered off with Celite®, and the filtrate is passed through silica gel. The toluene is removed under a reduced pressure, the residue is recrystallized with a mixed solvent of toluene and acetonitrile and dried, obtaining Monomer M-6 (3.05 g, Yield: 50.5%).

Synthesis of Copolymer P-7

Under an argon atmosphere, Monomer M-6 (1.42 g), 2,7-dibromo-9,9-dioctyl fluorene (0.822 g), palladium acetate (3.4 mg), tris(2-methoxy phenyl)phosphine (27.7 mg), toluene (55 mL), and a 20 wt % tetraethylammonium hydroxide aqueous solution (7.81 g) are added to a four-necked flask and stirred at 85° C. for 6 hours. Subsequently, phenyl boronic acid (183 mg), dichlorobis(triphenylphosphine)palladium (63.1 mg), and a 20 wt % tetraethylammonium hydroxide aqueous solution (7.81 g) are added to the reaction flask and stirred for 6 hours. Then, sodium N,N-diethyldithiocarbamate trihydrate (5.17 g) dissolved in ion exchanged water (50 mL) is added to the reaction mixture, and stirred at 85° C. for 2 hours.

After separating an organic layer from an aqueous layer, the organic layer is washed with water, a 3 wt % acetic acid aqueous solution, and again water. The organic layer is subject to column chromatography filled with silica gel/alumina, and the solvent of the collected fractions is removed under a reduced pressure. The obtained liquid is added dropwise to methanol to form a precipitate. The precipitate is dissolved in toluene and added dropwise to methanol for precipitation, and the precipitated solid is filtered and dried, thereby obtaining Copolymer P-7 (0.81 g). The copolymer is measured with respect to a weight average molecular weight and polydispersity in SEC, Mw=69,900, and Mw/Mn=2.12.

Copolymer P-7 is assumed to have Structural Unit P-7 from an input ratio of the monomers.

Structural Unit P-7

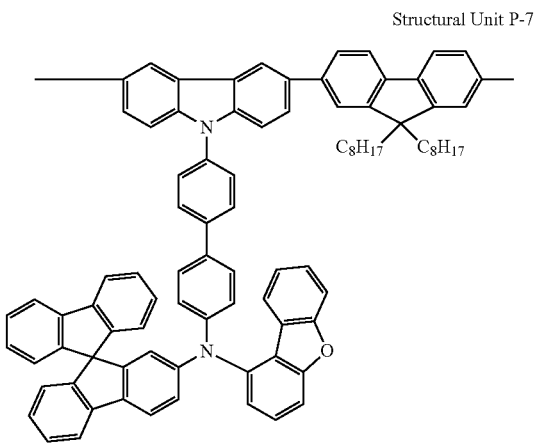

Production of Quantum Dot Electroluminescence Device D-7

Quantum dot electroluminescence device D-7 is manufactured according to the same method as Example 1 except that Copolymer P-7 is used instead of Copolymer P-1.

Comparative Example 1

Production of Quantum Dot Electroluminescence Device D-8

Quantum dot electroluminescence device D-8 is manufactured according to the same method as Example 1 except that poly[(9,9-dioctyl fluorenyl-2,7-diyl)-co-(4,4'-(N-(4-sec-butyl phenyl)diphenyl amine)] having the following structural unit (TFB) (available from Luminescence Technology Corp.) is used instead of Copolymer P-1.

The weight average molecular weight (Mw) and polydispersity (Mw/Mn) of TFB are measured by SEC. The weight average molecular weight (Mw) and the polydispersity (Mw/Mn) of TFB are 359,000 and 3.40, respectively.

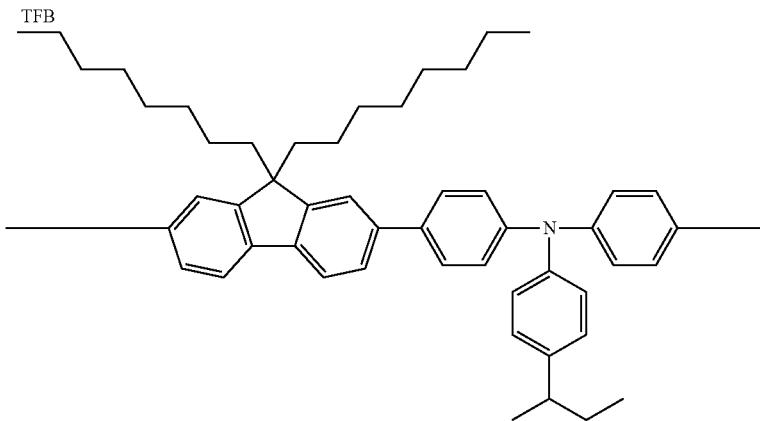

TFB

Comparative Example 2

Synthesis of Monomer M-7

Monomer M-7 is synthesized according to Reaction Scheme M-7.

[Reaction Scheme M-7]

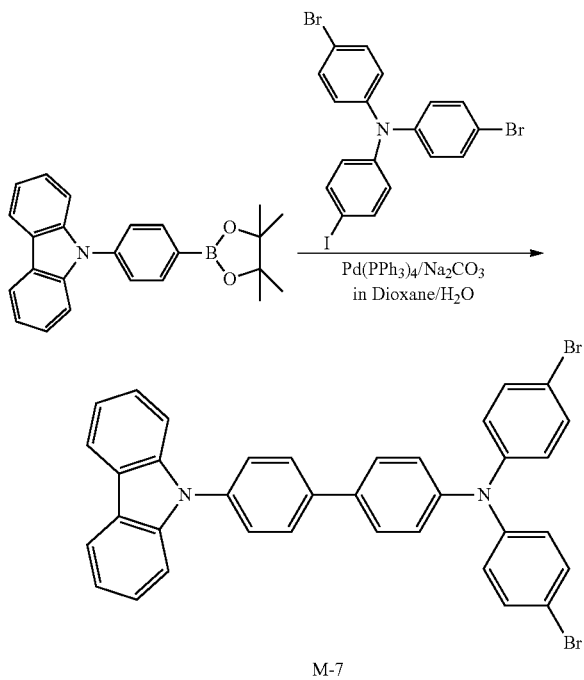

M-7

9-[4-(4,4,5,5-tetramethyl-1,3,2-dioxaborolan-2-yl)phenyl]-9H-carbazole (5.34 g), 4,4'-dibromo-4"-iodine triphenylamine (7.50 g), sodium carbonate (2.69 g), tetrakis(triphenylphosphine)palladium (0) (Pd(PPh$_3$)$_4$) (0.74 g), 1,4-dioxane (125 mL), and water (63 mL) are added to a 500 mL 3-neck flask, and stirred under a nitrogen atmosphere at 100° C. for 3 hours. The resultant is allowed to cool to room temperature, toluene (125 mL) is added and reaction mixture washed with water (50 mL×3) and dried with MgSO$_4$.

The solvent is removed under a reduced pressure, and the residue is dissolved in toluene (50 mL) and hexane (100 mL). Activated carbon (8 g) is added to the toluene solution, and the mixture refluxed for 30 minutes. The mixture is allowed to cool to room temperature, the activated carbon (solids) is filtered off with Celite®, and the toluene is removed under a reduced pressure. The residue is subject to column chromatography and recrystallized (toluene/acetone), obtaining Monomer M-7 (6.38 g).

Synthesis of Copolymer P-8

Under an argon atmosphere, Monomer M-7 (1.47 g), 2,7-bis(4,4,5,5-tetramethyl-1,3,2-dioxaborolan-2-yl)-9,9-di-N-octyl fluorene (1.47 g), palladium acetate (5.1 mg), tris(2-methoxy phenyl)phosphine (48.4 mg), toluene (59 mL), and a 20 wt % tetraethylammonium hydroxide aqueous solution (9.98 g) are added to a four-necked flask, and stirred at 85° C. for 6 hours. Subsequently, phenyl boronic acid (242 mg), tetrakis(triphenyl phosphino)palladium (52.9 mg), and a 20 wt % tetraethylammonium hydroxide aqueous solution (9.98 g) are added to the reaction flask, and stirred at 85° C. for 3 hours. Then, sodium N,N-diethyldithiocarbamate trihydrate (7.74 g) dissolved in ion exchanged water (59 mL) is added to the reaction mixture, and stirred at 85° C. for 2 hours.

After separating an organic layer from an aqueous layer, the organic layer is washed with water, a 3 wt % acetic acid aqueous solution, and again water. The organic layer is subject to column chromatography filled with silica gel/alumina, and the solvent is removed under a reduced pressure. The obtained liquid is added dropwise to methanol to form a precipitate. The precipitate is dissolved in toluene and added dropwise to methanol for precipitation, and the precipitated solid is filtered and dried, obtaining Copolymer P-8 (0.788 g). The obtained copolymer is measured with a weight average molecular weight and polydispersity by SEC, Mw=74,000, and Mw/Mn=2.45.

Copolymer P-8 is assumed to have Structural unit P-8 from an input ratio of the monomers.

[Structural Unit P-8]

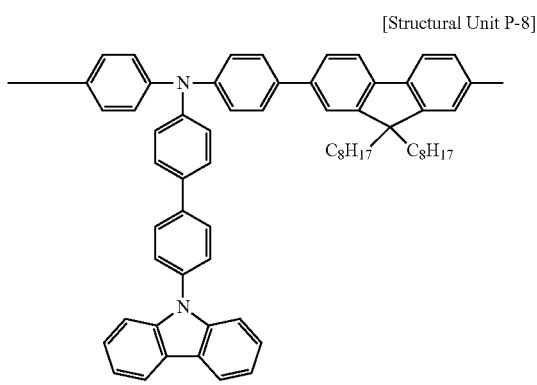

Production of Quantum Dot Electroluminescence Device D-9

Quantum dot electroluminescence device D-9 is manufactured according to the same method as Example 1 except that Copolymer P-8 is used instead of Copolymer P-1.

Evaluation

Characteristics of Copolymers

Each copolymer according to the above examples and comparative examples is measured with respect to a HOMO level (eV), a LUMO level (eV), and a glass transition temperature (Tg, °C.). The results are shown in Table 1.

Measurement of HOMO Level

Each example polymer is dissolved in xylene at a concentration of 1 wt % to provide a coating composition. The coating composition is spin-coated at 2000 revolutions per minute (rpm) on a UV-cleaned and ITO-attached glass substrate and dried on a hot plate at 150° C. for 30 minutes to provide the test samples. The test samples are measured with respect to HOMO levels by using a photoelectron spectrometer (AC-3, Riken Keiki Co., Ltd.) in the air. The measurement results are used to calculate a rising tangent point of intersection, which is regarded as the HOMO levels (eV). The HOMO levels are usually a negative number.

Measurement of LUMO Level

Each example polymer is dissolved in toluene at a concentration of 3.2 wt % to a coating composition. The coating composition is spin-coated at 1600 rpm on a UV-cleaned and ITO-attached glass substrate and dried on a hot plate at 250° C. for 60 minutes to provide test samples (film thickness: about 70 nm). The obtained test samples are cooled to 77K (−196° C.), and a photoluminescence (PL) spectra is obtained. The LUMO level (eV) is calculated from the peak value on the shortest wavelength side of the PL spectrum.

Glass Transition Temperature (Tg)

The glass transition temperature (Tg, °C.) of each example copolymer is measured by using differential scanning calorimetry (DSC) (Tradename: DSC6000, Seiko instruments Inc.) by increasing a temperature of a sample up to 300° C. at 10° C./min, maintaining the temperature at 300° C. for 10 minutes, decreasing the temperature down to 25° C. at 10° C./min, maintaining the temperature at 25° C. for 10 minutes, and then, increasing the temperature up to 300° C. at 10° C./min. When the measurement procedure is completed, the sample is cooled down to room temperature (25° C.) at 10° C./min.

TABLE 1

| Copolymer | | Structural unit | Mw (Mw/Mn) | HOMO (eV) | LUMO (eV) | Tg (° C.) |
|---|---|---|---|---|---|---|
| Ex. 1 | P-1 | (structure) | 15,700 (1.60) | 5.64 | 2.64 | 203 |

TABLE 1-continued

| Copolymer | | Structural unit | Mw (Mw/Mn) | HOMO (eV) | LUMO (eV) | Tg (° C.) |
|---|---|---|---|---|---|---|
| Ex. 2 | P-2 | | 52,300 (2.76) | 5.72 | 2.69 | 205 |
| Ex. 3 | P-3 | | 33,300 (2.19) | 5.67 | 2.70 | 134 |

TABLE 1-continued

| | Copolymer | Structural unit | Mw (Mw/Mn) | HOMO (eV) | LUMO (eV) | Tg (° C.) |
|---|---|---|---|---|---|---|
| Ex. 4 | P-4 | *(structure)* | 72,700 (3.45) | 5.71 | 2.63 | 207 |
| Ex. 5 | P-5 | *(structure)* | 30,000 (2.29) | 5.68 | 2.64 | 145 |
| Ex. 6 | P-6 | *(structure)* | 16,500 (1.53) | 5.60 | 2.54 | 148 |

TABLE 1-continued
| Copolymer | | Structural unit | Mw (Mw/Mn) | HOMO (eV) | LUMO (eV) | Tg (° C.) |
|---|---|---|---|---|---|---|
| Ex. 7 | P-7 | 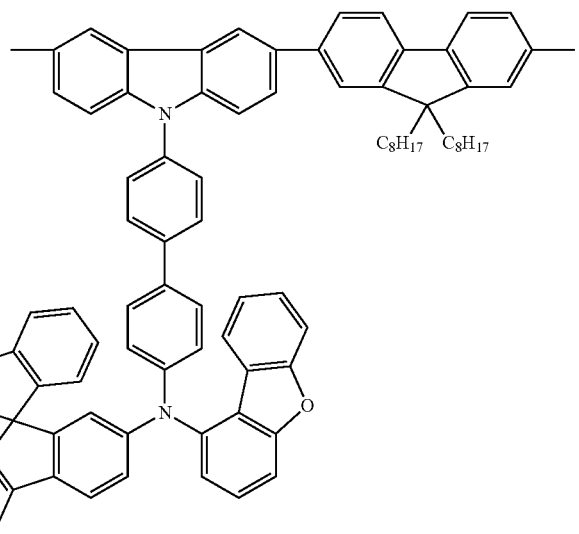 | 69,900 (2.12) | 5.76 | 2.70 | 214 |
| Comp. Ex. 1 | TFB | 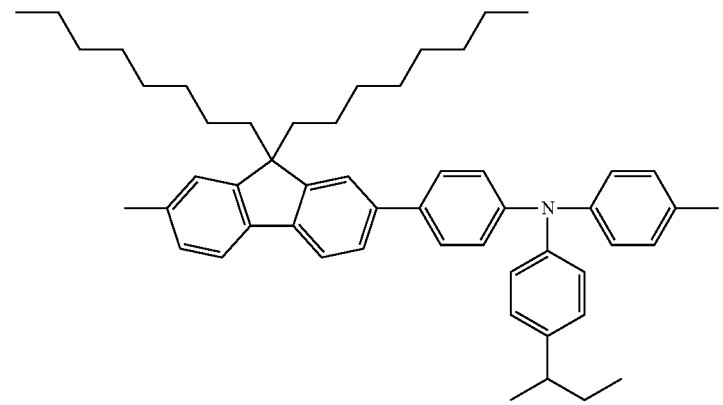 [SMILES: CCCCCCCCC1(CCCCCCCC)c2cc(C)ccc2-c2ccc(-c3ccc(N(c4ccc(C)cc4)c4ccc(C(C)CC)cc4)cc3)cc21] | 359,000 (3.40) | 5.54 | 2.60 | 156 |
| Comp. Ex. 2 | P-8 | 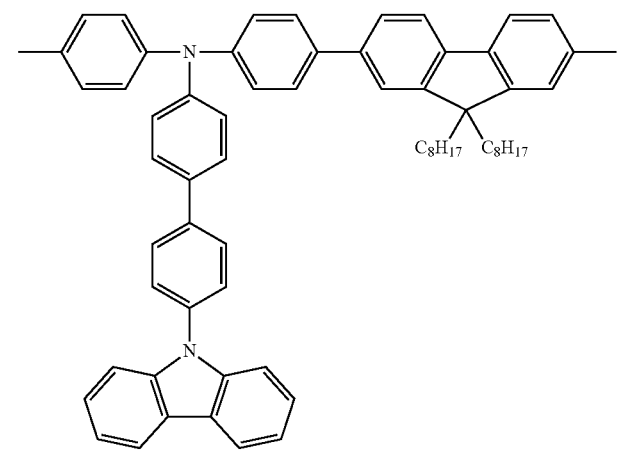 | 74,000 (2.45) | 5.49 | 2.85 | 195 |

Evaluation of Quantum Dot Electroluminescence Device

Each quantum dot electroluminescence device is evaluated with respect to luminous efficiency and luminescence life-span in the following method. The results are shown in Table 2.

Luminous Efficiency

When a voltage is applied to each quantum dot electroluminescence device, a current starts to flow at a predetermined voltage, and the quantum dot electroluminescence device emits light. A DC constant voltage power supply (a source meter, Keyence Corp.) is used to gradually increase voltage, at which a current of each device is measured. A luminance measuring device (SR-3, Topcon Technology Co., Ltd.) is used to measure luminance during the light emission. The measurement is completed when the luminance begins to decline. An area of each device is used to calculate a current per unit area (current density), and the luminance in candela per square meter (cd/m$^2$) is divided by the current density in amperes per square meter (A/m$^2$) to obtain current efficiency, candela per ampere (cd/A).

Then, within the measured voltage range, the highest current efficiency is obtained as "cd/A max". The current efficiency represents efficiency (conversion efficiency) of converting a current into luminescent energy Accordingly, the greater current efficiency corresponds to a device that exhibits higher performance.

In addition, when the DC constant voltage power supply (a source meter, Keyence Corp.) is used to apply a voltage to each quantum dot electroluminescence device, a current begins to flow at a predetermined voltage, and the quantum dot electroluminescence device emits light. A voltage (V) at the current density of 5 milliamperes per square centimeter (mA/cm$^2$) is expressed as a driving voltage "V @5 mA". Moreover, from a spectral radiation luminance spectrum measured by a luminance-measuring device, assuming that Lambertian radiation is performed, external quantum efficiency (EQE) (%) at cd/A max is calculated, which is also used to evaluate luminous efficiency.

Luminescence Life-Span

The DC constant voltage (a source meter, Keyence Corp.) is used to apply a predetermined voltage to each quantum dot electroluminescence device resulting in light emission from the quantum dot electroluminescence device. The light emission of the quantum dot electroluminescence device is measured by using the luminance-measuring device (SR-3, Topcon Technology Co., Ltd.), as current is gradually increased and then is made constant. When the luminance reached 650 nit (cd/m$^2$), the device is left alone.

The amount of time it takes for the measured luminance to gradually reduce to 90% of the initial luminance is measured as "LT90 (hr)". Likewise, the amount of time it takes for the measured luminance to gradually reduce to 50% of the initial luminance is measured as "LT50 (hr)".

TABLE 2

|  | cd/A max | V at 5 mA | EQE (%) | LT90 (hr) | LT50 (hr) |
|---|---|---|---|---|---|
| Example 1 | 11.6 | 3.1 | 11.3 | 5.5 | 39.2 |
| Example 2 | 10.5 | 3.0 | 10.4 | 9.3 | 63.0 |
| Example 3 | 15.9 | 3.5 | 16.7 | 2.7 | 25.5 |
| Example 4 | 13.4 | 3.3 | 14.3 | 4.1 | 79.1 |
| Example 5 | 11.5 | 2.9 | 10.9 | 8.8 | 81.0 |
| Example 6 | 10.2 | 3.0 | 9.7 | 9.9 | 80.4 |

TABLE 2-continued

|  | cd/A max | V at 5 mA | EQE (%) | LT90 (hr) | LT50 (hr) |
|---|---|---|---|---|---|
| Example 7 | 11.0 | 3.1 | 10.9 | 6.2 | 48.0 |
| Comparative Example 1 | 8.4 | 4.3 | 9.2 | 0.6 | 12.0 |
| Comparative Example 2 | 6.5 | 2.8 | 4.6 | 2.2 | 55.9 |

Referring to Table 2, the quantum dot electroluminescence devices of the examples exhibit significantly high luminous efficiency and durability (particularly, luminescence life-span), compared with the quantum dot electroluminescence devices of the comparative examples.

Moreover, although the present example embodiments are each high performing blue quantum dot electroluminescence devices, similar results as indicated in Table 2 may be obtained with red quantum dot electroluminescence devices and the like.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

100: electroluminescence device (EL device)
110: substrate
120: first electrode
130: hole injection layer
140: hole transport layer
150: light emitting layer
160: electron transport layer
170: electron injection layer
180: second electrode

What is claimed is:

1. A copolymer comprising a structural unit represented by Chemical Formula 1:

Chemical Formula 1

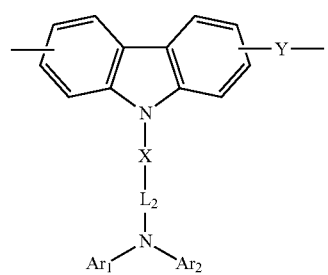

(1)

wherein, in Chemical Formula 1,

X is a single bond, -L$_{1a}$-, or -L$_{1b}$-L$_{1c}$-, wherein L$_{1a}$, L$_{1b}$, and L$_{1c}$ are each independently a substituted or unsubstituted divalent aromatic hydrocarbon group having 6 to 25 carbon atoms, L$_2$ and Ar$_1$ are independently substituted or unsubstituted aromatic hydrocarbon group having 6 to 25 carbon atoms, or a substituted or unsubstituted aromatic heterocyclic group having 3 to 25 ring-member atoms, is a substituted or unsubstituted aromatic hydrocarbon group having 6 to 25 carbon atoms, or a substituted or unsubstituted aromatic heterocyclic group having 3 to 25 ring-member atoms, and Y is a substituted or unsubstituted divalent aromatic hydrocarbon group having 6 to 60 carbon atoms, or a substituted or unsubstituted divalent aromatic heterocyclic group having 3 to 60 ring-member atoms, wherein, $L_2$ and $Ar_1$ join to form a ring.

2. The copolymer of claim 1, wherein in Chemical Formula 1, $Ar_2$ is a group represented by Chemical Formula 2A, Chemical Formula 2B, Chemical Formula 2C, or Chemical Formula 2D:

Chemical Formula 2A

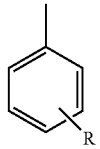

Chemical Formula 2B

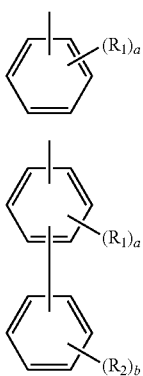

wherein, in Chemical Formula 2A and Chemical Formula 2B $R_1$ and $R_2$ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b are each independently an integer of 1 to 4, and a link without * indicates a bond to the nitrogen of the arylamine side chain of Chemical Formula 1

Chemical Formula 2C

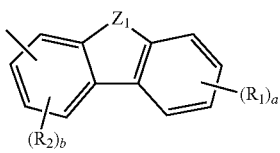

Chemical Formula 2D

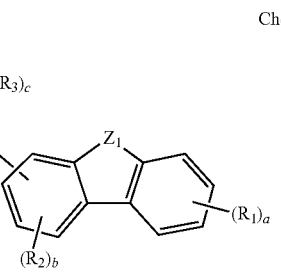

wherein, in Chemical Formula 2C and Chemical Formula 2D, $Z_1$ is $CR_aR_b$, $NR_c$, O, S, Se, or Te, wherein $R_a$, $R_b$, and $R_c$ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, or $R_a$ and $R_b$ are joined to provide a spiro structure, $R_1$, $R_2$, and $R_3$ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b are each independently an integer of 1 to 4, and a link without * indicates a bond to the nitrogen of the arylamine side chain of Chemical Formula 1.

3. The copolymer of claim 1, wherein in Chemical Formula 1, $Ar_2$ is group represented by Group 2:

Group 2

(2-1)

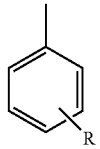

(2-2)

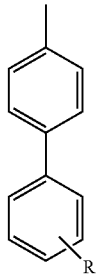

(2-3)

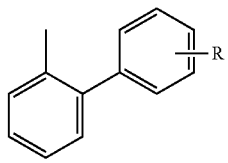

(2-4)

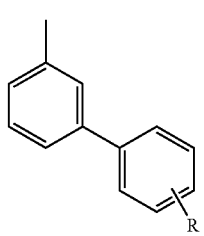

(2-5)

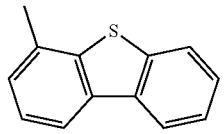

(2-6)

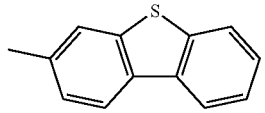

(2-7)

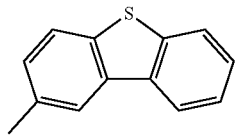

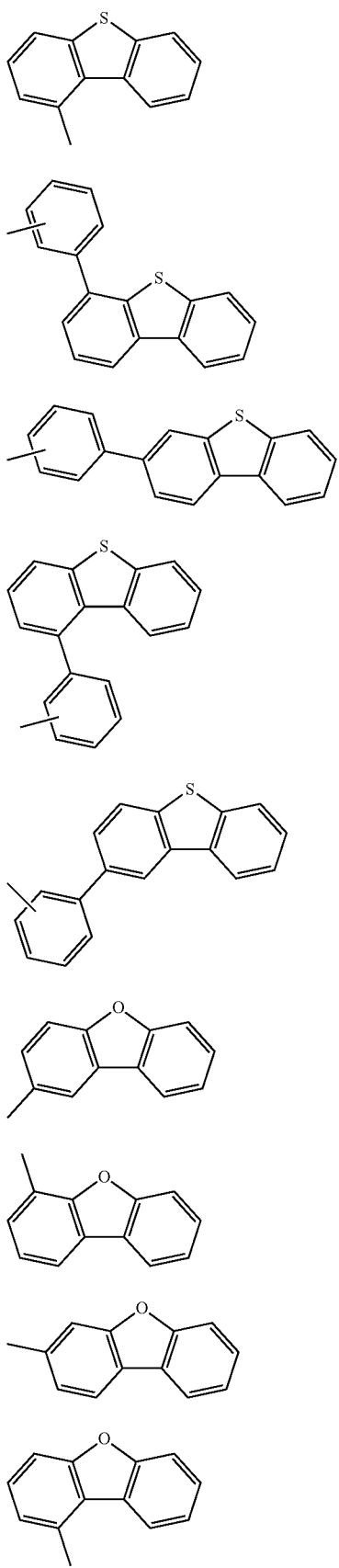
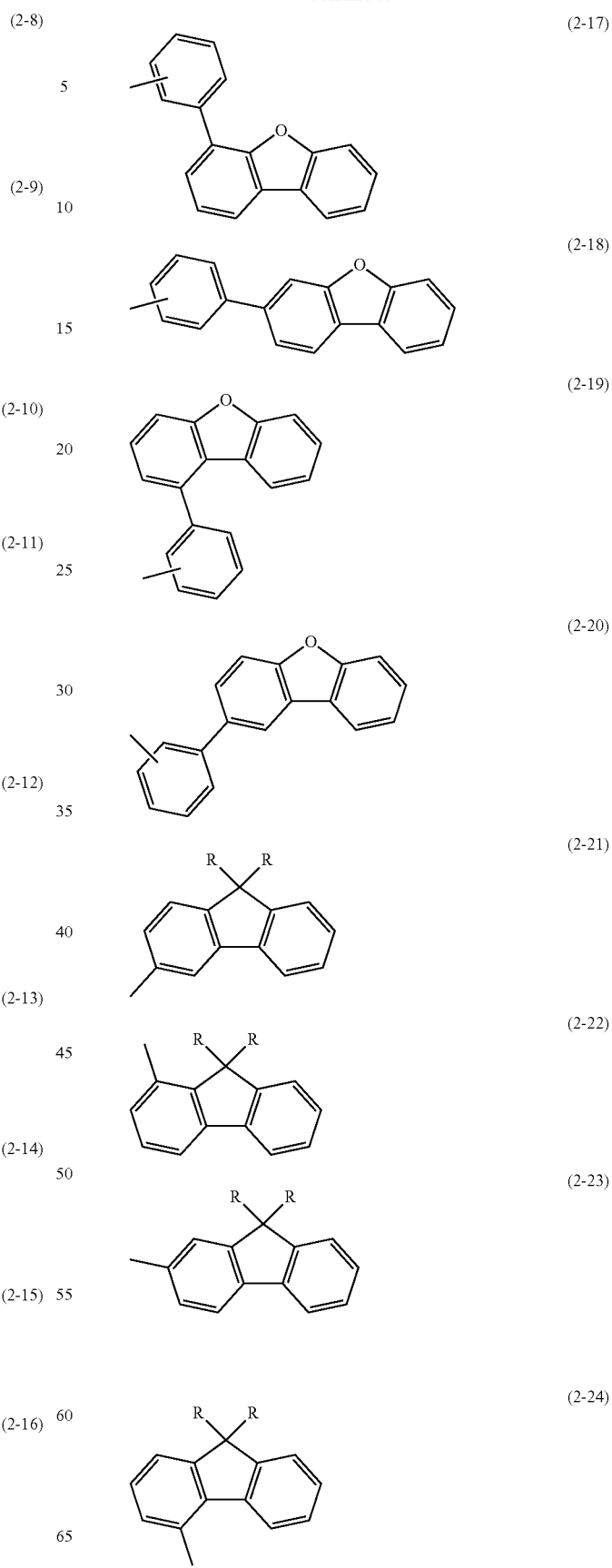

(2-25) 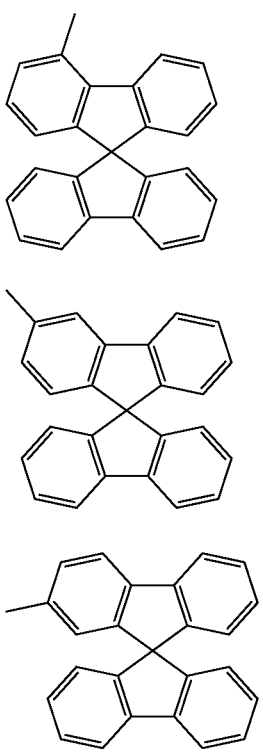

(2-26)

(2-27)

(2-28) 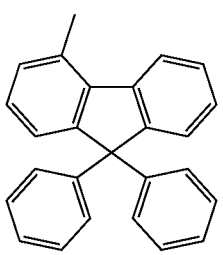

(2-29) 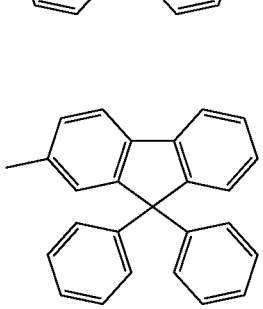

(2-30)

(2-31) 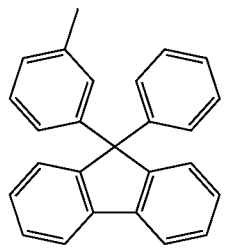

(2-32) 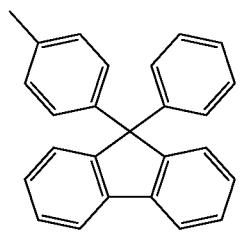

(2-33) 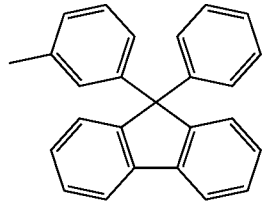

wherein, in Group 2,

R is each independently a hydrogen atom or a linear or branched hydrocarbon group having 1 to 14 carbon atoms, a link without * is a bond to the nitrogen of the arylamine side chain of Chemical Formula 1, and a hydrogen atom of an aromatic ring of a Group 2 structure is optionally substituted by a linear or branched hydrocarbon group having 1 to 14 carbon atoms.

4. The copolymer of claim 1, wherein in Chemical Formula 1, $L_2$ is a group represented by Chemical Formula 3A or Chemical Formula 3B:

Chemical Formula 3A

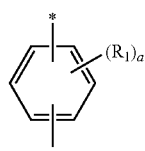

Chemical Formula 3B

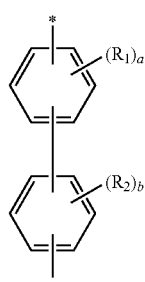

wherein, in Chemical Formula 3A and Chemical Formula 3B, $R_1$ and $R_2$ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b are each independently an integer of 1 to 4, and

* indicates a linking portion with the bridge nitrogen of the main chain carbazole ring of Chemical Formula 1, and a link without * indicates a bond to the nitrogen of the arylamine side chain of Chemical Formula 1.

5. The copolymer of claim 1, wherein in Chemical Formula 1, $L_2$ is represented by Chemical Formula 3A-1 or Chemical Formula 3B-1:

Chemical Formula 3A-1

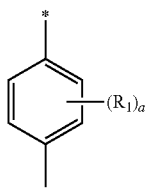

Chemical Formula 3B-1

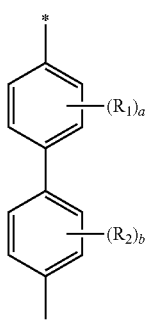

wherein, in Chemical Formula 3A-1 and Chemical Formula 3B-1, $R_1$ and $R_2$ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b are each independently an integer of 1 to 4,

* indicates a linking portion with the bridge nitrogen of the mainchain carbazole ring of Chemical Formula 1, and a link without * indicates a bond to the nitrogen of the arylamine side chain of Chemical Formula 1.

6. The copolymer of claim 1, wherein in Chemical Formula 1, $L_2$ is a group represented by Group 3:

Group 3

(3-1)

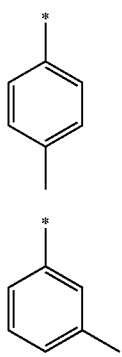

(3-2)

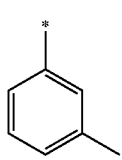

(3-3)

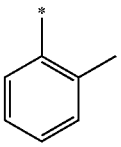

(3-4)

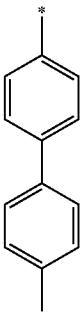

(3-5)

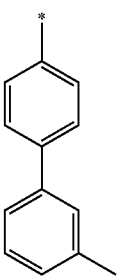

(3-6)

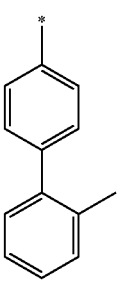

(3-7)

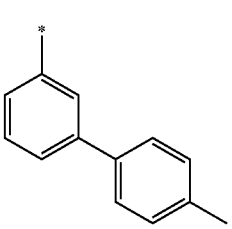

(3-8)

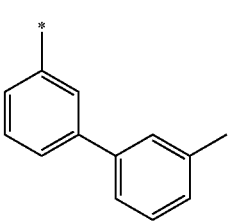

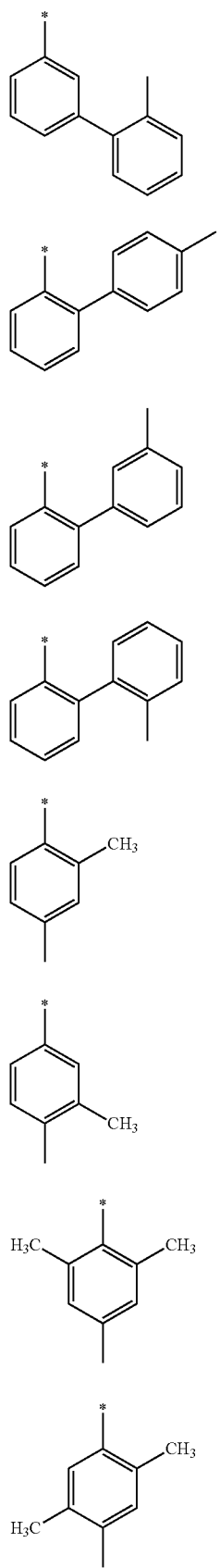
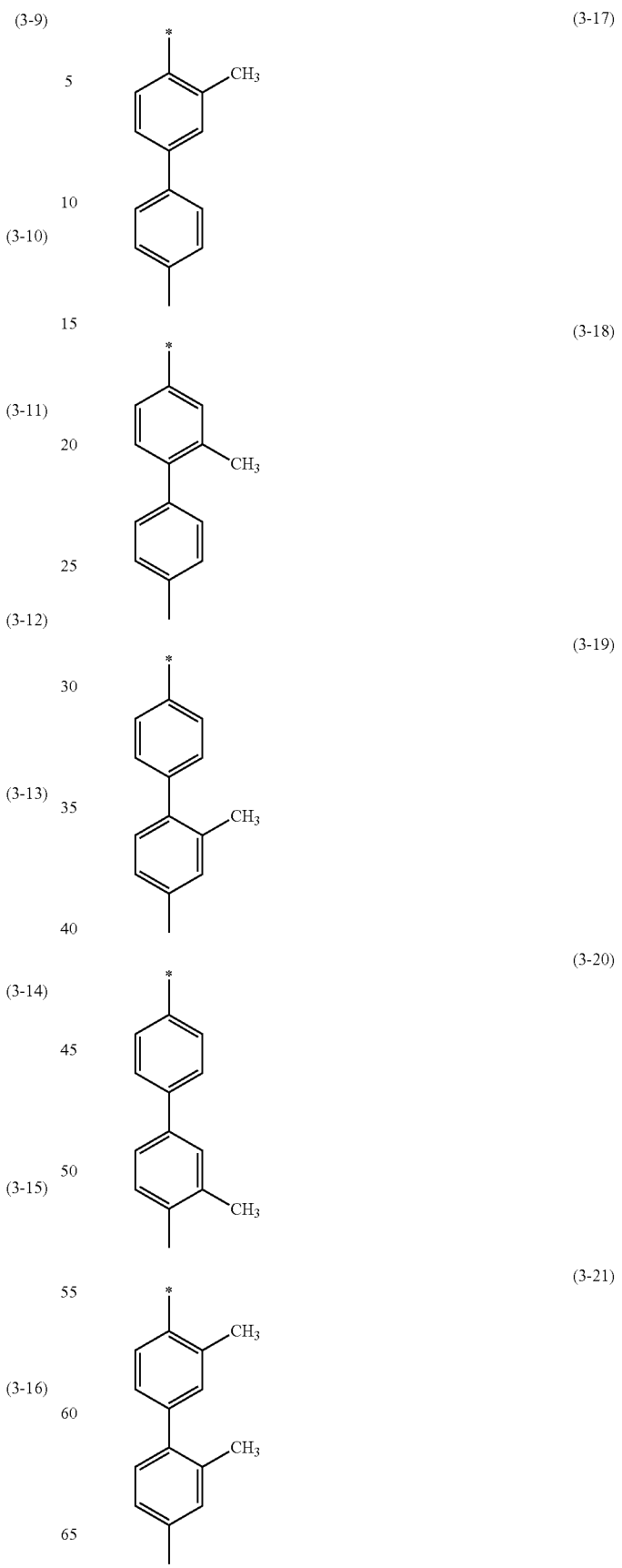

(3-22)

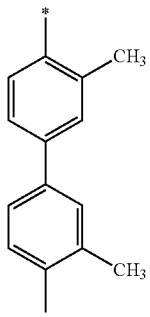

(3-23)

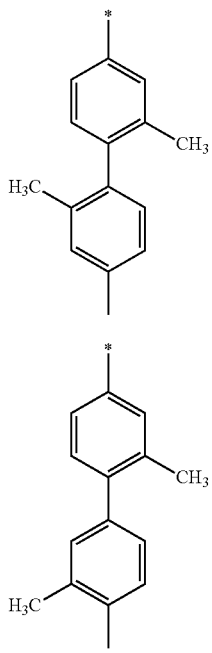

(3-24)

wherein, in Group 3,

* indicates a linking portion with the bridge nitrogen of the main chain carbazole ring of Chemical Formula 1, and a link without * indicates a bond to the nitrogen of the arylamine side chain of Chemical Formula 1.

7. The copolymer of claim 1, wherein $-L_2-N(Ar_1)(Ar_2)$ is a group represented by Chemical Formula 4A or Chemical Formula 4B:

Chemical Formula 4A

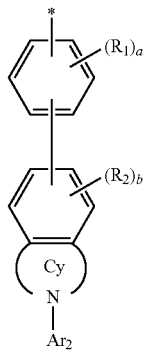

Chemical Formula 4B

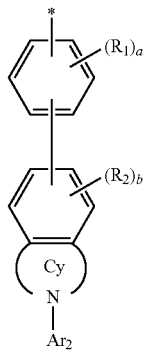

wherein, in Chemical Formula 4A and Chemical Formula 4B, $R_1$ and $R_2$ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b are each independently an integer of 1 to 4,

* indicates a linking portion with the bridge nitrogen of the main chain carbazole ring of Chemical Formula 1, Cy is a substituted or unsubstituted N-containing heterocyclic ring group having 5 to 25 ring-member atoms, and $Ar_2$ is defined as in Chemical Formula 1.

8. The copolymer of claim 1, wherein $-L_2-N(Ar_1)(Ar_2)$ is a group represented by Group 4:

Group 4

(4-1)

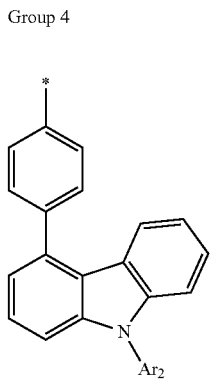

(4-2)

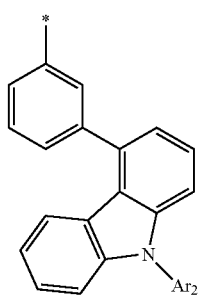

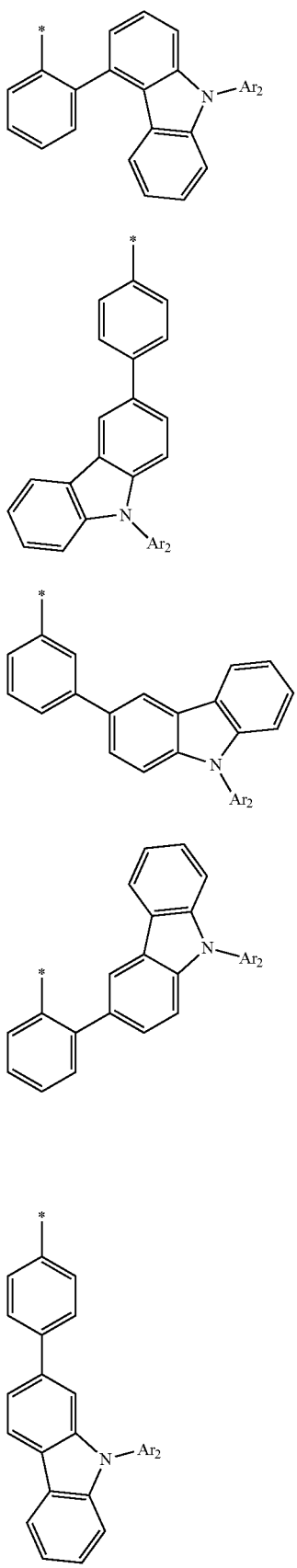
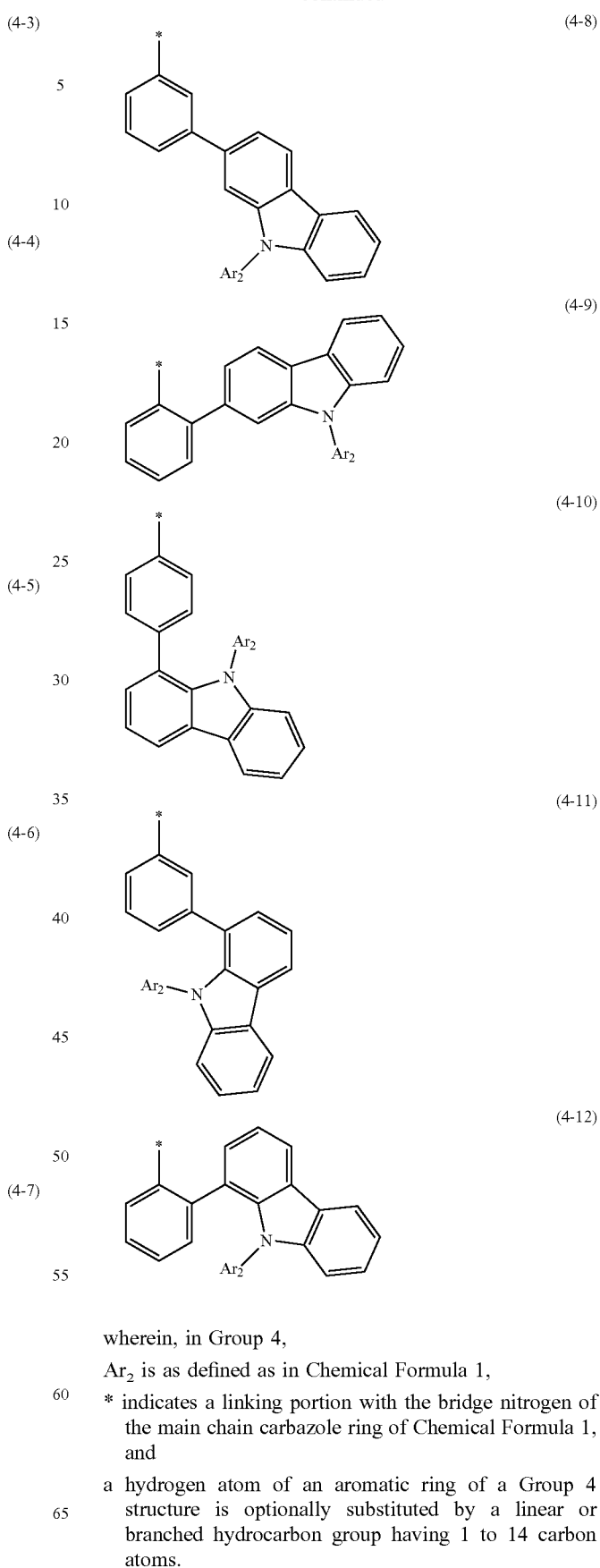
wherein, in Group 4,
Ar₂ is as defined as in Chemical Formula 1,
* indicates a linking portion with the bridge nitrogen of the main chain carbazole ring of Chemical Formula 1, and
a hydrogen atom of an aromatic ring of a Group 4 structure is optionally substituted by a linear or branched hydrocarbon group having 1 to 14 carbon atoms.

9. The copolymer of claim 7, wherein in Chemical Formula 1, Ar₂ is represented by one of Chemical Formula 2A, Chemical Formula 2B, Chemical Formula 2C, or Chemical Formula 2D:

Chemical Formula 2A

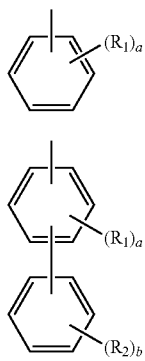

Chemical Formula 2B

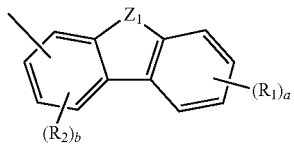

wherein, in Chemical Formula 2A and Chemical Formula 2B

R₁ and R₂ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b are each independently an integer of 1 to 4, and a link without * is a bond to the nitrogen of the arylamine side chain of Chemical Formula 1, Chemical Formula 2C

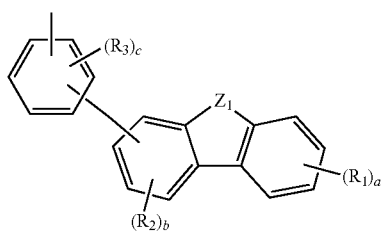

Chemical Formula 2D wherein, in Chemical Formula 2C and Chemical Formula 2D,

Z₁ is CR$_a$R$_b$, NR$_c$, O, S, Se, or Te, wherein R$_a$, R$_b$, and R$_c$ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, or R$_a$ and R$_b$ are joined to provide a spiro structure, R₁, R₂, and R₃ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b are each independently an integer of 1 to 4, and a link without * indicates a bond to the nitrogen of an arylamine side chain of Chemical Formula 1.

10. The copolymer of claim 7, wherein in Chemical Formula 1, Ar₂ is a group represented by Group 2:

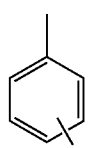 (2-1)

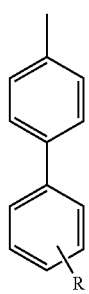 (2-2)

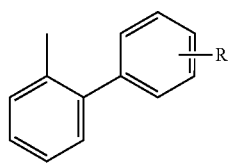 (2-3)

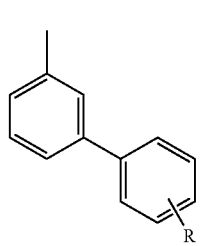 (2-4)

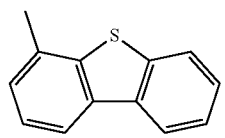 (2-5)

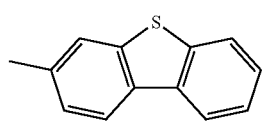 (2-6)

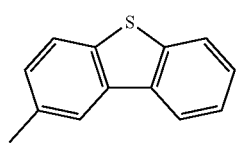 (2-7)

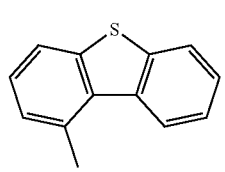 (2-8)

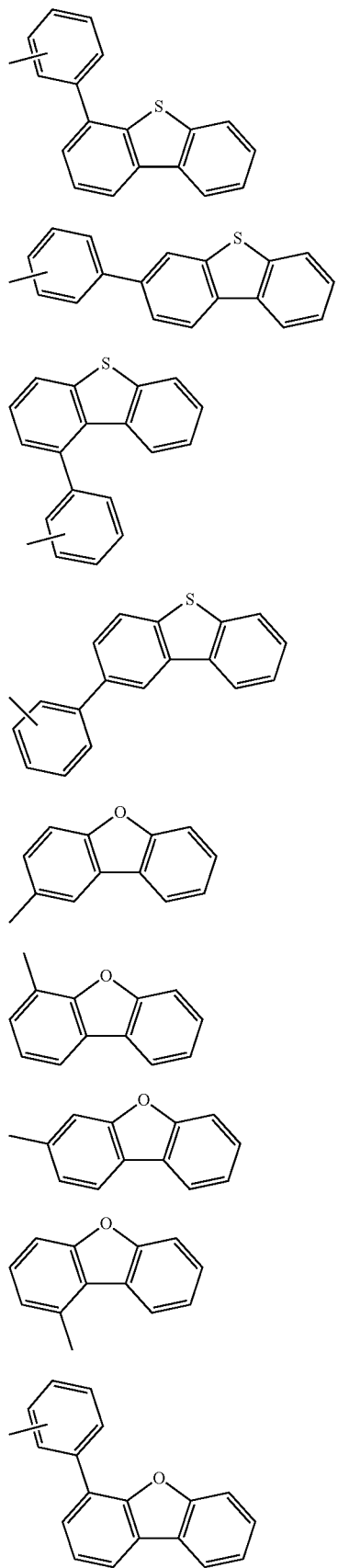
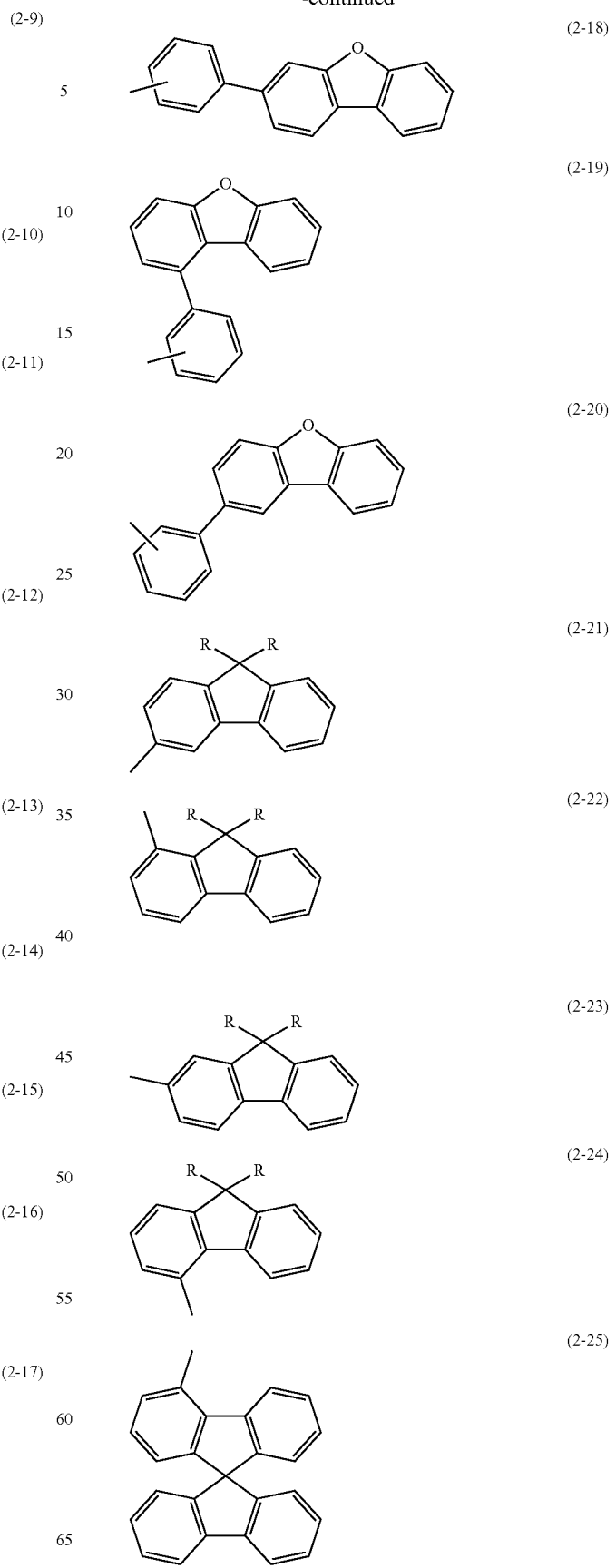

-continued (2-26) 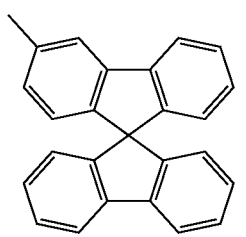

(2-27) 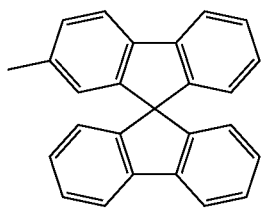

(2-28) 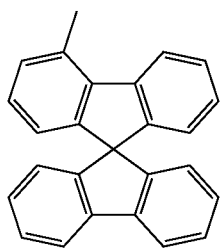

(2-29) 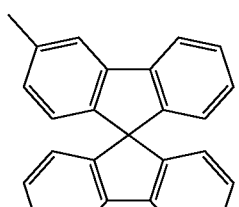

(2-30) 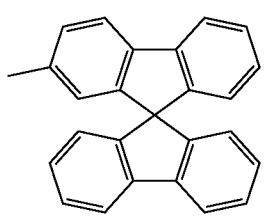

(2-31) 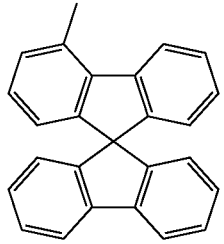

(2-32) 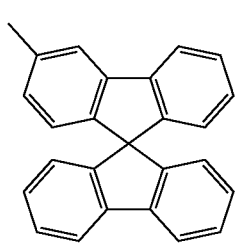

-continued (2-33) 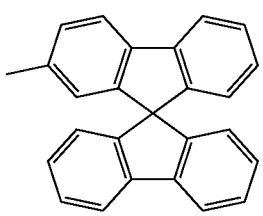

wherein, in Group 2,
R is each independently a hydrogen atom or a linear or branched hydrocarbon group having 1 to 14 carbon atoms,
a link without * is a bond to the nitrogen of an arylamine side chain of Chemical Formula 1, and
a hydrogen atom of the aromatic ring of a Group 2 structure is optionally substituted by a linear or branched hydrocarbon group having 1 to 14 carbon atoms.

11. The copolymer of claim 1, wherein in Chemical Formula 1, Y is represented by one of Chemical Formula 5A, Chemical Formula 5B, Chemical Formula 5C, Chemical Formula 5D, or Chemical Formula 5E:

Chemical Formula 5A

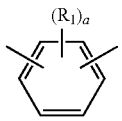

wherein, in Chemical Formula 5A,
$R_1$ is each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms,
a is an integer of 1 to 4, and
Chemical Formula 5B Chemical Formula 5B

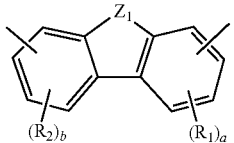

Chemical Formula 5C

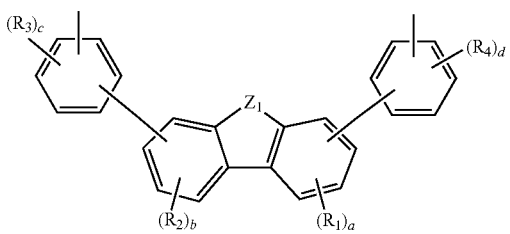

wherein, in Chemical Formula 5B and Chemical Formula 5C,
$Z_1$ is $CR_aR_b$, $NR_c$, O, S, Se, or Te, wherein $R_a$, $R_b$, and $R_c$ are each independently hydrogen, linear or branched hydrocarbon group having 1 to 14 carbon atoms, an aromatic hydrocarbon group having 6 to 14 carbon atoms, or an aromatic heterocyclic group having 3 to 25 ring-member atoms, or $R_a$ and $R_b$ are linked to each other to provide a spiro structure, $R_1$, $R_2$, $R_3$, and $R_4$ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, a and b are each independently an integer of 1 to 3, and c and d are each independently an integer of 1 to 3, Chemical Formula 5D

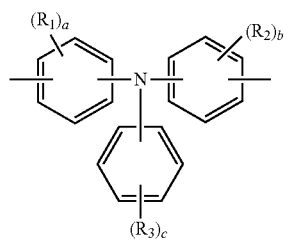

Chemical Formula 5E

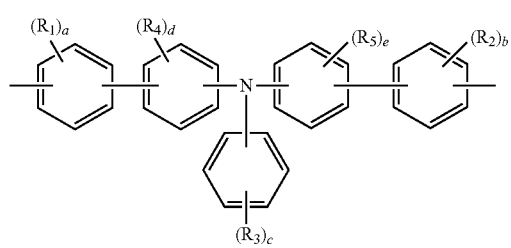

wherein, in Chemical Formula 5D and Chemical Formula 5E, $R_1$, $R_2$, $R_3$, $R_4$, and $R_5$ are each independently hydrogen, a linear or branched hydrocarbon group having 1 to 14 carbon atoms, an aromatic hydrocarbon group having 6 to 14 carbon atoms, or an aromatic heterocyclic group having 3 to 25 ring-member atoms, and a, b, c, d, and e are each independently an integer of 1 to 4.

12. The copolymer of claim 1, wherein in Chemical Formula 1, Y is a group represented by Group 5:

Group 5

(5-1)

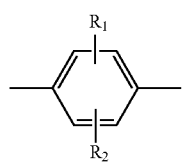

(5-2)

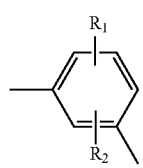

(5-3)

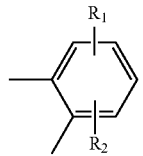

(5-4)

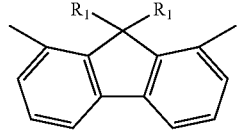

(5-5)

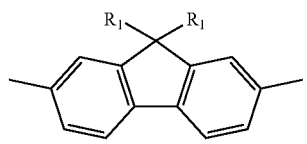

(5-6)

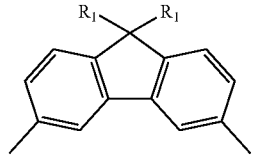

(5-7)

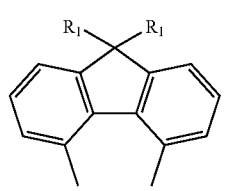

(5-8)

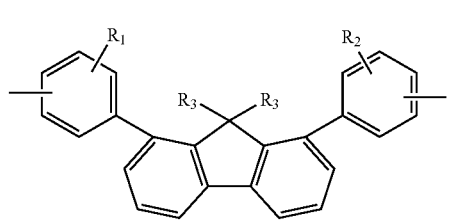

(5-9)

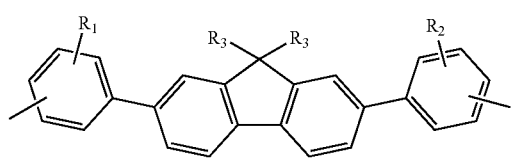

(5-10)

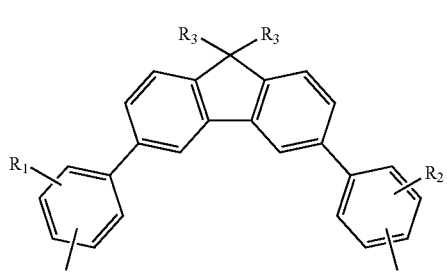

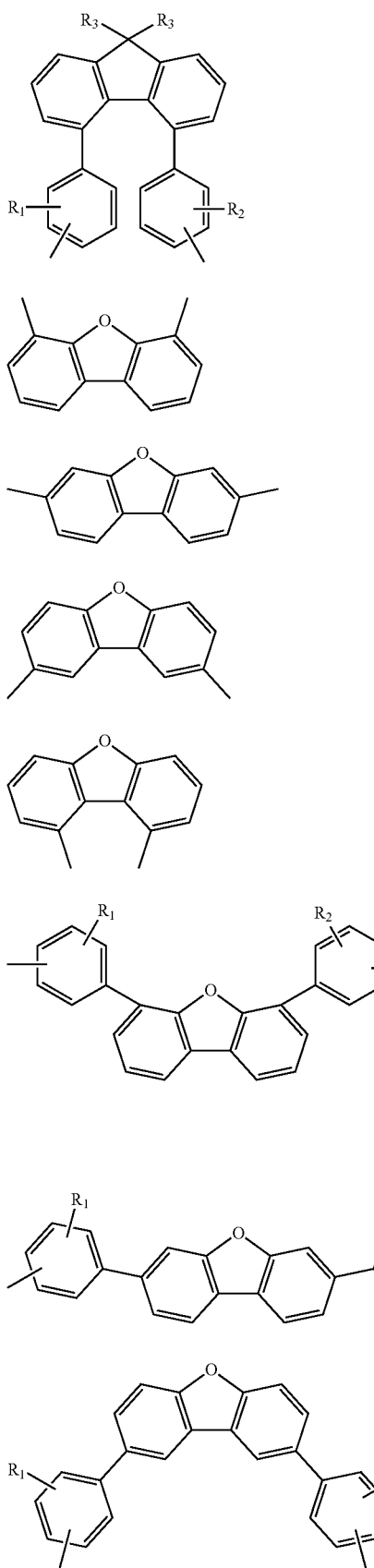
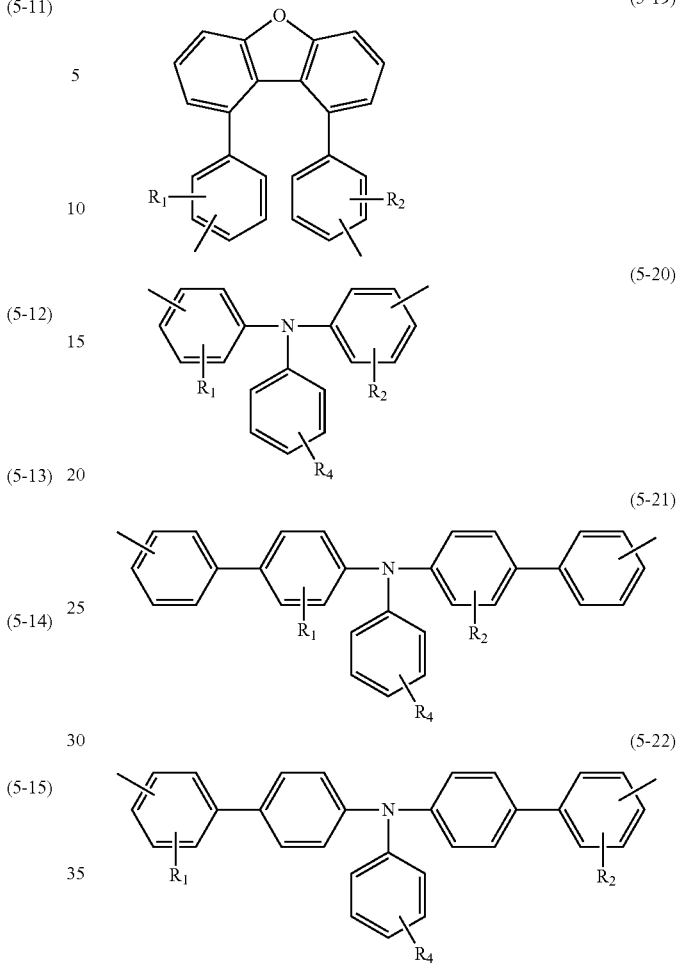

wherein, in Group 5,
$R_1$, $R_2$, and $R_4$ are each independently hydrogen, a linear or branched hydrocarbon group having 1 to 14 carbon atoms, or a C6 to C25 aromatic hydrocarbon group, and
$R_3$ is each independently a linear or branched hydrocarbon group having 1 to 14 carbon atoms.

13. The copolymer of claim 12, wherein in Chemical Formula 1, Y includes a group represented by at least one of the Groups (5-1) to (5-7).

14. A liquid composition, comprising
the copolymer of claim 1 and
a solvent or a dispersive medium.

15. A thin film comprising the copolymer of claim 1.

16. An electroluminescence device material comprising the copolymer of claim 1.

17. An electroluminescence device, comprising
a first electrode and a second electrode, and
at least one organic layer between the first electrode and the second electrode,
wherein at least one layer of the organic layer comprises the copolymer of claim 1.

18. The electroluminescence device of claim 17, wherein the organic layer comprising the copolymer is a hole transport layer or a hole injection layer.

19. The electroluminescence device of claim 17, wherein the organic layer comprises a light emitting layer comprising semiconductor nanoparticles or an organometallic complex.

20. The electroluminescence device of claim 17, wherein at least one layer of the organic layer is formed by a coating method.

\* \* \* \* \*